United States Patent
Utsumi et al.

(10) Patent No.: US 9,164,379 B2
(45) Date of Patent: *Oct. 20, 2015

(54) RESIST COMPOSITION, METHOD FOR FORMING RESIST PATTERN, AND COMPOUND

(71) Applicant: Tokyo Ohka Kogyo Co., Ltd., Kawasaki (JP)

(72) Inventors: Yoshiyuki Utsumi, Kawasaki (JP); Yoshitaka Komuro, Kawasaki (JP); Tomoyuki Hirano, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 91 days.

This patent is subject to a terminal disclaimer.

(21) Appl. No.: 13/874,197

(22) Filed: Apr. 30, 2013

(65) Prior Publication Data

US 2013/0302736 A1 Nov. 14, 2013

(30) Foreign Application Priority Data

May 8, 2012 (JP) .................................. 2012-107031

(51) Int. Cl.
G03F 7/004 (2006.01)
G03F 7/039 (2006.01)
G03F 7/20 (2006.01)

(52) U.S. Cl.
CPC .............. *G03F 7/004* (2013.01); *G03F 7/0045* (2013.01); *G03F 7/0392* (2013.01); *G03F 7/20* (2013.01)

(58) Field of Classification Search
CPC ....... G03F 7/004; G03F 7/0045; G03F 7/028; G03F 7/039; G03F 7/0392; G03F 7/20
USPC ............................... 430/270.1, 326, 919, 920
See application file for complete search history.

(56) References Cited

U.S. PATENT DOCUMENTS

| | | | |
|---|---|---|---|
| 6,949,325 B2 | 9/2005 | Li et al. | |
| 7,122,294 B2 * | 10/2006 | Lamanna | 430/280.1 |
| 2001/0049073 A1 | 12/2001 | Hada et al. | |
| 2004/0110085 A1 | 6/2004 | Iwai et al. | |
| 2007/0231708 A1 | 10/2007 | Matsumaru et al. | |
| 2008/0081282 A1 * | 4/2008 | Kamimura et al. | 430/270.1 |
| 2009/0197204 A1 | 8/2009 | Shiono et al. | |
| 2009/0317743 A1 | 12/2009 | Shiono et al. | |
| 2010/0136477 A1 * | 6/2010 | Ng et al. | 430/270.1 |
| 2010/0255418 A1 * | 10/2010 | Yamaguchi et al. | 430/270.1 |
| 2010/0310985 A1 | 12/2010 | Mori et al. | |
| 2011/0117499 A1 | 5/2011 | Matsumiya et al. | |
| 2013/0045443 A1 * | 2/2013 | Utsumi et al. | 430/270.1 |
| 2013/0052585 A1 * | 2/2013 | Ayothi et al. | 430/283.1 |
| 2014/0141373 A1 * | 5/2014 | Utsumi et al. | 430/281.1 |

FOREIGN PATENT DOCUMENTS

| | | |
|---|---|---|
| JP | A-2000-206694 | 7/2000 |
| JP | A-2003-241385 | 8/2003 |
| JP | A-2005-336452 | 12/2005 |
| JP | A-2006-045311 | 2/2006 |
| JP | A-2006-259582 | 9/2006 |
| JP | A-2006-317803 | 11/2006 |
| JP | A-2009-025723 | 2/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |
| WO | WO 2012/173235 | * 12/2012 |

* cited by examiner

*Primary Examiner* — Anca Eoff
(74) *Attorney, Agent, or Firm* — Knobbe Martens Olson & Bear LLP

(57) ABSTRACT

A resist composition including a base material component whose solubility in a developing solution changes by the action of an acid and an acid generator component which generates an acid upon exposure. The acid generator component includes an acid generator that includes a compound containing nitrogen atoms having proton acceptor properties and sites capable of generating an acid upon exposure in the same molecule, the number of the sites being larger than the number of the nitrogen atoms.

12 Claims, No Drawings

RESIST COMPOSITION, METHOD FOR FORMING RESIST PATTERN, AND COMPOUND

CROSS-REFERENCE TO RELATED APPLICATIONS

This application claims priority under 35 U.S.C. §119(a)-(d) to Japanese Patent Application No. 2012-107031, filed May 8, 2012, the content of which is incorporated herein by reference.

BACKGROUND OF THE INVENTION

1. Field of the Invention

The present invention relates to a compound which is useful for acid generation in a resist composition, a resist composition containing the compound, and a method for forming a resist pattern using the resist composition.

2. Description of the Related Art

In lithography techniques, for example, a resist film composed of a resist material is formed on a substrate, and the resist film is subjected to selective exposure with radial rays such as light or electron beams through a mask having a predetermined pattern formed thereon, followed by development, thereby forming a resist pattern having a predetermined shape on the resist film.

A resist material in which the exposed portions become soluble in a developing solution is called a positive type, and a resist material in which the exposed portions become insoluble in a developing solution is called a negative type.

In recent years, in the production of semiconductor elements and liquid crystal display elements, advances in lithography techniques have led to rapid progress in the field of pattern miniaturization.

In general, these miniaturization techniques involve shortening the wavelength (increasing the energy) of the exposure light source. Specifically, ultraviolet rays typified by g-line and i-line have hitherto been used. But, nowadays KrF excimer lasers and ArF excimer lasers are starting to be introduced in mass production. In addition, investigations are also being conducted on lithography techniques using an exposure light source having a wavelength shorter (energy higher) than these excimer lasers, such as electron beams, EUV (extreme ultraviolet radiation), and X rays.

Resist materials are required to have lithography properties such as sensitivity to these exposure light sources and resolution capable of reproducing patterns of minute dimensions.

As a resist material that satisfies these requirements, a chemically amplified resist composition containing a base material component whose solubility in a developing solution changes by the action of an acid and an acid generator component which generates an acid upon exposure, has hitherto been used. For example, in the case where the developing solution is an alkali developing solution (alkali developing process), a positive-type chemically amplified resist composition containing a resin component (base resin) whose solubility in an alkali developing solution changes by the action of an acid and an acid generator component is generally used. If a resist film formed using such a resist composition is selectively exposed at the time of forming a resist pattern, in exposed areas, an acid is generated from the acid generator component, and the polarity of the base resin increases by the action of the generated acid, thereby making the exposed areas soluble in the alkali developing solution. Accordingly, a positive-type pattern in which unexposed areas remain as a pattern is formed upon alkali development. On the other hand, in the case of applying a solvent developing process using a developing solution containing an organic solvent (organic developing solution), when the polarity of the base resin increases, the solubility in the organic developing solution is relatively decreased. Therefore, unexposed areas of the resist film are dissolved in and removed by the organic developing solution, whereby a negative-type resist pattern in which exposed areas remain as a pattern is formed. In this way, the solvent developing process for forming a negative-type resist pattern is sometimes called a negative-type developing process (see, for example, JP-A-2009-025723).

Currently, for example, resins having a structural unit derived from a (meth)acrylic ester in a main chain thereof (acrylic resins) are generally used as a base resin for resist compositions to be used for ArF excimer laser lithography in view of the fact that they are excellent in transparency in the vicinity of 193 nm (see, for example, JP-A-2003-241385).

In addition, as acid generators which are used in a chemically amplified resist composition, various types have been proposed up to date. For example, onium salt-based acid generators, oxime sulfonate-based acid generators, diazomethane-based acid generators, nitrobenzylsulfonate-based acid generators, iminosulfonate-based acid generators, and disulfone-based acid generators are known. In recent years, base resins containing a constituent unit having an acid generator function are also used (see, for example, JP-A-2006-045311).

SUMMARY OF THE INVENTION

As further progress is made in lithography techniques and miniaturization of resist patterns, further improvements in resist materials have been demanded in terms of various lithography properties such as LWR, MEF, and EL margin, and a resist pattern shape.

However, in the case of using conventional acid generators or constituent units having acid-generating ability as those disclosed in JP-A-2003-241385 and JP-A-2006-045311, there was still room for improvements in lithography properties and the resist pattern shape.

Under the foregoing circumstances, the present invention has been made, and an object thereof is to provide a compound which is useful for acid generation in a resist composition, a resist composition containing the compound, and a method for forming a resist pattern using the resist composition.

For achieving the foregoing object, the present invention employs the following constitutions.

Specifically, a first embodiment of the present invention is concerned with a resist composition including a base material component (A) whose solubility in a developing solution changes by the action of an acid and an acid generator component (B) which generates an acid upon exposure, wherein the acid generator component (B) includes an acid generator (B1) composed of a compound having nitrogen atoms having proton acceptor properties and sites capable of generating an acid upon exposure in the same molecule thereof, with the number of the sites being larger than the number of the nitrogen atoms.

In the first embodiment of the present invention, the acid generator (B1) is preferably a compound represented by the following general formula (b1-1).

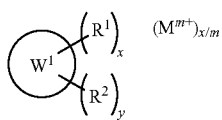

(b1-1)

In the formula (b1-1), $R^1$ represents a group having an anion site capable of generating an acid upon exposure;

$R^2$ represents a hydrogen atom or a substituent not having the anion site;

$W^1$ represents a z-valent functional group containing n nitrogen atoms having proton acceptor properties;

$z=(x+y)$, $(n+1) \leq x \leq z$, and $0 \leq y \leq (z-x)$; and $M^{m+}$ represents an m-valent organic cation.

A second embodiment of the present invention is concerned with a method for forming a resist pattern including a step of forming a resist film using the resist composition of the first embodiment on a support, a step of exposing the resist film, and a step of developing the resist film to form a resist pattern.

A third embodiment of the present invention is concerned with a compound having nitrogen atoms having proton acceptor properties and sites capable of generating an acid upon exposure in the same molecule thereof, with the number of the sites being larger than the number of the nitrogen atoms.

A fourth embodiment of the present invention is concerned with the compound of the third embodiment that is a compound represented by the following general formula (b1-1').

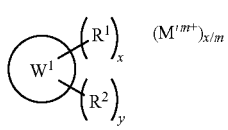

(b1-1')

In the formula (b1-1'), $R^1$ represents a group having an anion site capable of generating an acid upon exposure;

$R^2$ represents a hydrogen atom or a substituent not having the anion site;

$W^1$ represents a z-valent functional group containing n nitrogen atoms having proton acceptor properties;

$z=(x+y)$, $(n+1) \leq x \leq z$, and $0 \leq y \leq (z-x)$; and $M'^{m+}$ represents an m-valent counter cation.

The present invention is able to provide a compound which is useful for acid generation in a resist composition. Furthermore, the present invention is able to provide a resist composition containing the compound according to the present invention, which is excellent in terms of various lithography properties such as LWR, MEF, and EL margin, and a resist pattern shape, and a method for forming a resist pattern using the resist composition.

In the present description and claims, the term "aliphatic" is a relative concept used in relation to the term "aromatic" and defines a group or a compound each having no aromaticity.

The term "alkyl group" includes a linear, branched or cyclic, monovalent saturated hydrocarbon, unless otherwise specified.

The term "alkylene group" includes a linear, branched or cyclic, divalent saturated hydrocarbon group, unless otherwise specified. The same applies for the alkyl group within an alkoxy group.

The term "halogenated alkyl group" is a group in which a part or all of hydrogen atoms of an alkyl group are substituted with a halogen atom. Examples of the halogen atom include a fluorine atom, a chlorine atom, a bromine atom, and an iodine atom.

The term "fluorinated alkyl group" or "fluorinated alkylene group" is a group in which a part or all of hydrogen atoms of an alkyl group or an alkylene group are substituted with a fluorine atom.

The term "constituent unit" means a monomer unit constituting a polymer compound (for example, a resin, a polymer, or a copolymer).

The term "constituent unit derived from an acrylic ester" means a constituent unit constituted upon cleavage of an ethylenic double bond of an acrylic ester.

The term "acrylic ester" is a compound in which a terminal hydrogen atom of a carboxy group of acrylic acid ($CH_2=CH-COOH$) is substituted with an organic group.

In the acrylic ester, a hydrogen atom bonded to a carbon atom at the α-position may be substituted with a substituent. The substituent ($R^\alpha$) with which the hydrogen atom bonded to the carbon atom at the α-position is substituted is an atom other than the hydrogen atom or a group, and examples thereof include an alkyl group having from 1 to 5 carbon atoms, a halogenated alkyl group having from 1 to 5 carbon atoms, and a hydroxyalkyl group. Incidentally, the carbon atom at the α-position of the acrylic ester means a carbon atom bonded to the carbonyl group, unless otherwise specified.

The acrylic ester in which the hydrogen atom bonded to the carbon atom at the α-position is substituted with a substituent is hereinafter sometimes referred to as "α-substituted acrylic ester". In addition, the acrylic ester and the α-substituted acrylic ester are sometimes referred to comprehensively as an "(α-substituted) acrylic ester".

The term "constituent unit derived from hydroxystyrene or a hydroxystyrene derivative" means a constituent unit constituted upon cleavage of an ethylenic double bond of hydroxystyrene or a hydroxystyrene derivative.

The term "hydroxystyrene derivative" is a concept including compounds in which the hydrogen atom at the α-position of hydroxystyrene is substituted with other substituent such as an alkyl group and a halogenated alkyl group, and derivatives thereof. Examples of such derivatives include those in which the hydrogen atom of the hydroxyl group of hydroxystyrene in which the hydrogen atom at the α-position may be substituted with a substituent is substituted with an organic group; and those in which a substituent other than the hydroxyl group is bonded to the benzene ring of hydroxystyrene in which the hydrogen atom at the α-position may be substituted with a substituent. Incidentally, the term "α-position (carbon atom at the α-position)" means a carbon atom bonded to the benzene ring, unless otherwise specified.

Examples of the substituent with which the hydrogen atom at the α-position of hydroxystyrene is substituted include those exemplified above as the substituent at the α-position for the α-substituted acrylic ester.

The term "constituent unit derived from vinylbenzoic acid or a vinylbenzoic acid derivative" means a constituent unit constituted upon cleavage of an ethylenic double bond of vinylbenzoic acid or a vinylbenzoic acid derivative.

The term "vinylbenzoic acid derivative" is a concept including compounds in which the hydrogen atom at the α-position of vinylbenzoic acid is substituted with other substituent such as an alkyl group and a halogenated alkyl group, and derivatives thereof. Examples of such derivatives include those in which the hydrogen atom of the carboxy group of vinylbenzoic acid in which the hydrogen atom at the α-position may be substituted with a substituent is substituted with an organic group; and those in which a substituent other than a hydroxyl group and a carboxy group is bonded to the benzene ring of vinylbenzoic acid in which the hydrogen atom at the α-position may be substituted with a substituent. Incidentally, the term "α-position (carbon atom at the α-position)" means a carbon atom bonded to the benzene ring, unless otherwise specified.

The term "styrene" is a concept including styrene and compounds in which the hydrogen atom at the α-position of styrene is substituted with other substituent such as an alkyl group and a halogenated alkyl group.

The term "constituent unit derived from styrene" or "constituent unit derived from a styrene derivative" means a constituent unit constituted upon cleavage of an ethylenic double bond of styrene or a styrene derivative.

The alkyl group as the substituent at the α-position is preferably a linear or branched alkyl group. Specifically, examples thereof include an alkyl group having from 1 to 5 carbon atoms (for example, a methyl group, an ethyl group, a propyl group, an isopropyl group, an n-butyl group, an isobutyl group, a tert-butyl group, a pentyl group, an isopentyl group, or a neopentyl group).

In addition, specifically, examples of the halogenated alkyl group as the substituent at the α-position include a group in which a part or all of hydrogen atoms of the above-described "alkyl group as the substituent at the α-position" are substituted with a halogen atom. Examples of the halogen atom include a fluorine atom, a chlorine atom, a bromine atom, and an iodine atom, with a fluorine atom being especially preferable.

In addition, specifically, examples of the hydroxyalkyl group as the substituent at the α-position include a group in which a part or all of hydrogen atoms of the above-described "alkyl group as the substituent at the α-position" are substituted with a hydroxyl group. The number of the hydroxyl group in the hydroxyalkyl group is preferably from 1 to 5, and most preferably 1.

The case of describing "may have a substituent" includes both of the case where the hydrogen atom (—H) is substituted with a monovalent group and the case where the methylene group (—$CH_2$—) is substituted with a divalent group.

The term "exposure" is a concept including irradiation with any form of radiation.

DETAILED DESCRIPTION OF THE INVENTION

<<Resist Composition>>

The resist composition according to the present invention is a resist composition containing a base material component (A) whose solubility in a developing solution changes by the action of an acid (hereinafter also referred to as "base material component (A)") and an acid generator component (B) which generates an acid upon exposure (hereinafter also referred to as "acid generator component (B)").

Since the resist composition according to the present invention contains the base material component (A) and the acid generator component (B), it has such properties that the solubility in a developing solution changes upon exposure. When a resist film is formed using the resist composition, and the resist film is subjected to selective exposure, an acid is generated in exposed areas from the acid generator component (B), and the acid varies the solubility of the base material component (A) in a developing solution. As a result, the solubility of the exposed areas in the developing solution changes, whereas the solubility of unexposed areas in the developing solution does not change. Therefore, when the resist film is developed, in the case where the resist composition is a positive type, the exposed areas are dissolved and removed to form a positive-type resist pattern, whereas in the case where the resist composition is a negative type, the unexposed areas are dissolved and removed to form a negative-type resist pattern.

In the present specification, a resist composition capable of forming a positive-type resist pattern upon dissolution and removal of exposed areas is referred to as a positive-type resist composition, and a resist composition capable of forming a negative-type resist pattern upon dissolution and removal of unexposed areas is referred to as a negative-type resist composition.

The resist composition according to the present invention may be either a positive-type resist composition or a negative-type resist composition. In addition, the resist composition according to the present invention may be either a resist composition for an alkali developing process using an alkali developing solution for a development treatment at the time of forming a resist pattern or a resist composition for a solvent developing process using a developing solution containing an organic solvent (organic developing solution) for the development treatment. It is preferable that the resist composition according to the present invention is used for forming a positive-type resist pattern by an alkali developing process and for forming a negative-type resist pattern by a solvent developing process, respectively. In such a resist composition, it is preferable to use, as the base material component (A), a material in which its solubility in an alkali developing solution increases by the action of an acid, whereas its solubility in an organic developing solution decreases.

<Base Material Component; Component (A)>

In the present invention, the term "base material component" means an organic compound having film-forming ability.

In general, an organic compound having a molecular weight of 500 or more is used as the base material component. When the organic compound has a molecular weight of 500 or more, not only it has sufficient film-forming ability, but it is liable to form a resist pattern on a nano level.

The "organic compound having a molecular weight of 500 or more" is roughly classified into a non-polymer and a polymer.

In general, a compound having a molecular weight of 500 or more and less than 4,000 is used as the non-polymer. The term "low-molecular weight compound" as referred to hereinafter means a non-polymer having a molecular weight of 500 or more and less than 4,000.

In general, a compound having a molecular weight of 1,000 or more is used as the polymer. In the present specification and claims, the term. "polymer compound" means a polymer having a molecular weight of 1,000 or more.

In the case of the polymer compound, a mass average molecular weight as reduced into polystyrene by means of GPC (gel permeation chromatography) is adopted for the term "molecular weight".

In the case where the resist composition according to the present invention forms a positive-type pattern in the alkali developing process and forms a negative-type pattern in the solvent developing process, it is preferable to use, as the component (A), a base material component (A1) whose polarity increases by the action of an acid (hereinafter referred to as "component (A1)"). By using the component (A1), the polarity of the base material component changes before and after the exposure. Therefore, a satisfactory development contrast can be obtained in not only the alkali developing process but the solvent developing process.

In the case of applying an alkali developing process, the component (A1) is sparingly soluble in an alkali developing solution prior to exposure, and when an acid is generated from the component (B) upon exposure, its polarity increases by the action of the acid, whereas its solubility in an alkali developing solution increases. For that reason, in the formation of a resist pattern, when the resist film obtained by applying the resist composition on a support is selectively exposed, the exposed areas change from a sparingly soluble state to a soluble state in an alkali developing solution, whereas the unexposed areas remain in a sparingly soluble state in an alkali. Thus, a contrast can be made between the exposed areas and the unexposed areas, and by conducting the development with an alkali developing solution, a positive-type pattern can be formed.

In addition, in the case of applying a solvent developing process, the component (A1) is highly soluble in an organic developing solution prior to exposure, and when an acid is generated from the component (B) upon exposure, its polarity increases by the action of the acid, whereas its solubility in an organic developing solution decreases. For that reason, in the formation of a resist pattern, when the resist film obtained by applying the resist composition on a support is selectively exposed, the exposed areas change from a soluble state to a sparingly soluble state in an organic developing solution, whereas the unexposed areas remain in a soluble state in an organic development solution. Thus, a contrast can be made between the exposed areas and the unexposed areas, and by conducting the development with an organic developing solution, a negative-type pattern can be formed.

In the case where the resist composition according to the present invention is a resist composition for forming a negative-type pattern in an alkali developing process, in general, a base material component which is soluble in an alkali developing solution is used as the component (A), and a crosslinking agent component is further blended therein.

The base material component which is soluble in an alkali developing solution has an alkali-soluble group such as a hydroxyl group, a carboxy group, and a sulfonamide group, and the crosslinking component has a reactive group capable of reacting with such an alkali-soluble group. For that reason, in such a resist composition, when an acid is generated from the component (B) upon exposure, the acid acts to cause crosslinking between the base material component and the crosslinking agent component, whereby the resist composition changes to a sparingly soluble state in an alkali developing solution. For that reason, in the formation of a resist pattern, when a resin film obtained by applying the resist composition on a support is selectively exposed, the exposed areas change to a sparingly soluble state in an alkali developing solution, whereas the unexposed areas remain in a soluble state in an alkali development solution. Thus, a resist pattern can be formed upon alkali development.

In general, a resin which is soluble in an alkali developing solution (hereinafter referred to as "alkali-soluble resin") is used as the base material component which is soluble in an alkali developing solution.

Examples of the alkali-soluble resin include a resin having a unit derived from at least one member selected from an α-(hydroxyalkyl)acrylic acid and an alkyl ester of an α-(hydroxyalkyl)acrylic acid (preferably an alkyl ester having from 1 to 5 carbon atoms), as disclosed in JP-A-2000-206694; an acrylic resin or a polycycloolefin resin having a sulfonamide group, in which an atom other than a hydrogen atom or a substituent may be bonded to the carbon atom at the α-position, as disclosed in U.S. Pat. No. 6,949,325; an acrylic resin containing a fluorinated alcohol, in which an atom other than a hydrogen atom or a substituent may be bonded to the carbon atom at the α-position, as disclosed in U.S. Pat. No. 6,949,325, JP-A-2005-336452, and JP-A-2006-317803; and a polycycloolefin resin having a fluorinated alcohol, as disclosed in JP-A-2006-259582. These resins are preferable because a satisfactory resist pattern with minimal swelling can be formed.

Incidentally, with respect to the acrylic acid in which an atom other than a hydrogen atom or a substituent may be bonded to the carbon atom at the α-position, the term "α-(hydroxyalkyl)acrylic acid" refers to one or both of acrylic acid in which a hydrogen atom is bonded to the carbon atom at the α-position having a carboxy group bonded thereto, and an α-hydroxyalkylacrylic acid in which a hydroxyalkyl group (preferably a hydroxyalkyl group having from 1 to 5 carbon atoms) is bonded to the carbon atom at the α-position.

In general, for example, when an amino-based crosslinking agent such as a glycoluril having a methylol group or an alkoxymethyl group and a melamine-based crosslinking agent is used as the crosslinking agent component, a satisfactory resist pattern with minimal swelling can be formed, and such is preferable. The amount of the crosslinking agent component blended is preferably from 1 to 50 parts by mass based on 100 parts by mass of the alkali-soluble resin.

[Resin Component (A1)]

In the resist composition according to the present invention, the component (A) preferably contains a resin component (A1) having a constituent unit (a1) containing an acid decomposable group whose polarity increases by the action of an acid (hereinafter referred to as "component (A1)").

In general, a resin component (base resin) which is used as a base material component for a chemically amplified resist can be used solely, or a mixture of two or more of such resin components can be used.

It is preferable that the component (A1) further has, in addition to the constituent unit (a1), a constituent unit (a2) containing a lactone-containing cyclic group, a carbonate-containing cyclic group, or an —SO$_2$— containing cyclic group.

It is preferable that the component (A1) further has, in addition to the constituent unit (a1), or in addition to the constituent units (a1) and (a2), a constituent unit (a3) containing a polar group.

(Constituent Unit (a1))

The constituent unit (a1) is a constituent unit containing an acid decomposable group whose polarity increases by the action of an acid.

The term "acid decomposable group" is a group having acid decomposability, in which at least a part of the bond in the structure of the acid decomposable group may be cleaved by the action of an acid.

Examples of the acid decomposable group whose polarity increases by the action of an acid include a group which is decomposed by the action of an acid to form a polar group.

Examples of the polar group include a carboxy group, a hydroxyl group, an amino group, and a sulfo group (—SO$_3$H). Of these, a polar group containing —OH in the structure (hereinafter sometimes referred to as "OH-containing polar group") is preferable, a carboxy group or a hydroxyl group is more preferable, and a carboxy group is especially preferable.

More specifically, examples of the acid decomposable group include a group in which the above-described polar group is protected with an acid dissociable group (for example, a group in which the hydrogen atom of the OH-containing polar group is protected with an acid dissociable group).

Here, the "acid dissociable group" refers to either one or both of the following groups.

(i) A group having such acid dissociation properties that the bond between the acid dissociable group and the atom adjacent to the acid dissociable group may be cleaved by the action of an acid.

(ii) A group in which after a part of the bond is cleaved by the action of an acid, a decarboxylation reaction is further caused, whereby the bond between the acid dissociable group and the atom adjacent to the acid dissociable group may be cleaved.

It is necessary that the acid dissociable group constituting the acid decomposable group is a group with lower polarity than a polar group formed upon dissociation of the acid dissociable group. According to this, at the time of dissociation of the acid dissociable group by the action of an acid, a polar group having higher polarity than the acid dissociable group is formed, whereby the polarity increases. As a result, the polarity of the whole of the component (A1) increases. In view of the fact that the polarity increases, the solubility in a developing solution relatively changes, and in the case where the developing solution is an alkali developing solution, the solubility increases, whereas in the case where the developing solution is an organic developing solution, the solubility decreases.

The acid dissociable group is not particularly limited, and those which have been proposed so far as the acid dissociable group of a base resin for a chemically amplified resist can be used.

Among the above-described polar groups, examples of the acid dissociable group which protects a carboxy group or a hydroxyl group include an acid dissociable group represented by the following general formula (a1-r-1) (hereinafter sometimes referred to as "acetal-type acid dissociable group").

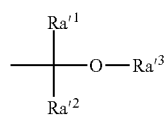

(a1-r-1)

In the formula (a1-r-1), each of $Ra'^1$ and $Ra'^2$ represents a hydrogen atom or an alkyl group; $Ra'^3$ represents a hydrocarbon group; and $Ra'^3$ may be bonded to any one of $Ra'^1$ or $Ra'^2$ to form a ring.

In the formula (a1-r-1), it is preferable that at least one of $Ra'^1$ and $Ra'^2$ represents a hydrogen atom, and it is more preferable that both of $Ra'^1$ and $Ra'^2$ represent a hydrogen atom.

In the case where $Ra'^1$ or $Ra'^2$ represents an alkyl group, examples of the alkyl group include the same alkyl groups as those exemplified above as the substituent which may be bonded to the carbon atom at the α-position in the explanation regarding the α-substituted acrylic ester, and an alkyl group having from 1 to 5 carbon atoms is preferable. Specifically, examples thereof include a linear or branched alkyl group such as a methyl group, an ethyl group, a propyl group, an isopropyl group, an n-butyl group, an isobutyl group, a tert-butyl group, a pentyl group, an isopentyl group, and a neopentyl group. Of these, a methyl group or an ethyl group is preferable, and a methyl group is especially preferable.

In the formula (a1-r-1), examples of the hydrocarbon group represented by $Ra'^3$ include a linear, branched or cyclic alkyl group. The carbon number of the linear alkyl group is preferably from 1 to 5, more preferably from 1 to 4, and still more preferably 1 or 2. Specifically, examples thereof include a methyl group, an ethyl group, an n-propyl group, an n-butyl group, and an n-pentyl group. Of these, a methyl group, an ethyl group, or an n-butyl group is preferable, and a methyl group or an ethyl group is more preferable.

The carbon number of the branched alkyl group is preferably from 3 to 10, and more preferably from 3 to 5. Specifically, examples thereof include an isopropyl group, an isobutyl group, a tert-butyl group, an isopentyl group, and a neopentyl group, with an isopropyl group being the most preferable.

The carbon number of the cyclic alkyl group is preferably from 3 to 20, and more preferably from 4 to 12. Specifically, examples thereof include a monocycloalkane such as cyclopentane and cyclohexane; and a group in which one or more hydrogen atoms are removed from a polycycloalkane such as adamantane, norbornane, isobornane, tricyclodecane, and tetracyclododecane. A part of the carbon atoms constituting the ring of the cyclic alkyl group may be substituted with an ethereal oxygen atom (—O—).

In the case where $Ra'^3$ may be bonded to any one of $Ra'^1$ or $Ra'^2$ to form a ring, the cyclic group is preferably from a 4-membered to 7-membered ring, and more preferably from 4-membered to 6-membered ring. Specific examples of the cyclic group include a tetrahydropyranyl group and a tetrahydrofuranyl group.

Of the above-described polar groups, examples of the acid dissociable group which protects a carboxy group include an acid dissociable group represented by the following general formula (a1-r-2) (of the acid dissociable groups represented by the following general formula (a1-r-2), a group constituted of alkyl groups will be hereinafter sometimes referred to as "tertiary alkyl ester-type acid dissociable group" for the sake of convenience).

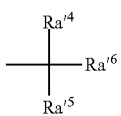

(a1-r-2)

In the formula (a1-r-2), each of $Ra'^4$ to $Ra'^6$ represents a hydrocarbon group, and $Ra'^5$ and $Ra'^6$ may be bonded to each other to form a ring.

Examples of the hydrocarbon group represented by $Ra'^4$ to $Ra'^6$ include the same hydrocarbon groups as those exemplified above for $Ra'^3$.

$Ra'^4$ is preferably an alkyl group having from 1 to 5 carbon atoms. In the case where $Ra'^5$ and $Ra'^6$ are bonded to each other to form a ring, there is exemplified a group represented by the following general formula (a1-r-1). On the other hand, in the case where $Ra'^4$ to $Ra'^6$ are not bonded to each other but are independently a hydrocarbon group, there is exemplified a group represented by the following general formula (a1-r-2).

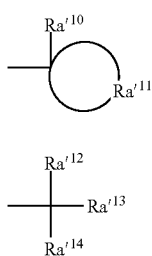 (a1-r2-1)

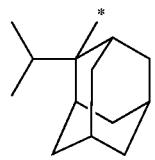 (r-pr-m4)

(a1-r2-2)

 (r-pr-m5)

In the foregoing formulae, $Ra'^{10}$ represents an alkyl group having from 1 to 10 carbon atoms; $Ra'^{11}$ represents a group for forming an aliphatic cyclic group together with the carbon atom to which $Ra'^{10}$ is bonded; and each of $Ra'^{12}$ to $Ra'^{14}$ independently represents a hydrocarbon group.

In the formula (a1-r-1), the alkyl group having from 1 to 10 carbon atoms represented by $Ra'^{10}$ is preferably the group exemplified as the linear or branched alkyl group represented by $Ra'^{3}$ in the formula (a1-r-1). In the formula (a1-r-1), the aliphatic cyclic group constituted by $Ra'^{11}$ is preferably the group exemplified as the cyclic alkyl group represented by $Ra'^{3}$ in the formula (a1-r-1).

In the formula (a1-r-2), each of $Ra'^{12}$ and $Ra'^{14}$ is preferably independently an alkyl group having from 1 to 10 carbon atoms. The alkyl group is more preferably the group exemplified as the linear or branched alkyl group represented by $Ra'^{3}$ in the formula (a1-r-1), still more preferably a linear alkyl group having from 1 to 5 carbon atoms, and especially preferably a methyl group or an ethyl group.

In the formula (a1-r-2), $Ra'^{13}$ is preferably the linear, branched or cyclic alkyl group exemplified as the hydrocarbon group represented by $Ra'^{3}$ in the formula (a1-r-1). Of these, $Ra'^{13}$ is more preferably the group exemplified as the cyclic alkyl group represented by $Ra'^{3}$.

Specific examples of the formula (a1-r-1) are given below.

(r-pr-m1)

(r-pr-m2)

(r-pr-m3)

(r-pr-m6)

(r-pr-m7)

(r-pr-m8)

(r-pr-m9)

(r-pr-m10)

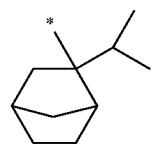 (r-pr-m11)

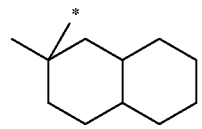 (r-pr-m12)

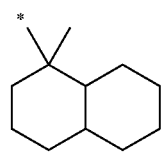

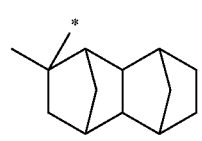 (r-pr-m13)

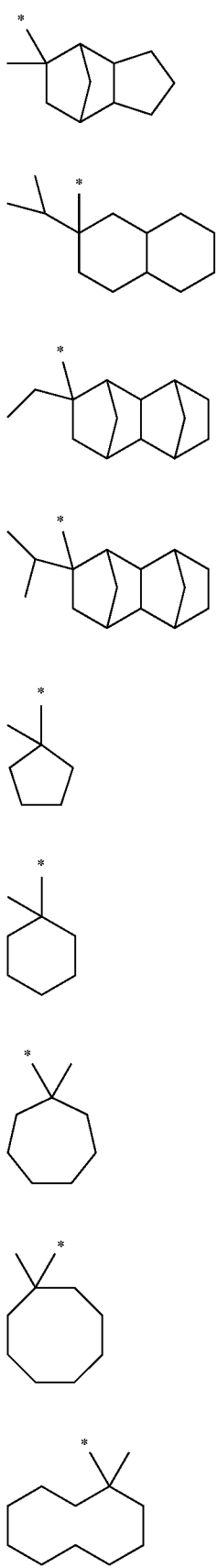
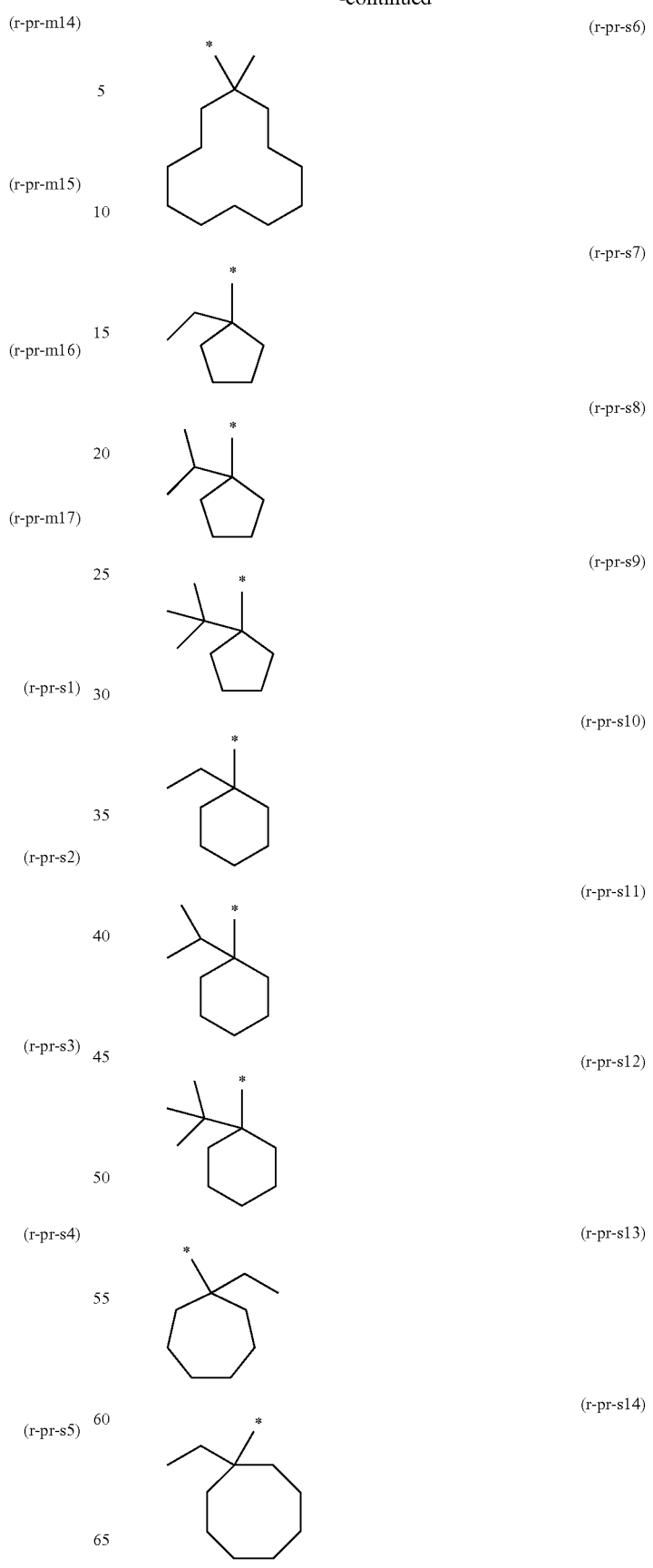

(r-pr-s15)
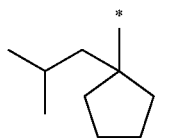
(r-pr-s16)
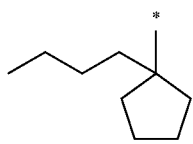
(r-pr-s17)
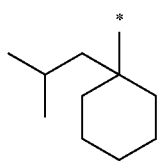
(r-pr-s18)
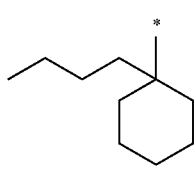
Specific examples of the formula (a1-r-2) are given below.
(r-pr-cm1)
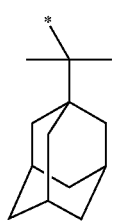
(r-pr-cm2)
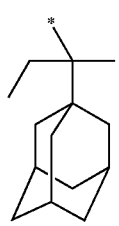
(r-pr-cm3)
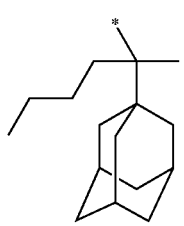
(r-pr-cm4)
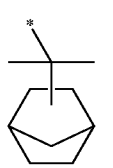
(r-pr-cm5)
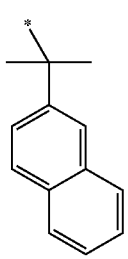
(r-pr-cm6)
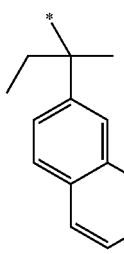
(r-pr-cm7)
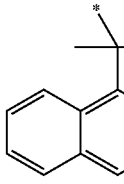
(r-pr-cm8)
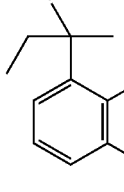
(r-pr-cs1)
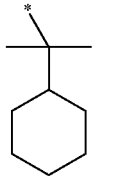
(r-pr-cs2)
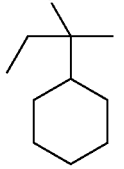
(r-pr-cs3)
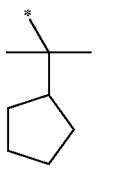
(r-pr-cs4)
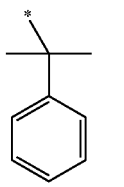

-continued

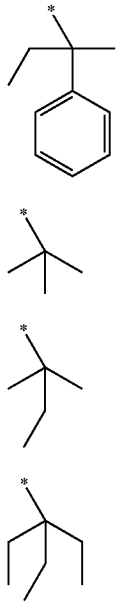

(r-pr-cs5)

(r-pr-c1)

(r-pr-c2)

(r-pr-c3)

In addition, of the above-described polar groups, examples of the acid dissociable group which protects a hydroxyl group include an acid dissociable group represented by the following general formula (a1-r-3) (hereinafter sometimes referred to as "tertiary alkyloxycarbonyl acid dissociable group" for the sake of convenience).

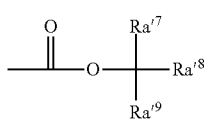

(a1-r-3)

In the formula (a1-r-3), each of $Ra'^7$ to $Ra'^9$ represents an alkyl group.

In the formula (a1-r-3), the alkyl group represented by $Ra'^7$ to $Ra'^9$ is preferably an alkyl group having from 1 to 5 carbon atoms, and more preferably an alkyl group having from 1 to 3 carbon atoms.

In addition, the carbon number of the total sum of the respective alkyl groups is preferably from 3 to 7, more preferably from 3 to 5, and most preferably from 3 to 4.

The constituent unit (a1) is a constituent unit derived from an acrylic ester in which the hydrogen atom bonded to the carbon atom at the α-position may be substituted with a substituent. Examples thereof include a constituent unit containing an acid decomposable group whose polarity increases by the action of an acid; a constituent unit protected with a substituent in which at least a part of the hydrogen atoms in hydroxyl groups of a constituent unit derived from hydroxystyrene or a hydroxystyrene derivative contains the acid decomposable group; and a constituent unit protected with a substituent in which at least a part of the hydrogen atoms in —C(=O)—OH of a constituent unit derived from vinylbenzoic acid or a vinylbenzoic acid derivative contains the acid decomposable group.

Of these, the constituent unit (a1) is preferably a constituent unit derived from an acrylic ester in which the hydrogen atom bonded to the carbon atom at the α-position may be substituted with a substituent.

Preferred specific examples of the constituent unit (a1) include those represented by the following general formulae (a1-1) and (a1-2).

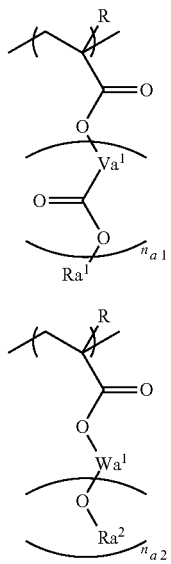

(a1-1)

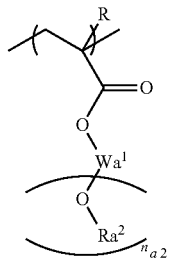

(a1-2)

In the foregoing formulae, R represents a hydrogen atom, an alkyl group having from 1 to 5 carbon atoms, or a halogenated alkyl group having from 1 to 5 carbon atoms; $Va^1$ represents a divalent hydrocarbon group which may have an ether bond; each $n_{a1}$ is independently from 0 to 2; $Ra^1$ represents the acid dissociable group represented by the formulae (a1-r-1) to (a1-r-2); $Wa^1$ represents an $(n_{a2}+1)$-valent hydrocarbon group; $n_{a2}$ is from 1 to 3; and $Ra^2$ represents the acid dissociable group represented by the formula (a1-r-1) or (a1-r-3).

In the formula (a1-1), the alkyl group having from 1 to 5 carbon atoms is preferably a linear or branched alkyl group. Specifically, examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having from 1 to 5 carbon atoms is a group in which apart or all of the hydrogen atoms of the above-described alkyl group having from 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having from 1 to 5 carbon atoms, or a fluorinated alkyl group having from 1 to 5 carbon atoms. From the standpoint of easiness of industrial availability, R is most preferably a hydrogen atom or a methyl group.

The divalent hydrocarbon group represented by $Va^1$ may be either an aliphatic hydrocarbon group or an aromatic hydrocarbon group. The aliphatic hydrocarbon group means a hydrocarbon group having no aromaticity. The aliphatic hydrocarbon group as the divalent hydrocarbon group represented by $Va^1$ may be either a saturated group or an unsaturated group, and in general, it is preferably a saturated group.

More specifically, examples of the aliphatic hydrocarbon group include a linear or branched aliphatic hydrocarbon group and an aliphatic hydrocarbon group containing a ring in the structure thereof.

In addition, examples of Va¹ include one in which the above-described divalent hydrocarbon groups are bonded via an ether bond.

The linear or branched aliphatic hydrocarbon group is preferably one having from 1 to 10 carbon atoms, more preferably one having from 1 to 6 carbon atoms, still more preferably one having from 1 to 4 carbon atoms, and most preferably one having from 1 to 3 carbon atoms.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, for example, —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkylethylene group, for example, —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group, for example, —$CH(CH_3)CH_2CH_2$— and —$CH_2CH(CH_3)CH_2$—; and an alkyltetramethylene group, for example, $CH(CH_3)CH_2CH_2CH_2$— and —$CH_2CH(CH_3)CH_2CH_2$—. The alkyl group in the alkylalkylene group is preferably a linear alkyl group having from 1 to 5 carbon atoms.

Examples of the aliphatic hydrocarbon group containing a ring in the structure thereof include an alicyclic hydrocarbon group (a group in which two hydrogen atoms are removed from an aliphatic hydrocarbon ring), a group in which an alicyclic hydrocarbon group is bonded to the terminal of a linear or branched aliphatic hydrocarbon group, and a group in which an alicyclic hydrocarbon group intervenes on the way of a linear or branched aliphatic hydrocarbon group. Examples of the linear or branched aliphatic hydrocarbon group include the same groups as those described above.

The alicyclic hydrocarbon group has preferably from 3 to 20 carbon atoms, and more preferably from 3 to 12 carbon atoms.

The alicyclic hydrocarbon group may be either a polycyclic group or a monocyclic group. The monocyclic aliphatic hydrocarbon group is preferably a group in which two hydrogen atoms are removed from a monocycloalkane. The monocycloalkane is preferably one having from 3 to 6 carbon atoms. Specifically, examples thereof include cyclopentane and cyclohexane. The polycyclic alicyclic hydrocarbon group is preferably a group in which two hydrogen atoms are removed from a polycycloalkane. The polycycloalkane is preferably one having from 7 to 12 carbon atoms. Specifically, examples thereof include adamantane, norbornane, isobornane, tricyclodecane, and tetracyclododecane.

The aromatic hydrocarbon group is a hydrocarbon group having an aromatic ring.

The aromatic hydrocarbon group as the divalent hydrocarbon group in Va¹ has preferably from 3 to 30 carbon atoms, more preferably from 5 to 30 carbon atoms, still more preferably from 5 to 20 carbon atoms, especially preferably from 6 to 15 carbon atoms, and most preferably from 6 to 10 carbon atoms. However, the carbon number does not include the carbon number in the substituent.

Specifically, examples of the aromatic ring which the aromatic hydrocarbon group has include an aromatic hydrocarbon ring such as benzene, biphenyl, fluorene, naphthalene, anthracene, and phenanthrene; and an aromatic heterocyclic ring in which a part of the carbon atoms constituting the aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group (arylene group) in which two hydrogen atoms are removed from the above-described aromatic hydrocarbon ring; and a group in which one of the hydrogen atoms of a group (aryl group) in which one hydrogen atom is removed from the above-described aromatic hydrocarbon ring is substituted with an alkylene group (a group in which one hydrogen atom is further removed from an aryl group in an arylalkyl group, for example, a benzyl group, a phenethyl group, a 1-naphthylmethyl group, a 2-naphthylmethyl group, a 1-naphthylethyl group, or a 2-naphthylethyl group). The carbon number of the alkylene group (the alkyl chain in the arylalkyl group) is preferably from 1 to 4, more preferably from 1 to 2, and especially preferably 1.

In the formula (a1-2), the $(n_{a2}+1)$-valent hydrocarbon group represented by Wa¹ may be either an aliphatic hydrocarbon group or an aromatic hydrocarbon group. The aliphatic hydrocarbon group means a hydrocarbon group having no aromaticity. The aliphatic hydrocarbon group may be either a saturated group or an unsaturated group, and in general, it is preferably a saturated group. Examples of the aliphatic hydrocarbon group include a linear or branched aliphatic hydrocarbon group, an aliphatic hydrocarbon group containing a ring in the structure thereof, and a group in which a linear or branched aliphatic hydrocarbon group and an aliphatic hydrocarbon group containing a ring in the structure thereof are combined. Specifically, examples thereof include the same groups as those for Va¹ of the formula (a1-1).

The valence of $(n_{a2}+1)$ is preferably from divalent to tetravalent, and more preferably divalent or trivalent.

In particular, the formula (a1-2) is preferably a constituent unit represented by the following general formula (a1-2-01).

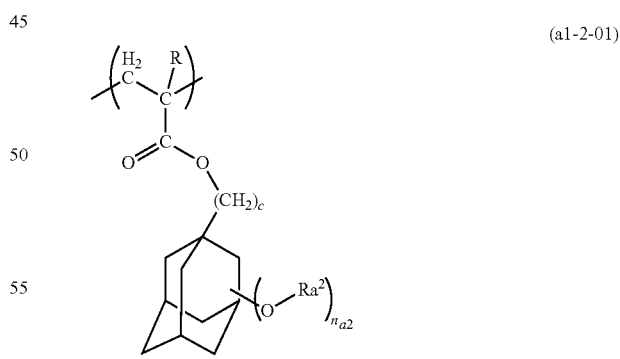

(a1-2-01)

In the formula (a1-2-01), Ra² represents the acid dissociable group represented by the formula (a1-r-1) or (a1-r-3). $n_{a2}$ represents an integer of from 1 to 3 and is preferably 1 or 2, and more preferably 1. c represents an integer of from 0 to 3 and is preferably 0 or 1, and more preferably 1. R is the same as that described above.

Specific examples of the formula (a1-1) are given below. R is the same as that described above.

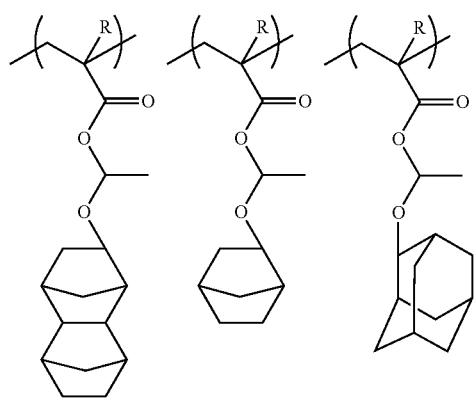
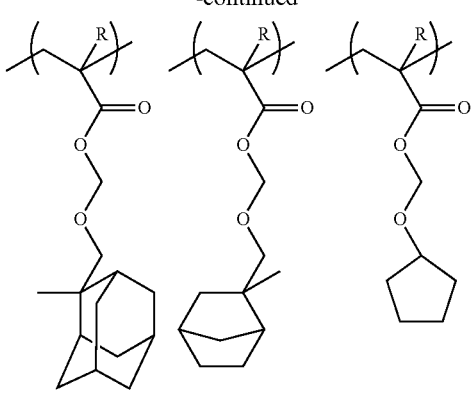
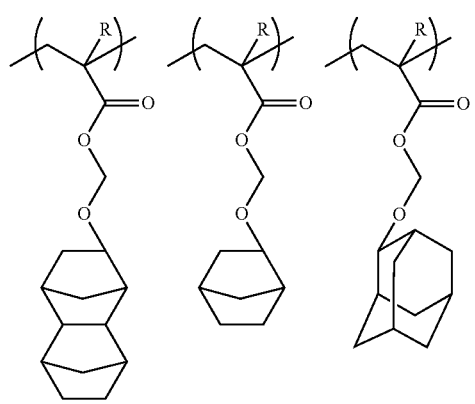
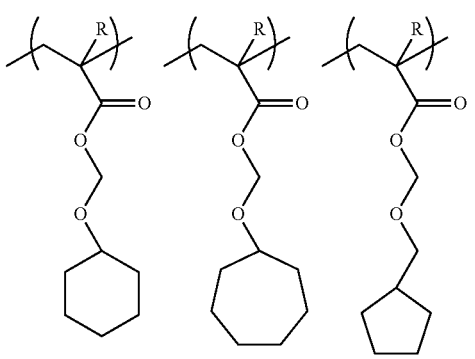
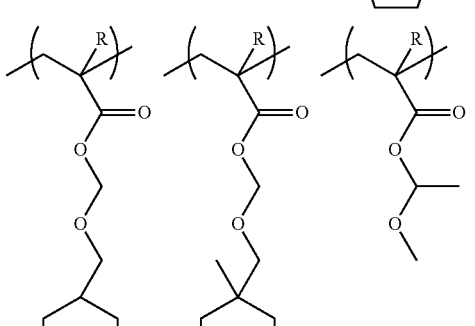
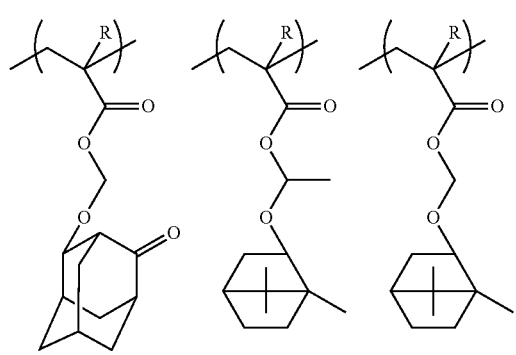
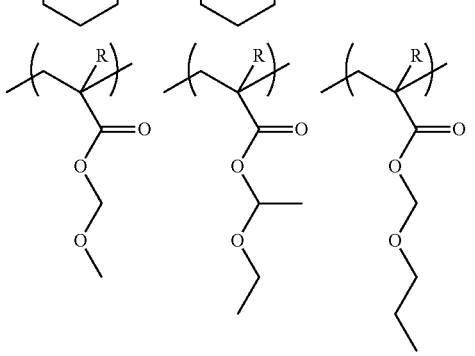
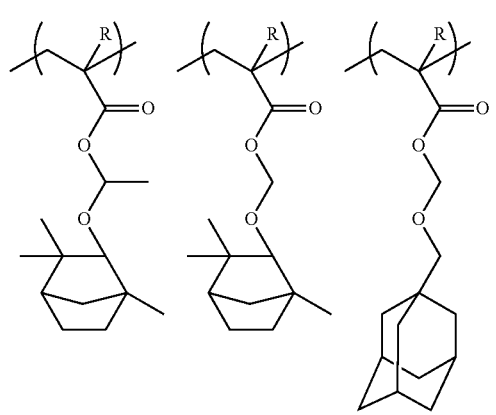
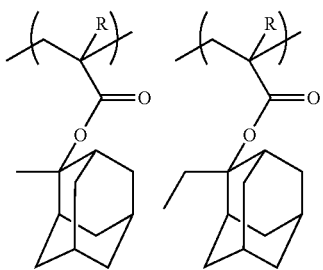

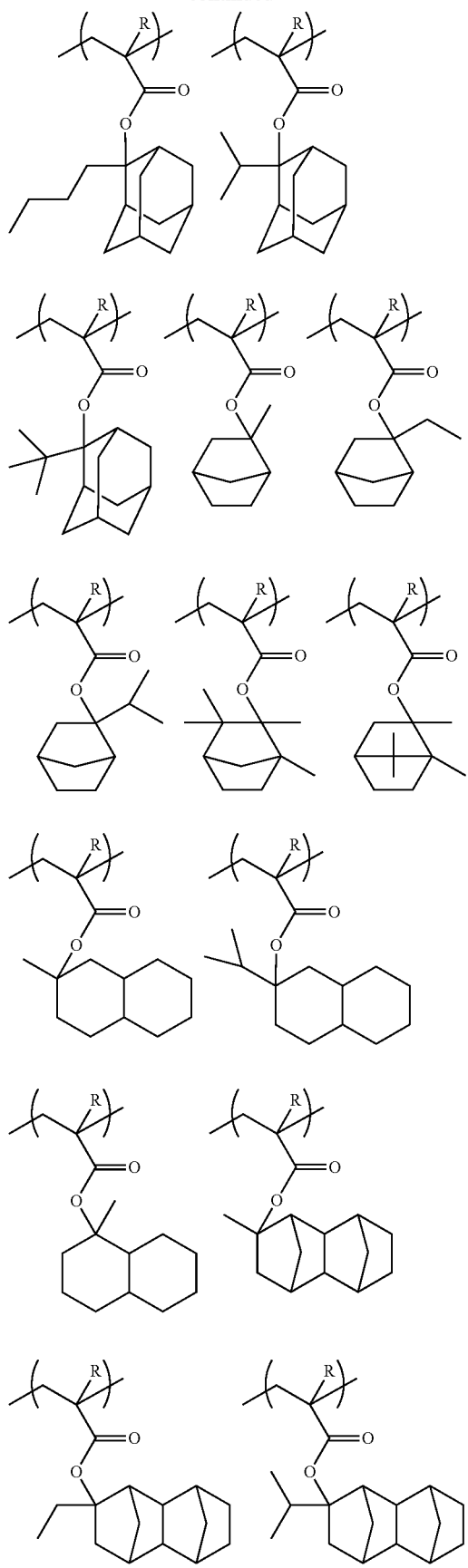
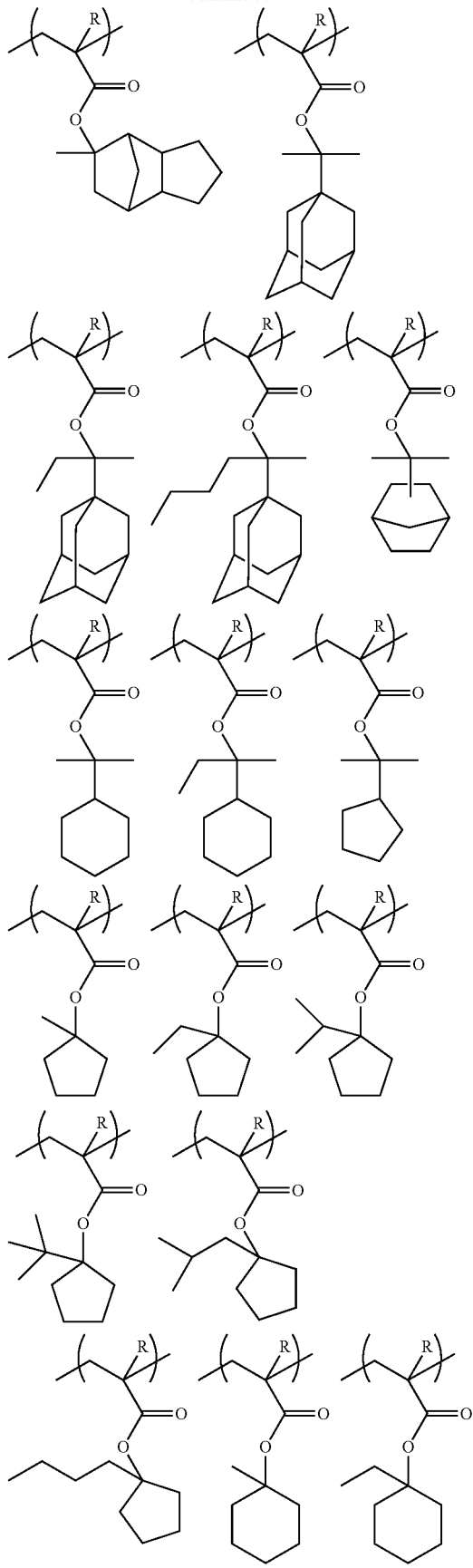

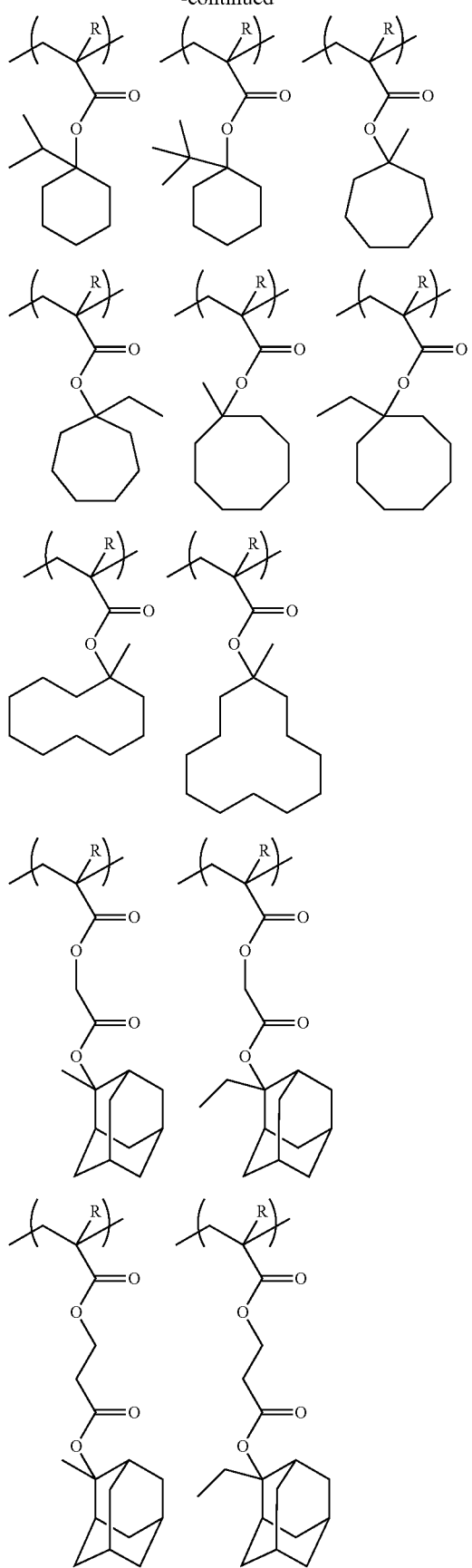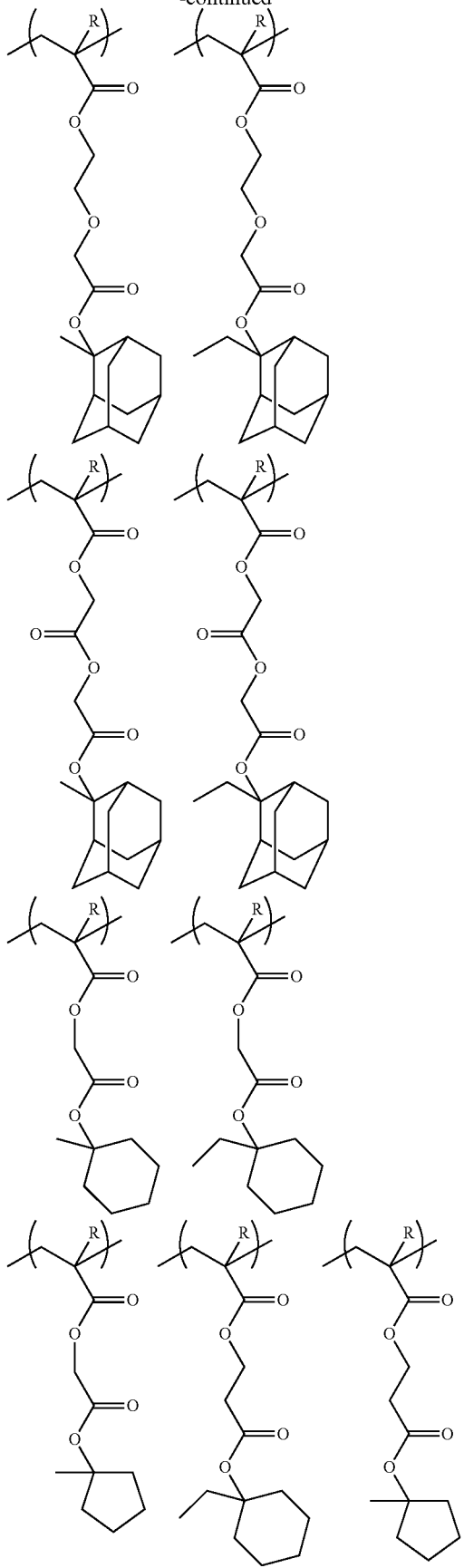

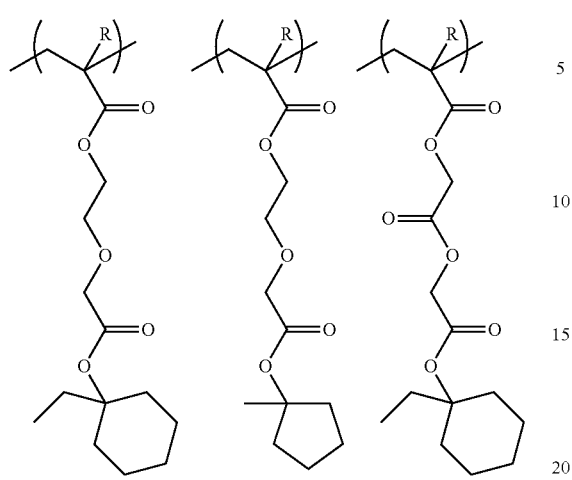
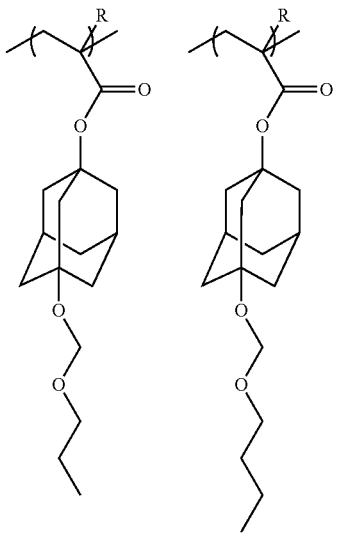
Specific examples of the formula (a1-2) are given below.
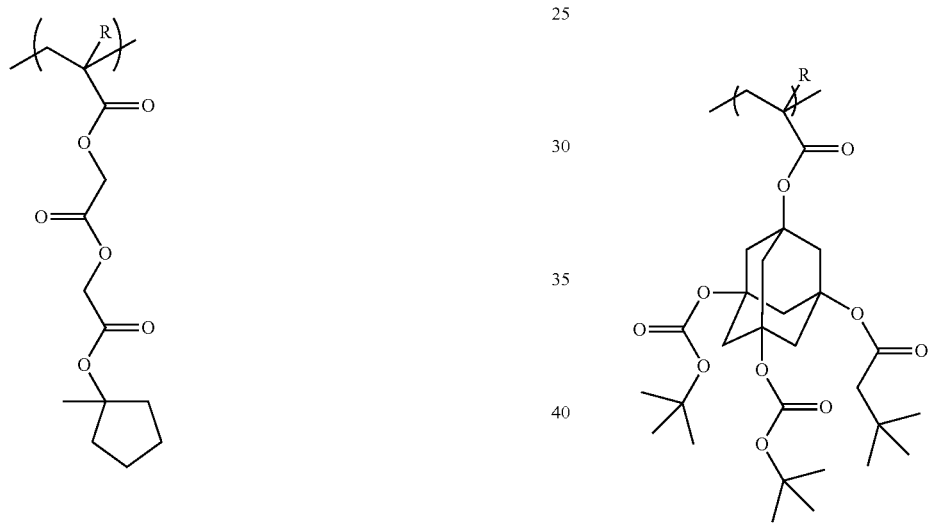
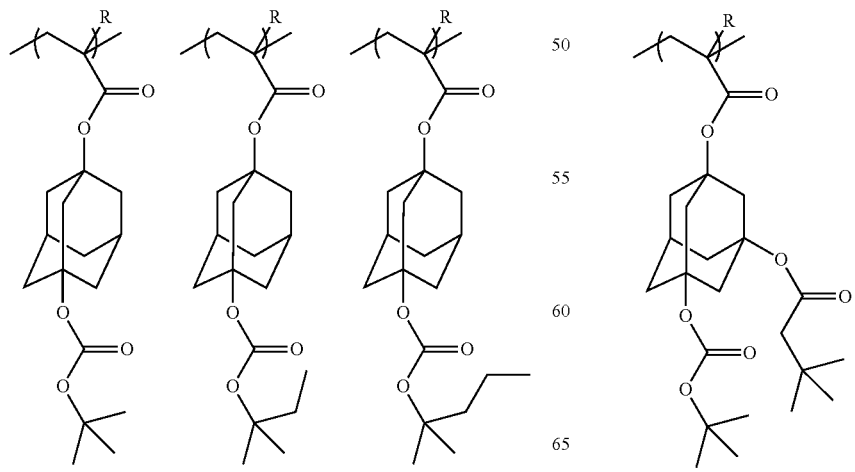

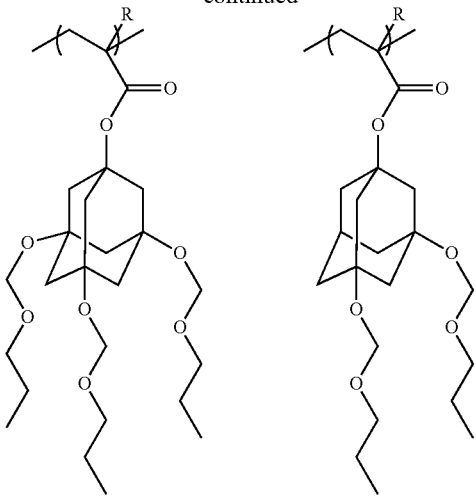

A proportion of the constituent unit (a1) in the component (A1) may be 100% by mole and is preferably from 20 to 80% by mole, more preferably from 20 to 75% by mole, and still more preferably from 25 to 70% by mole, relative to all of the constituent units constituting the component (A1). When the proportion of the constituent unit (a1) in the component (A1) is the lower limit value or more, at the time of forming into a solvent developing negative-type resist composition, a pattern can be easily obtained, and lithography properties such as sensitivity, resolution, and LWR are also enhanced. In addition, when the proportion of the constituent unit (a1) in the component (A1) is not more than the upper limit value, a balance with other constituent units can be taken.

(Constituent Unit (a2))

It is preferable that the component (A1) further has, in addition to the constituent unit (a1), a constituent unit (a2) containing a lactone-containing cyclic group, a carbonate-containing cyclic group, or an —$SO_2$— containing cyclic group.

In the case of using the component (A1) for the formation of a resist film, the lactone-containing cyclic group or the carbonate-containing cyclic group of the constituent unit (a2) is effective for increasing the adhesion of the resist film to a substrate.

Incidentally, in the case where the constituent unit (a1) is one containing a lactone-containing cyclic group or a carbonate-containing cyclic group in the structure thereof, the subject constituent unit also falls under the definition of the constituent unit (a2). However, it should be construed that such a constituent unit falls under the definition of the constituent unit (a1) but does not fall under the definition of the constituent unit (a2).

In the case of using the component (A1) for the formation of a resist film, the —$SO_2$— containing cyclic group of the constituent unit (a2) is effective for increasing the adhesion of the resist film to a substrate.

Incidentally, in the case where the constituent unit (a1) is one containing an —$SO_2$— containing cyclic group, the subject constituent unit also falls under the definition of the constituent unit (a2). However, it should be construed that such a constituent unit falls under the definition of the constituent unit (a1) but does not fall under the definition of the constituent unit (a2).

The constituent unit (a2) is preferably a constituent unit represented by the following general formula (a2-1).

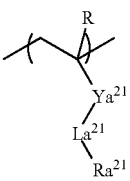

(a2-1)

In the formula (a2-1), R represents a hydrogen atom, an alkyl group having from 1 to 5 carbon atoms, or a halogenated alkyl group having from 1 to 5 carbon atoms; $Ya^{21}$ represents a single bond or a divalent linking group; $La^{21}$ represents —O—, —COO—, —CON(R')—, —COO—, —CONHCO—, or —CONHCS—; R' represents a hydrogen atom or a methyl group, provided that in the case where $La^{21}$ is —O—, $Ya^{21}$ is not —CO—; and $Ra^{21}$ represents a lactone-containing cyclic group, a carbonate-containing cyclic group, or an —$SO_2$— containing cyclic group.

Though the divalent linking group represented by $Ya^{21}$ is not particularly limited, suitable examples thereof include a divalent hydrocarbon group which may have a substituent; and a divalent linking group containing a hetero atom.

(Divalent Hydrocarbon Group which May have a Substituent)

The hydrocarbon group as the divalent linking group may be either an aliphatic hydrocarbon group or an aromatic hydrocarbon group.

The aliphatic hydrocarbon group means a hydrocarbon group having no aromaticity. The aliphatic hydrocarbon group may be either a saturated group or an unsaturated group, and in general, it is preferably a saturated group.

Examples of the aliphatic hydrocarbon group include a linear or branched aliphatic hydrocarbon group and an aliphatic hydrocarbon group containing a ring in the structure thereof. Specifically, examples thereof include the same groups as those exemplified above for $Va^1$ of the formula (a1-1).

The linear or branched aliphatic hydrocarbon group may or may not have a substituent. Examples of the substituent include a fluorine atom, a fluorinated alkyl group having from 1 to 5 carbon atoms, which is substituted with a fluorine atom, and a carbonyl group.

Examples of the aliphatic hydrocarbon group containing a ring in the structure thereof include a cyclic aliphatic hydrocarbon group which may contain a substituent containing a hetero atom in the cyclic structure thereof (a group in which two hydrogen atoms are removed from an aliphatic hydrocarbon ring); a group in which the above-described cyclic aliphatic hydrocarbon group is bonded to the terminal of a linear or branched aliphatic hydrocarbon group; and a group in which the above-described cyclic aliphatic hydrocarbon group intervenes on the way of a linear or branched aliphatic hydrocarbon group. Examples of the linear or branched aliphatic hydrocarbon group include the same groups as those described above.

The cyclic aliphatic hydrocarbon group has preferably from 3 to 20 carbon atoms, and more preferably from 3 to 12 carbon atoms.

Specifically, examples of the cyclic aliphatic hydrocarbon group include the same groups as those exemplified above for $Va^1$ of the formula (a1-1).

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having from 1 to 5 carbon atoms, and most preferably a methyl group, an ethyl group, a propyl group, an n-butyl group, or a tert-butyl group.

The alkoxy group as the substituent is preferably an alkoxy group having from 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

In the cyclic aliphatic hydrocarbon group, a part of the carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Specifically, examples of the aromatic hydrocarbon group as the divalent hydrocarbon group include the same groups as those exemplified above for $Va^1$ of the formula (a1-1).

In the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of the substituent include an alkyl group, an alkoxy group, a halogen atom, a halogenated alkyl group, and a hydroxyl group.

The alkyl group as the substituent is preferably an alkyl group having from 1 to 5 carbon atoms, and most preferably a methyl group, an ethyl group, a propyl group, an n-butyl group, or a tert-butyl group.

Examples of the alkoxy group, the halogen atom, and the halogenated alkyl group as the substituent include the same groups as those exemplified above for the substituent with which the hydrogen atom which the cyclic aliphatic hydrocarbon group has is substituted.

(Divalent Linking Group Containing a Hetero Atom)

The hetero atom in the divalent linking group containing a hetero atom is an atom other than a carbon atom or a hydrogen atom, and examples thereof include an oxygen atom, a nitrogen atom, a sulfur atom, and a halogen atom.

In the case where $Ya^{21}$ is a divalent linking group containing a hetero atom, suitable examples of the linking group include —O—, —C(=O)—O—, —C(=O)—, —O—C(=O)—O—, —C(=O)—NH—, —NH—, —NH—C(=NH)— (H may be substituted with a substituent such as an alkyl group and an acyl group), —S—, —S(=O)$_2$—, —S(=O)$_2$—O—, and a group represented by the general formula: —Y$^{21}$—O—Y$^{22}$—, —Y$^{21}$—O—, —Y$^{21}$—C(=O)—O—, —[Y$^{21}$—C(=O)—O]$_{m'}$—Y$^{22}$—, or —Y$^{21}$—O—C(=O)—Y$^{22}$— [wherein each of Y$^{21}$ and Y$^{22}$ independently represents a divalent hydrocarbon group which may have a substituent; O represents an oxygen atom; and m' represents an integer of from 0 to 3].

In the case where the divalent linking group containing a hetero atom is —C(=O)—NH—, —NH—, or —NH—C(=NH)—, H may be substituted with a substituent such as an alkyl group and an acyl group. The substituent (for example, an alkyl group or an acyl group) has preferably from 1 to 10 carbon atoms, more preferably from 1 to 8 carbon atoms, and especially preferably from 1 to 5 carbon atoms.

In the formula: —Y$^{21}$—O—Y$^{22}$—, —Y$^{21}$—O—, —Y$^{21}$—C(=O)—O—, —[Y$^{21}$—C(=O)—O]$_{m'}$—Y$^{22}$—, or —Y$^{21}$—O—C(=O)—Y$^{22}$—, each of Y$^{21}$ and Y$^{22}$ independently represents a divalent hydrocarbon group which may have a substituent. Examples of the divalent hydrocarbon group include the same groups as those of the "divalent hydrocarbon group which may have a substituent" exemplified above in the explanation for the divalent linking group.

$Y^{21}$ is preferably a linear aliphatic hydrocarbon group, more preferably a linear alkylene group, still more preferably a linear alkylene group having from 1 to 5 carbon atoms, and especially preferably a methylene group or an ethylene group.

$Y^{22}$ is preferably a linear or branched aliphatic hydrocarbon group, and more preferably a methylene group, an ethylene group, or an alkylmethylene group. The alkyl group in the alkylmethylene group is preferably a linear alkyl group having from 1 to 5 carbon atoms, more preferably a linear alkyl group having from 1 to 3 carbon atoms, and most preferably a methyl group.

In the group represented by the formula: —[Y$^{21}$—C(=O)—O]$_{m'}$—Y$^{22}$—, m' is an integer of from 0 to 3, preferably an integer of from 0 to 2, more preferably 0 or 1, and especially preferably 1. Namely, the group represented by the formula: —[Y$^{21}$—C(=O)—O]$_{m'}$—Y$^{22}$— is especially preferably a group represented by the formula: —Y$^{21}$—C(=O)—O—Y$^{22}$—. Above all, a group represented by the formula: —(CH$_2$)$_{a'}$—C(=O)—O—(CH$_2$)$_{b'}$— is preferable. In the formula, a' is an integer of from 1 to 10, preferably an integer of from 1 to 8, more preferably an integer of from 1 to 5, still more preferably 1 or 2, and most preferably 1. b' is an integer of from 1 to 10, preferably an integer of from 1 to 8, more preferably an integer of from 1 to 5, still more preferably 1 or 2, and most preferably 1.

In the present invention, $Ya^{21}$ is preferably a single bond, or an ester bond [—C(=O)—O—], an ether bond (—O—), a linear or branched alkylene group, or a combination thereof.

In the formula (a2-1), $Ra^{21}$ represents a lactone-containing cyclic group, a carbonate-containing cyclic group, or an —SO$_2$— containing cyclic group.

The term "lactone-containing cyclic group" refers to a cyclic group containing a ring (lactone ring) containing —O—C(=O)— in the ring skeleton thereof. The lactone ring is counted as the first ring. A lactone-containing cyclic group in which the only ring structure is the lactone ring is referred to as a monocyclic group; and a lactone-containing cyclic group containing other ring structure is called a polycyclic group regardless of the structure of the other rings. The lactone-containing cyclic group may be either a monocyclic group or a polycyclic group.

The lactone-containing cyclic group represented by $Ra^{21}$ is not particularly limited, and any group can be used.

The lactone-containing cyclic group may have a substituent. Examples of the substituent include an alkyl group, an alkoxy group, a halogen atom, a halogenated alkyl group, a hydroxyl group, —COOR", —OC(=O)R" (R" represents a hydrogen atom or an alkyl group), a hydroxyalkyl group, and a cyano group.

The alkyl group as the substituent is preferably an alkyl group having from 1 to 6 carbon atoms. The alkyl group is preferably a linear or branched alkyl group. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is especially preferable.

The alkoxy group as the substituent is preferably an alkoxy group having from 1 to 6 carbon atoms. The alkoxy group is preferably a linear or branched alkoxy group. Specifically, examples include a group in which an oxygen atom (—O—) is bonded to the alkyl group exemplified above for the alkyl group as the substituent.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

Examples of the halogenated alkyl group as the substituent include a group in which a part or all of the hydrogen atoms of the alkyl group exemplified above for the alkyl group as the substituent are substituted with the above-described halogen atom. The halogenated alkyl group is preferably a fluorinated alkyl group, and especially preferably a perfluoroalkyl group.

R" in each of —COOR" and —OC(=O)R" as described above is a hydrogen atom, or a linear, branched, or cyclic alkyl group having from 1 to 15 carbon atoms.

In the case where R" is a linear or branched alkyl group, the alkyl group has preferably from 1 to 10 carbon atoms, and more preferably from 1 to 5 carbon atoms, and R" is especially preferably a methyl group or an ethyl group.

In the case where R" is a cyclic alkyl group, the cyclic alkyl group has preferably from 3 to 15 carbon atoms, more preferably from 4 to 12 carbon atoms, and most preferably from 5 to 10 carbon atoms. Specifically, examples thereof include a group in which one or more hydrogen atoms are removed from a monocycloalkane or a polycycloalkane such as a bicycloalkalne, a tricycloalkalne, and a tetracycloalkane, each of which may or may not be substituted with a fluorine atom or a fluorinated alkyl group. More specifically, examples thereof include a group in which one or more hydrogen atoms are removed from a monocycloalkane such as cyclopentane and cyclohexane, or a polycycloalkane such as adamantane, norbornane, isobornane, tricyclodecane, and tetracyclododecane.

The hydroxyalkyl group as the substituent is preferably a hydroxyalkyl group having from 1 to 6 carbon atoms. Specifically, examples thereof include a group in which at least one of the hydrogen atoms of the alkyl group exemplified above for the alkyl group as the substituent is substituted with a hydroxyl group.

Specifically, examples thereof include groups represented by the following general formulae (a1-r-1) to (a2-r-7).

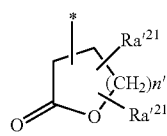
(a2-r-1)

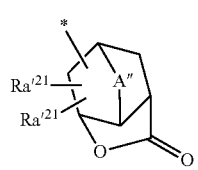
(a2-r-2)

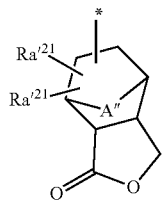
(a2-r-3)

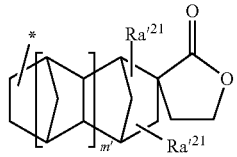
(a2-r-4)

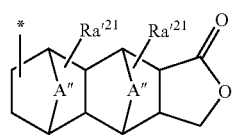
(a2-r-5)

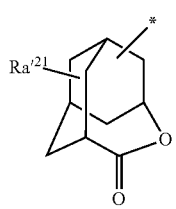
(a2-r-6)

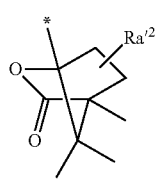
(a2-r-7)

In the foregoing formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A" represents an alkylene group having from 1 to 5 carbon atoms, which may contain an oxygen atom or a sulfur atom, an oxygen atom, or a sulfur atom; n' represents an integer of from 0 to 2; and m' is 0 or 1.

In the general formulae (a1-r-1) to (a2-r-7), A" represents an alkylene group having from 1 to 5 carbon atoms, which may contain an oxygen atom (—O—) or a sulfur atom (—S—), an oxygen atom, or a sulfur atom. The alkylene group having from 1 to 5 carbon atoms in A" is preferably a linear or branched alkylene group, and examples thereof include a methylene group, an ethylene group, an n-propylene group, and an isopropylene group. In the case where the alkylene group contains an oxygen atom or a sulfur atom, specific examples thereof include a group in which —O— or —S— intervenes at the terminal or between the carbon atoms of the alkylene group. Examples thereof include —O—CH$_2$—, —CH$_2$—O—CH$_2$—, —S—CH$_2$—, and —CH$_2$—S—CH$_2$—. A" is preferably an alkylene group having from 1 to 5 carbon atoms or —O—, more preferably an alkylene group having from 1 to 5 carbon atoms, and most preferably a methylene group. Examples of each of the alkyl group, the alkoxy group, the halogen atom, the halogenated alkyl group, —COOR", —OC(=O)R", and the hydroxyalkyl group in Ra'²¹ include the same groups as those exemplified above for the alkyl group, the alkoxy group, the halogen atom, the halogenated alkyl group, —COOR", —OC(=O)R", and the hydroxyalkyl group as the substituent which the —SO₂— containing cyclic group may have.

Specific examples of the groups represented by the general formulae (a1-r-1) to (a2-r-7) are given below.

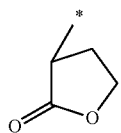
(r-Ic-1-1)

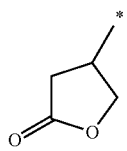
(r-Ic-1-2)

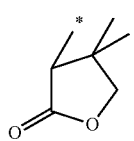
(r-Ic-1-3)

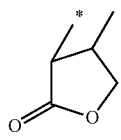
(r-Ic-1-4)

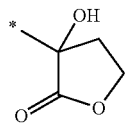
(r-Ic-1-5)

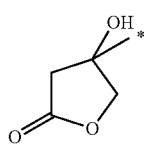
(r-Ic-1-6)

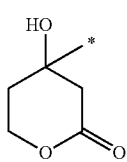
(r-Ic-1-7)

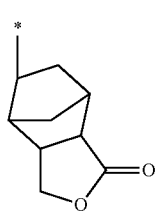
(r-Ic-3-1)

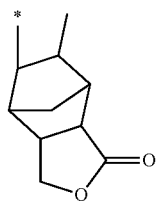
(r-Ic-3-2)

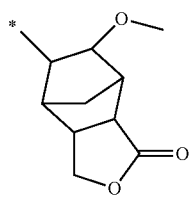
(r-Ic-3-3)

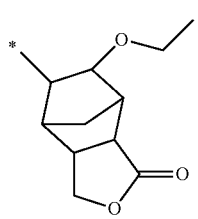
(r-Ic-3-4)

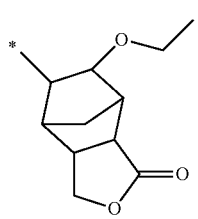
(r-Ic-3-5)

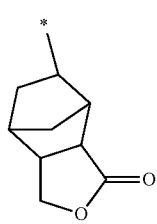
(r-Ic-2-1)

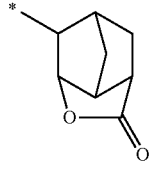
(r-Ic-2-2)

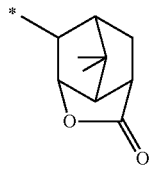
(r-Ic-2-3)

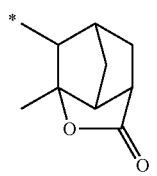
(r-Ic-2-4)

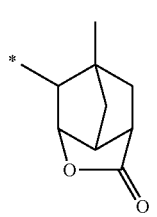
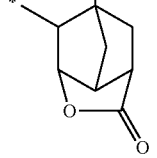

-continued
(r-Ic-2-5)
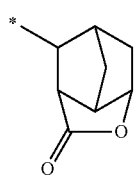
(r-Ic-2-6)
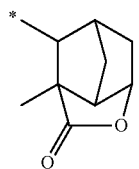
(r-Ic-2-7)
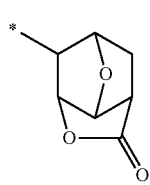
(r-Ic-2-8)
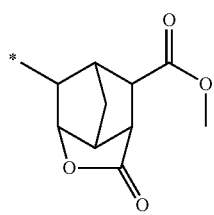
(r-Ic-2-9)
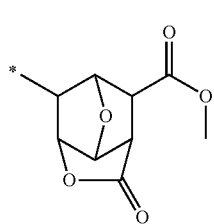
(r-Ic-2-10)
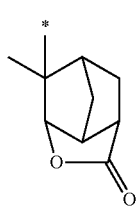
(r-Ic-2-11)
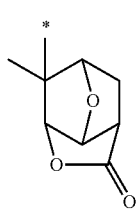
(r-Ic-2-12)
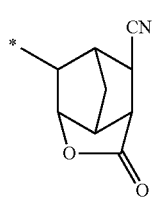
-continued
(r-Ic-2-13)
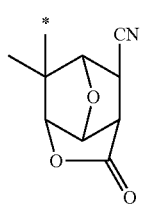
(r-Ic-4-1)
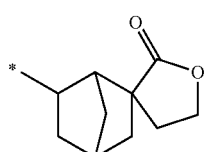
(r-Ic-4-2)
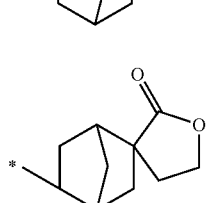
(r-Ic-4-3)
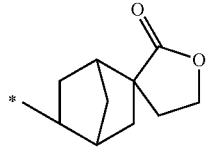
(r-Ic-4-4)
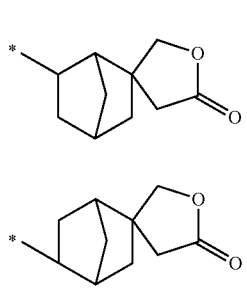
(r-Ic-4-5)
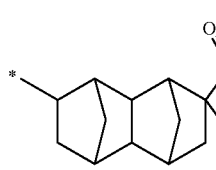
(r-Ic-4-6)
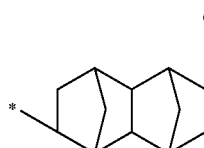
(r-Ic-4-7)
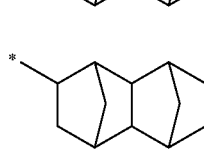
(r-Ic-4-8)
(r-Ic-4-9)

-continued (r-Ic-5-1)
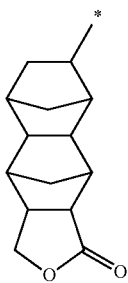

(r-Ic-5-2)
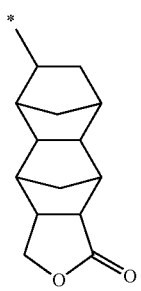

(r-Ic-5-3)
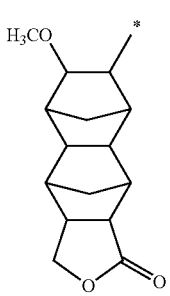

(r-Ic-5-4)
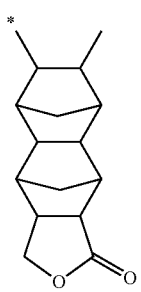

(r-Ic-6-1)
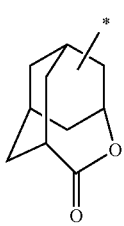

(r-Ic-7-1)
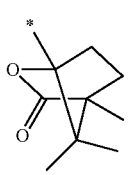

Among those described above, the lactone-containing cyclic group is preferably the group represented by the general formula (a1-r-1), more preferably any one of the groups represented by the chemical formulae (r-1c-1-1) to (r-1c-1-7), and still more preferably the group represented by the chemical formula (r-1c-1-1).

The term "carbonate-containing cyclic group" refers to a cyclic group containing a ring (carbonate ring) containing —O—C(=O)—O— in the ring skeleton thereof. The carbonate ring is counted as the first ring. A carbonate-containing cyclic group in which the only ring structure is the carbonate ring is referred to as a monocyclic group; and a carbonate-containing cyclic group containing other ring structure is called a polycyclic group regardless of the structure of the other rings. The carbonate-containing cyclic group may be either a monocyclic group or a polycyclic group.

The carbonate ring-containing cyclic group represented by $Ra^{21}$ is not particularly limited, and any group can be used. Specifically, examples thereof include groups represented by the following general formulae (a1-r-1) to (ax3-r-3).

(ax3-r-1)
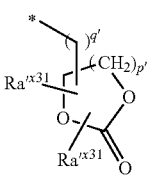

(ax3-r-2)
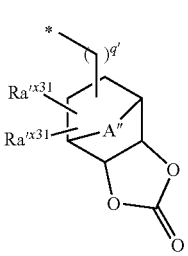

(ax3-r-3)
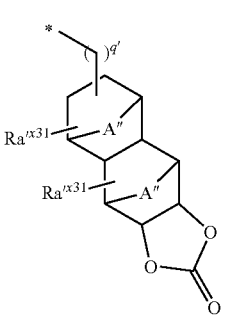

In the foregoing formulae, each $Ra'^{x31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A" represents an alkylene group having from 1 to 5 carbon atoms, which may contain an oxygen atom or a sulfur atom, an oxygen atom, or a sulfur atom; q' is 0 or 1; and * represents a bond.

A" in the general formulae (a1-r-1) to (ax3-r-3) is the same as A" in the general formulae (a1-r-1) to (a2-r-7). In addition, in the general formulae (a1-r-1) to (ax3-r-3), the hydrogen atom, the alkyl group, the alkoxy group, the halogen atom, the halogenated alkyl group, the hydroxyl group, —COOR", —OC(=O)R", the hydroxyalkyl group, or the cyano group represented by $Ra'^{x31}$ is the same as that in $Ra'^{21}$ in the general formulae (a1-r-1) to (a2-r-7).

Specific examples of the groups represented by the general formulae (ax3-r-1) to (ax3-r-3) are given below.
(r-cr-1-1)
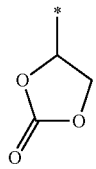
(r-cr-1-2)
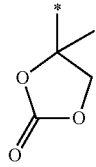
(r-cr-1-3)
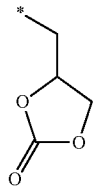
(r-cr-1-4)
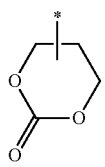
(r-cr-1-5)
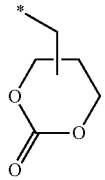
(r-cr-1-6)
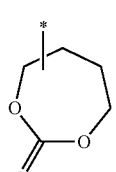
(r-cr-1-6)
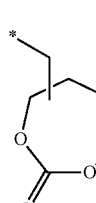
(r-cr-2-1)
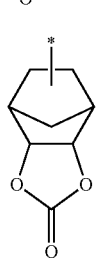
(r-cr-2-2)
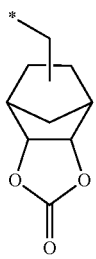
(r-cr-2-3)
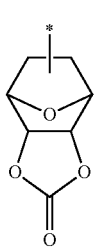
(r-cr-2-4)
(r-cr-3-1)
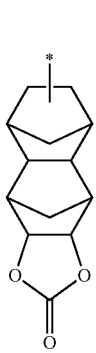
(r-cr-3-2)
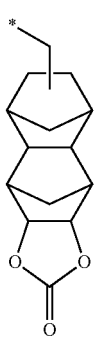

-continued

(r-cr-3-3)

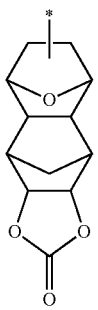

(r-cr-3-4)

(r-cr-3-5)

The term "—SO$_2$— containing cyclic group" represented by Ra$^{21}$ refers to a cyclic group containing a ring containing —SO$_2$— in the ring skeleton thereof, and specifically, it is a cyclic group in which the sulfur atom (S) in —SO$_2$— forms a part of the ring skeleton of the cyclic group. The ring containing —SO$_2$— in the ring skeleton thereof is counted as the first ring. An —SO$_2$— containing cyclic group in which the only ring structure is the —SO$_2$— containing ring is referred to as a monocyclic group; and an —SO$_2$— containing cyclic group containing other ring structure is called a polycyclic group regardless of the structure of the other rings. The —SO$_2$— containing cyclic group may be either a monocyclic group or a polycyclic group.

The —SO$_2$— containing cyclic group is especially preferably a cyclic group containing —O—SO$_2$— in the ring skeleton thereof, namely a cyclic ring containing a sultone ring in which —O—S— in —O—SO$_2$— forms a part of the ring skeleton.

The —SO$_2$— containing cyclic group may have a substituent. Examples of the substituent include an alkyl group, an alkoxy group, a halogen atom, a halogenated alkyl group, a hydroxyl group, —COOR", —OC(=O)R" (R" represents a hydrogen atom or an alkyl group), a hydroxyalkyl group, and a cyano group.

The alkyl group as the substituent is preferably an alkyl group having from 1 to 6 carbon atoms. The alkyl group is preferably a linear or branched alkyl group. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is especially preferable.

The alkoxy group as the substituent is preferably an alkoxy group having from 1 to 6 carbon atoms. The alkoxy group is preferably a linear or branched alkoxy group. Specifically, examples include a group in which an oxygen atom (—O—) is bonded to the alkyl group exemplified above for the alkyl group as the substituent.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

Examples of the halogenated alkyl group as the substituent include a group in which a part or all of the hydrogen atoms of the alkyl group exemplified above for the alkyl group as the substituent are substituted with the above-described halogen atom. The halogenated alkyl group is preferably a fluorinated alkyl group, and especially preferably a perfluoroalkyl group.

R" in each of —COOR" and —OC(=O)R" as described above is a hydrogen atom, or a linear, branched, or cyclic alkyl group having from 1 to 15 carbon atoms.

In the case where R" is a linear or branched alkyl group, the alkyl group has preferably from 1 to 10 carbon atoms, and more preferably from 1 to 5 carbon atoms, and R" is especially preferably a methyl group or an ethyl group.

In the case where R" is a cyclic alkyl group, the cyclic alkyl group has preferably from 3 to 15 carbon atoms, more preferably from 4 to 12 carbon atoms, and most preferably from 5 to 10 carbon atoms. Specifically, examples thereof include a group in which one or more hydrogen atoms are removed from a monocycloalkane or a polycycloalkane such as a bicycloalkalne, a tricycloalkalne, and a tetracycloalkane, each of which may or may not be substituted with a fluorine atom or a fluorinated alkyl group. More specifically, examples thereof include a group in which one or more hydrogen atoms are removed from a monocycloalkane such as cyclopentane and cyclohexane, or a polycycloalkane such as adamantane, norbornane, isobornane, tricyclodecane, and tetracyclododecane.

The hydroxyalkyl group as the substituent is preferably a hydroxyalkyl group having from 1 to 6 carbon atoms. Specifically, examples thereof include a group in which at least one of the hydrogen atoms of the alkyl group exemplified above for the alkyl group as the substituent is substituted with a hydroxyl group.

Specifically, examples thereof include groups represented by the following general formulae (a5-r-1) to (a5-r-4).

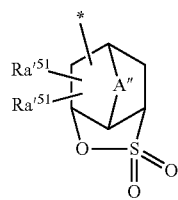

(a5-r-1)

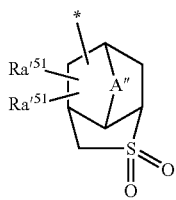 (a5-r-2)

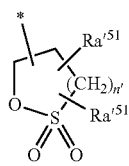 (a5-r-3)

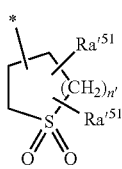 (a5-r-4)

In the foregoing formulae, each $Ra'^{51}$ independently represents a hydrogen atom, an alkyl group, an alkoxy group, a halogen atom, a halogenated alkyl group, a hydroxyl group, —COOR″, —OC(=O)R″, a hydroxyalkyl group, or a cyano group; R″ represents a hydrogen atom or an alkyl group; A″ represents an alkylene group having from 1 to 5 carbon atoms, which may contain an oxygen atom or a sulfur atom, an oxygen atom, or a sulfur atom; and n' represents an integer of 0 to 2.

In the general formulae (a5-r-1) to (a5-r-4), A″ is the same as A″ in the general formulae (a21-r-1) to (a2-r-7). The alkyl group, the alkoxy group, the halogen atom, the halogenated alkyl group, —COOR″, —OC(=O)R″, or the hydroxyalkyl group in $Ra'^{51}$ is the same as that in $Ra'^{21}$ in the general formulae (a2-r-1) to (a2-r-7).

Specific examples of the groups represented by the general formulae (a5-r-1) to (a5-r-4) are given below. In the following formulae, "Ac" represents an acetyl group.

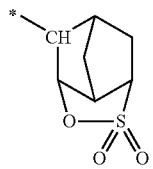 (r-sI-1-1)

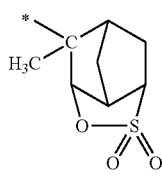 (r-sI-1-2)

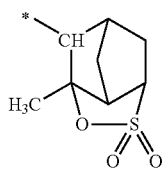 (r-sI-1-3)

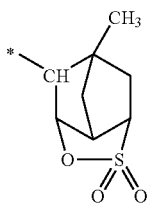 (r-sI-1-4)

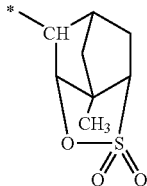 (r-sI-1-5)

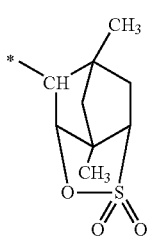 (r-sI-1-6)

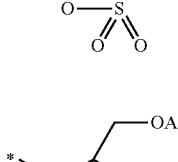 (r-sI-1-7)

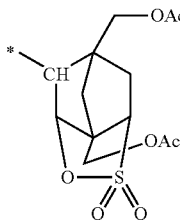 (r-sI-1-8)

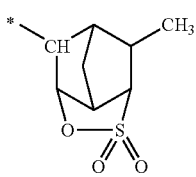 (r-sI-1-9)

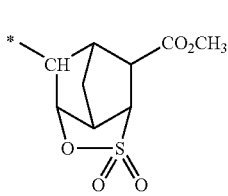 (r-sI-1-10)

-continued
(r-sI-1-11)
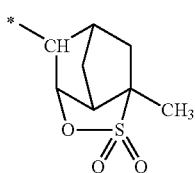
(r-sI-1-12)
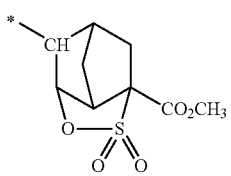
(r-sI-1-13)
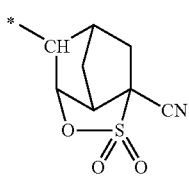
(r-sI-1-14)
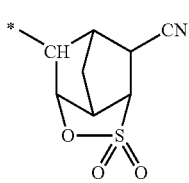
(r-sI-1-15)
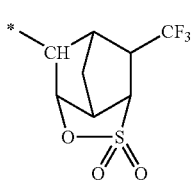
(r-sI-1-16)
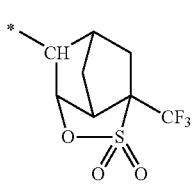
(r-sI-1-17)
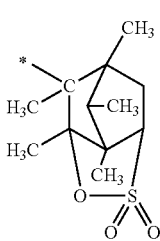
(r-sI-1-18)
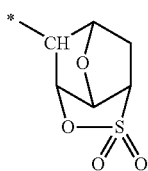
-continued
(r-sI-1-19)
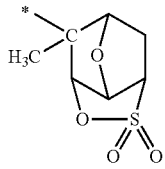
(r-sI-1-20)
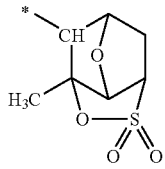
(r-sI-1-21)
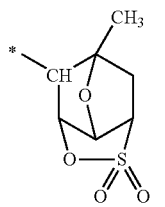
(r-sI-1-22)
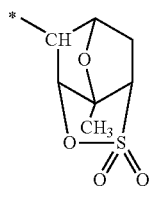
(r-sI-1-23)
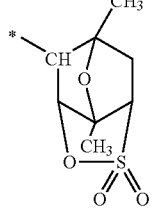
(r-sI-1-24)
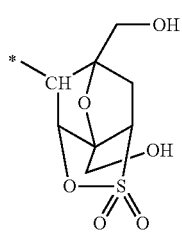
(r-sI-1-25)
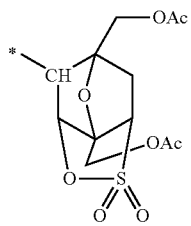
(r-sI-1-26)
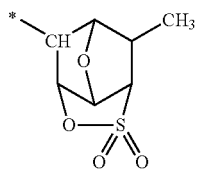

-continued (r-sI-1-27) 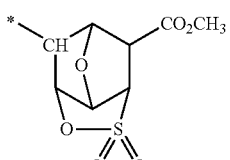

(r-sI-1-28) 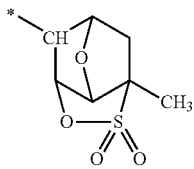

(r-sI-1-29) 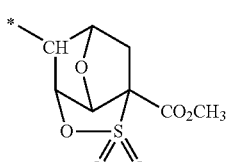

(r-sI-1-30) 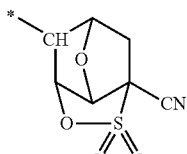

(r-sI-1-31) 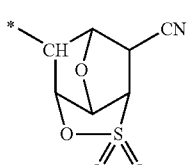

(r-sI-1-32) 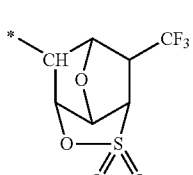

(r-sI-1-33) 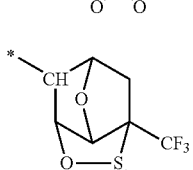

(r-sI-2-1) 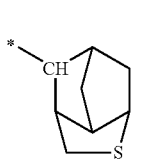

(r-sI-2-2) 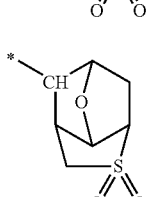

(r-sI-3-1) 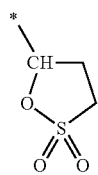

(r-sI-4-1) 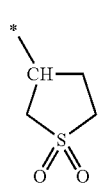

Among those described above, the —$SO_2$— containing cyclic group is preferably the group represented by the general formula (a5-r-1), and more preferably the group represented by the chemical formula (r-s1-1-1) or (r-s1-1-18).

The constituent unit (a2) which the resin component (A1) has may be either one kind or two or more kinds.

In the case where the resin component (A1) has the constituent unit (a2), a proportion of the constituent unit (a2) is preferably from 1 to 80% by mole, more preferably from 10 to 70% by mole, still more preferably from 10 to 65% by mole, and especially preferably from 10 to 60% by mole, relative to the total sum of all of the constituent units constituting the component (A1). When the proportion of the constituent unit (a2) in the resin component (A1) is the lower limit value or more, the effects to be brought due to the fact that the constituent unit (a2) is contained are sufficiently obtained. When the proportion of the constituent unit (a2) in the resin component (A1) is not more than the upper limit value, a balance with other constituent units can be taken, and lithography properties such as DOF and CDU and the pattern shape become satisfactory.

(Constituent Unit (a3))

The resin component (A1) may have a constituent unit (a3). The constituent unit (a3) is a constituent unit containing a polar group-containing aliphatic hydrocarbon group (however, those corresponding to the constituent units ((a1), and (a2) are excluded).

In view of the fact that the component (A1) contains the constituent unit (a3), it may be considered that the hydrophilicity of the component (A) increases, thereby contributing to an enhancement of the resolution.

Examples of the polar group include a hydroxyl group, a cyano group, a carboxy group, and a hydroxyalkyl group in which a part of hydrogen atoms of an alkyl group is substituted with a fluorine atom, with a hydroxyl group being especially preferable.

Examples of the aliphatic hydrocarbon group include a linear or branched hydrocarbon group having from 1 to 10 carbon atoms (preferably an alkylene group) and a cyclic aliphatic hydrocarbon group (cyclic group). The cyclic group may be either a monocyclic group or a polycyclic group. For example, the cyclic group can be selected appropriately from a large number of groups proposed for resins of resist compositions for ArF excimer lasers. The cyclic group is preferably a polycyclic group, and more preferably one having from 7 to 30 carbon atoms.

Above all, constituent units derived from an acrylic ester containing an aliphatic polycyclic group containing a hydroxyl group, a cyano group, a carboxy group, or a hydroxyalkyl group in which a part of hydrogen atoms of an alkyl group is substituted with a fluorine atom, are more preferable. Examples of the polycyclic group include a group in which two or more hydrogen atoms are removed from a bicycloalkane, a tricycloalkane, a tetracycloalkane, or the like. Specifically, examples thereof include a group in which two or more hydrogen atoms are removed from a polycycloalkane such as adamantane, norbornane, isobornane, tricyclodecane, and tetracyclododecane. Of these polycyclic groups, a group in which two or more hydrogen atoms are removed from adamantane, a group in which two or more hydrogen atoms are removed from norbornane, or a group in which two or more hydrogen atoms are removed from tetracyclododecane is industrially preferable.

The constituent unit (a3) is not particularly limited so long as it is one containing a polar group-containing aliphatic hydrocarbon group, and any constituent unit can be used.

The constituent unit (a3) is preferably a constituent unit containing a polar group-containing aliphatic hydrocarbon group, which is a constituent unit derived from an acrylic ester in which the hydrogen atom bonded to the carbon atom at the α-position may be substituted with a substituent.

When the hydrocarbon group in the polar group-containing aliphatic hydrocarbon group is a linear or branched hydrocarbon group having from 1 to 10 carbon atoms, the constituent unit (a3) is preferably a constituent unit derived from a hydroxyethyl ester of acrylic acid; and when the hydrocarbon group is a polycyclic group, preferred examples thereof include a constituent unit represented by the following formula (a3-1), a constituent unit represented by the following formula (a3-2), and a constituent unit represented by the following formula (a3-3).

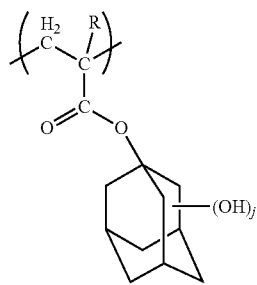

(a3-1)

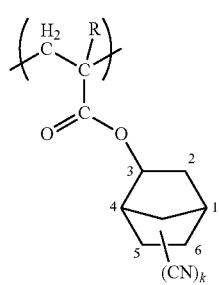

(a3-2)

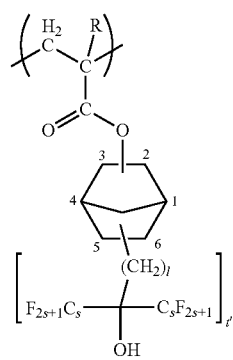

(a3-3)

In the foregoing formulae, R is the same as that described above; j represents an integer of from 1 to 3; k represents an integer of from 1 to 3; t' represents an integer of from 1 to 3; l represents an integer of from 1 to 5; and s represents an integer of from 1 to 3.

In the formula (a3-1), j is preferably 1 or 2, and more preferably 1. In the case where j is 2, the hydroxyl group is preferably bonded to the 3-position and 5-position of the adamantyl group, respectively. In the case where j is 1, the hydroxyl group is preferably bonded to the 3-position of the adamantyl group.

j is preferably 1, and in particular, it is preferable that the hydroxyl group is bonded to the 3-position of the adamantyl group.

In the formula (a3-2), k is preferably 1; and the cyano group is preferably bonded at the 5-position or 6-position of the norbornyl group.

In the formula (a3-3), t' is preferably 1; l is preferably 1; and s is preferably 1. In the formula (a3-3), it is preferable that the 2-norbornyl group or 3-norbonnyl group is bonded to the terminal of the carboxy group of acrylic acid. The fluorinated alkyl alcohol is preferably bonded to the 5-position or 6-position of the norbornyl group.

The constituent unit (a3) which the resin component (A1) contains may be either one kind or two or more kinds.

A proportion of the constituent unit (a3) in the resin component (A1) is preferably from 5 to 50% by mole, more preferably from 5 to 40% by mole, and still more preferably from 5 to 25% by mole, relative to the total sum of all of the constituent units constituting the resin component (A1).

When the proportion of the constituent unit (a3) is the lower limit value or more, the effects to be brought due to the fact that the constituent unit (a3) is contained are sufficiently obtained. When the proportion of the constituent unit (a3) is not more than the upper limit value, a balance with other constituent units is liable to be taken.

(Constituent Unit (a4))

If desired, the resin component (A1) may further have a constituent unit (a4) containing an acid non-dissociable cyclic group. When the component (A1) has the constituent unit (a4), the dry etching resistance of a resist pattern to be formed is enhanced. In addition, the hydrophobicity of the component (A1) increases. It may be considered that in particular, in the case of organic solvent development, the enhancement of the hydrophobicity contributes to an enhancement of resolution, a resist pattern shape, or the like.

The "acid non-dissociable cyclic group" in the constituent unit (a4) is a cyclic group which at the time of the generation of an acid from the component (B) upon exposure, remains in the constituent unit as it is without being dissociated even by the action of the acid.

The constituent unit (a4) is preferably a constituent unit derived from, for example, an acrylic ester containing an acid non-dissociable aliphatic cyclic group. Examples of the cyclic group include the same groups as those exemplified above in the case of the constituent unit (a1), and a large number of groups which have hitherto been known as the groups useful for the resin components of resist compositions for ArF excimer laser, for KrF excimer laser (preferably for ArF excimer laser), or the like can be used.

In particular, the constituent unit (a4) in which the cyclic group is at least one member selected from a tricyclodecyl group, an adamantyl group, a tetracyclododecyl group, an isobornyl group, and a norbornyl group is preferable from the standpoint of easiness of industrial availability. Such a polyacrylic ring may have a linear or branched alkyl group having from 1 to 5 carbon atoms as a substituent.

Specifically, examples of the constituent unit (a4) include those having structures represented by the following general formulae (a4-1) to (a4-7).

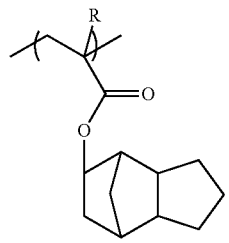
(a4-1)

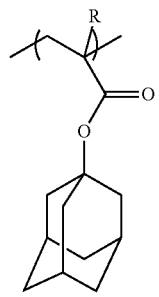
(a4-2)

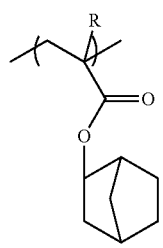
(a4-3)

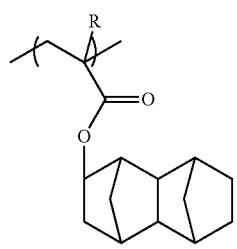
(a4-4)

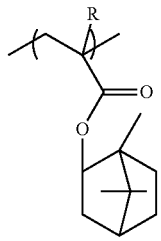
(a4-5)

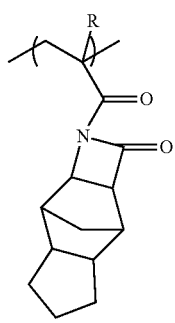
(a4-6)

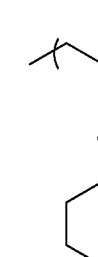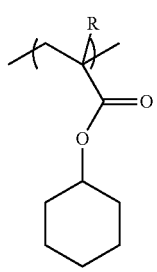
(a4-7)

In the foregoing formulae, R is the same as that described above.

The constituent unit (a4) which the resin component (A1) contains may be either one kind or two or more kinds.

At the time of incorporating the constituent unit (a4) into the resin component (A1), a proportion of the constituent unit (a4) is preferably from 1 to 30% by mole, and more preferably from 10 to 20% by mole, relative to the total sum of all of the constituent units constituting the component (A1).

The component (A1) is preferably a copolymer having at least the constituent unit (a1), more preferably a copolymer having, in addition to the constituent unit (a1), the constituent unit (a2) or (a3), and still more preferably a copolymer having the constituent units (a1), (a2), and (a3).

The component (A1) can be obtained by polymerizing monomers from which the respective constituent units are derived by means of known radical polymerization using a radical polymerization initiator such as azobisisobutyronitrile (AIBN) and dimethyl azobisisobutyrate, or the like.

In addition, at the time of the polymerization, for example, by jointly using a chain transfer agent such as HS—$CH_2$—$CH_2$—$CH_2$—$C(CF_3)_2$—OH, a —$C(CF_3)_2$—OH group may be introduced into the terminal. A copolymer into which a hydroxyalkyl group in which a part of the hydrogen atoms of the alkyl group is substituted with a fluorine atom is introduced in this way is effective for decreasing development defects or decreasing LER (line edge roughness; nonuniform irregularities of the line side wall).

Though a mass average molecular weight (Mw) of the component (A1) (as reduced into polystyrene by means of gel permeation chromatography) is not particularly limited, it is preferably from 1,000 to 50,000, more preferably from 1,500 to 30,000, and most preferably from 2,500 to 20,000. When the mass average molecular weight of the component (A1) is not more than the upper limit value of this range, a sufficient solubility in a resist solvent for the use as a resist is exhibited, whereas when it is the lower limit value of this range or more, the dry etching resistance and the cross-sectional resist pattern shape are satisfactory.

In addition, though a degree of dispersion (Mw/Mn) of the component (A1) is not particularly limited, it is preferably from 1.0 to 5.0, more preferably from 1.0 to 3.0, and most preferably from 1.2 to 2.5. Incidentally, Mn refers to a number average molecular weight.

The resin component (A1) may be used solely or in combination of two or more kinds thereof.

A proportion of the resin component (A1) in the base material component (A) is preferably 25% by mass or more, more preferably 50% by mass or more, and still more preferably 75% by mass or more, relative to the total mass of the base material component (A), and it may be even 100% by mass. When the proportion of the resin component (A1) in the base material component (A) is 25% by mass or more, lithography properties such as MEF, circularity, and a decrease of roughness are more enhanced.

[Component (A2)]

The resist composition according to the present invention may contain, as the component (A), a base material component whose polarity increases by the action of an acid, which does not fall under the definition of the component (A1) (the subject component will be hereinafter referred to as "component (A2)").

The component (A2) is not particularly limited, and it may be arbitrarily selected and used among a large number of materials which have hitherto been known as the base material components for the chemically amplified resist compositions (for example, base resins for ArF excimer laser, for KrF excimer laser (preferably for ArF excimer laser), or the like). Examples of the base resin for ArF excimer laser include a resin having the constituent unit (a1) as an essential unit and further having the constituent units (a2) to (a4) optionally.

The component (A2) may be used solely or in combination of two or more kinds thereof.

In the resist composition according to the present invention, the component (A) may be used solely or in combination of two or more kinds thereof.

In the resist composition according to the present invention, the content of the component (A) may be adjusted in conformity with the thickness of the resist film to be formed, or the like.

<Acid Generator Component; Component (B)>

The resist composition according to the present invention contains an acid generator component (B) which generates an acid upon exposure (hereinafter referred to as "component (B)"). Furthermore, the acid generator component (B) contains an acid generator (B1) composed of a compound having nitrogen atoms having proton acceptor properties and sites capable of generating an acid upon exposure in the same molecule thereof, with the number of the sites being larger than the number of the nitrogen atoms.

[Component (B1)]

The nitrogen atom having proton acceptor properties, which the compound constituting the acid generator (B1) has, means a nitrogen atom having a lone pair (unshared electron pair) capable of trapping (accepting) a proton released by means of decomposition of a part of the compound upon exposure, or a proton released in the surroundings of the compound upon exposure, and bonding it. Though the nitrogen atom in the compound is not particularly limited so long as it has a lone pair capable of trapping a proton, for example, it is preferably a nitrogen atom constituting each of structures of the following formulae (y1) to (y5).

On the other hand, examples of the nitrogen atom not having proton acceptor properties include a nitrogen atom constituting an imide or an amide. In general, since the nitrogen atom constituting an imide or an amide is resonant with a double bond of the carbonyl group, the lone pair of the nitrogen atom hardly traps a proton.

Examples of a functional group containing a nitrogen atom having proton acceptor properties include those having at least one of the structures represented by the following formulae (y1) to (y5). Here, though a structure in which the carbon atom constituting the formula (y4) forms a double bond together with a nitrogen atom not shown in the formula (y4) is identical with that in the formula (y3), in that case, it should be construed that the subject structure is the formula (y3)

The symbol "*" in each of the formulae is preferably a hydrogen atom, a carbon atom, a nitrogen atom, or an oxygen atom, more preferably a carbon atom or a nitrogen atom, and still more preferably a carbon atom.

(y1)

(y2)

(y3)

(y4)

(y5)

Examples of the functional group containing one of the formula (y1) include the following formulae (y1-1) to (y1-3). However, with respect to the formulae (y1-2) and (y1-3), the bond on the ring skeleton is omitted from the description. Namely, any hydrogen atom bonded to a carbon atom constituting the ring skeleton may be removed to bring a bond on the carbon atom.

(y1-1)

(y1-2)

(y1-3)

In the foregoing formulae, l represents an integer of 1 or 2.

Examples of the functional group containing two or more of the formula (y1) include the following formulae (y1-4) to (y1-6). In the formulae (y1-4) to (y1-6), each $V'^1$ independently represents a linear, branched, or cyclic alkylene group, and $V'^1$ is preferably a linear or branched alkylene group having from 1 to 10 carbon atoms, more preferably a linear alkylene group having from 1 to 5 carbon atoms, and still more preferably a linear alkylene group having from 2 to 3 carbon atoms. Specific examples of these formulae include the following formulae (y1-r-1), (y1-4-2), (y1-5-1), and (y1-6-1). However, with respect to the formula (y1-r-2), the bond on the ring skeleton is omitted from the description.

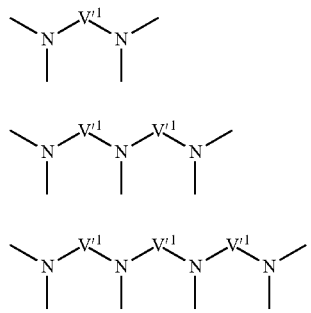

In the foregoing formulae, each $V'^1$ independently represents an alkylene group.

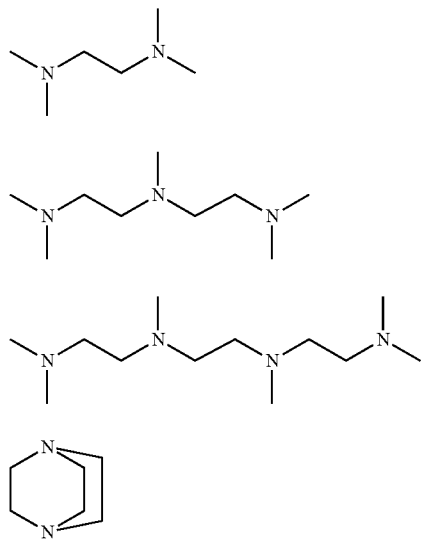

Examples of the functional group containing one or two of the formula (y2) and the functional group containing one of the formulae (y3) to (y5) include the following formulae (y2-1) to (y2-3), (y3-1) to (y3-3), (y4-1), and (y5-1). Incidentally, the formula (y2-3) is an example of the functional group containing one of each of the formulae (y2) and (y4). However, the bond on the ring skeleton of each of the formulae is omitted from the description.

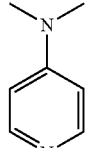
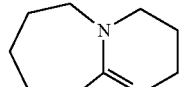
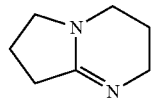
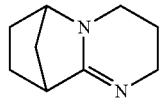
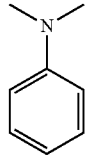
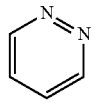

The site capable of generating an acid upon exposure, which the compound constituting the acid generator (B1) has, means a site capable of generating or releasing a proton upon exposure.

The site in the compound is preferably a group containing a sulfonic acid anion, a carbo anion, a carboxylic acid anion, an imide anion, or a sulfonyl methide anion, and more preferably a group represented by any one of the following formulae (r-an-1) to (r-an-3).

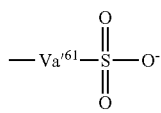
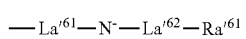
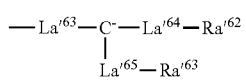

In the formulae (r-an-1) to (r-an-3), $Va'^{61}$ represents a divalent hydrocarbon group having a fluorine atom; each of $La'^{61}$ to $La'^{62}$ represents $—SO_2—$; each of $La'^{63}$ to $La'^{65}$ represents $—SO_2—$ or a single bond; and each of $Ra'^{61}$ to $Ra'^{63}$ independently represents a hydrocarbon group.

The divalent hydrocarbon group represented by $Va'^{61}$ is preferably the same group as that exemplified above as the divalent hydrocarbon group for $Ya^{21}$ in the general formula (a2), more preferably an alkylene group having from 1 to 5 carbon atoms, and still more preferably a methylene group or an ethylene group. It is preferable that a part or all of the hydrogen atoms of the hydrocarbon group constituting $Va'^{61}$ are substituted with a fluorine atom, and it is more preferable that from 30 to 100% of the hydrogen atoms of the hydrocarbon group are substituted with a fluorine atom. Above all, a (per) fluoroalkylene group in which a part or all of the hydrogen atoms of the alkylene group exemplified as the divalent hydrocarbon group represented by $Ya^{21}$ are substituted with a fluorine atom is especially preferable.

Examples of the hydrocarbon group represented by $Ra'^{61}$ to $Ra'^{63}$ include a monovalent hydrocarbon group in which one of the bonds of the same group as that exemplified above as the divalent hydrocarbon group for $Ya^{21}$ in the general formula (a2) is bonded to the hydrogen atom. It is preferable that a part or all of the hydrogen atoms of the hydrocarbon group constituting each of $Ra'^{61}$ to $Ra'^{63}$ are substituted with a fluorine atom, and it is more preferable that from 30 to 100% of the hydrogen atoms of the hydrocarbon group are substituted with a fluorine atom. Above all, a (per)fluoroalkyl group in which all of the hydrogen atoms bonded to a group in which the alkylene group having from 1 to 10 carbon atoms as exemplified above as the divalent hydrocarbon group for $Ya^{21}$ is converted to a monovalent alkyl group are substituted with a fluorine atom is especially preferable.

Specific examples of the groups represented by the formulae (r-an-1) to (r-an-3) are given below.

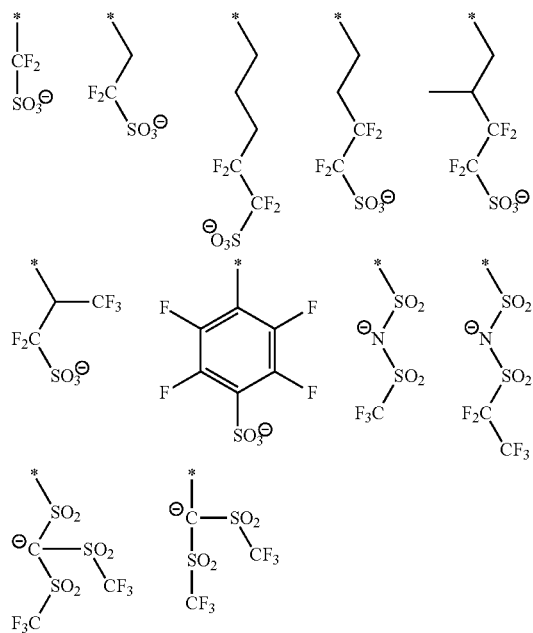

In the compound constituting the acid generator (B1), the number of the sites capable of generating an acid upon exposure is larger than the number of the nitrogen atoms having proton acceptor properties by 1 or more, preferably from 1 to 5, more preferably from 1 to 3, and still more preferably 1 or 2.

When the number of the sites is larger than the number of the nitrogen atoms within the above-described numerical value range, when the compound is sufficiently exposed, an acid is generated, whereas when the exposure is insufficient, an acid is hardly generated, or an acid is hardly diffused into the resist film. Thus, the contrast in acid generation concentration between exposed areas and unexposed areas increases, and a sufficient difference in development easiness between exposed areas and unexposed areas can be exhibited, whereby the lithography properties such as LWR become more excellent. In addition, in the unexposed areas, the nitrogen atom having proton acceptor properties may function as a quencher of an acid, so that it traps an unnecessary acid which has been diffused into the unexposed areas. Thus, the lithography properties such as LWR become more excellent.

Conventionally, a component having acid-generating ability which changes the solubility of the base material component in a developing solution and a component having a function to trap the unnecessary acid in the unexposed areas were individually added in the resist composition and adjusted, and therefore, there was involved a problem in enhancing the lithography properties such as LWR due to an influence of nonuniform distribution of the respective components in the resist film. However, since the component (B1) according to the present invention is an acid generator having the both functions (the function to generate an acid upon exposure and the function to trap the unnecessary acid) in the same molecule thereof, it may be considered that the uniformity of distribution in the resist film may be enhanced, and it may be considered that the lithography properties such as LWR are enhanced.

Incidentally, it may be considered that when the nitrogen atom having proton acceptor properties traps a proton released upon exposure, the proton acceptor properties decrease or disappear, or the group containing the nitrogen atom changes into an acidic group.

In the compound constituting the acid generator (B1), the site capable of generating an acid upon exposure and the nitrogen atom having proton acceptor properties are contained in the same molecule thereof. Here, it is preferable that the compound is a salt composed of a cation and an anion, and it is more preferable that the site and the nitrogen atom are contained in the same molecule constituting the anion of the salt.

Preferred examples of the compound include a salt represented by the following general formula (b1-1).

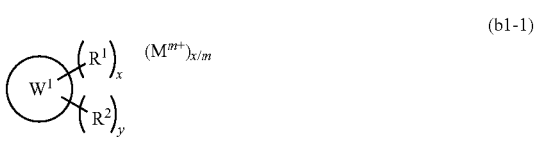

(b1-1)

In the formula (b1-1),
$R^1$ represents a group having an anion site capable of generating an acid upon exposure;
$R^2$ represents a hydrogen atom or a substituent not having the anion site;
$W^1$ represents a z-valent functional group containing n nitrogen atoms having proton acceptor properties;
$z=(x+y)$, $(n+1) \leq x \leq z$, and $0 \leq y \leq (z-x)$; and
$M^{m+}$ represents an m-valent organic cation.

The general formula (b1-1) is preferably a salt represented by the following general formula (b1-2).

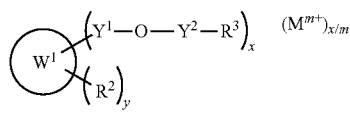

(b1-2)

In the formula (b1-2), each of $Y^1$ and $Y^2$ independently represents a single bond or a divalent linking group;

$R^3$ represents an anion group represented by any one of the formulae (r-an-1) to (r-an-3);

$R^2$ represents a hydrogen atom or a substituent not having the anion site;

$W^1$ represents a z-valent functional group containing n nitrogen atoms having proton acceptor properties;

$z=(x+y)$, $(n+1)\leq x \leq z$, and $0\leq y \leq (z-x)$; and $M^{m+}$ represents an m-valent organic cation.

{Anion Moiety of the Formulae (b1-1) and (b1-2)}

In the formula (b1-1), suitable examples of the anion site capable of generating an acid upon exposure, which $R^1$ has, include the functional groups represented by the formulae (r-an-1) to (r-an-3). Above all, the functional group represented by the formula (r-an-1) is more preferable. Here, it is preferable that $R^1$ has the one of the above-described anion moiety (anion group).

In addition, in the formula (b1-2), $R^3$ is preferably the anion group represented by the formula (r-an-1).

In the formulae (b1-1) and (b1-2), $R^2$ represents a hydrogen atom or a substituent not having the above-described anion site. The substituent is preferably an organic group, and more preferably a hydrocarbon group having from 1 to 20 carbon atoms, which may have a substituent. The hydrocarbon group may be any of a linear hydrocarbon group, a branched hydrocarbon group, or a cyclic hydrocarbon group, and it may be either an aliphatic hydrocarbon group or an aromatic hydrocarbon group.

In the formulae (b1-1) and (b1-2), $W^1$ is preferably a functional group containing at least one of the structures represented by the formulae (y1) to (y5), and more preferably a group containing at least one of the functional groups represented by the formulae (y1-1) to (y1-6), (y1-4-1), (y1-4-2), (y1-5-1), (y1-6-1), (y2-1) to (y2-3), (y3-1) to (y3-3), (y4-1), and (y5-1).

In the formula (b1-1), z which represents the valence of $W^1$ and n which is the number of nitrogen atoms having proton acceptor properties, which $W^1$ contains, have the relations of $z=(x+y)$, $(n+1)\leq x \leq z$, and $0\leq y \leq (z-x)$. Here, x is preferably from 2 to 6, and more preferably from 2 to 4. In addition, (n+1) is preferably equal to x or smaller than x by from 1 to 2, and more preferably equal to x or smaller than x by 1. In addition, y is preferably 0 or 1.

In the formula (b1-2), each of $Y^1$ and $Y^2$ independently represents a single bond or a divalent linking group. Examples of the divalent linking group include the same groups as those exemplified above for $Ya^{21}$ in the formula (a2-1). Each of $Y^1$ and $Y^2$ is preferably a divalent linking group containing a hetero atom. Above all, a divalent aliphatic hydrocarbon group having from 1 to 10 carbon atoms; a linking group containing an oxygen atom, such as —O—, —C(=O)—O—, —C(=O)—, and —O—C(=O)—O—; and a linking group composed of a combination of these groups are more preferable. However, the case where in "—$Y^1$—O—" and "—O—$Y^2$—", oxygen atoms are adjacent and bonded to each other is excluded.

In the formula (b1-2), each of $Y^1$ and $Y^2$ is preferably a single bond, a divalent aliphatic hydrocarbon group having from 1 to 10 carbon atoms, —C(=O)—, or a linking group composed of a combination of these groups.

Examples of a molecule constituting the anion in the salt represented by the formula (b1-1) include the following (b1-1-1) to (b1-1-13).

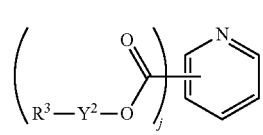

(b1-1-1)

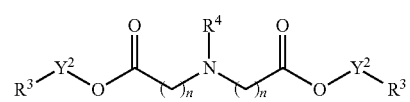

(b1-1-2)

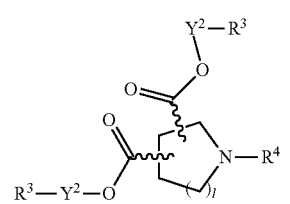

(b1-1-3)

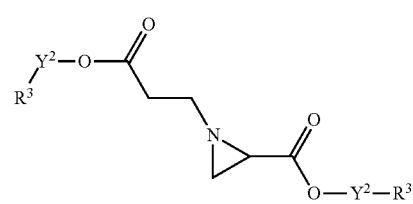

(b1-1-4)

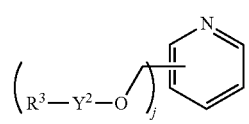

(b1-1-5)

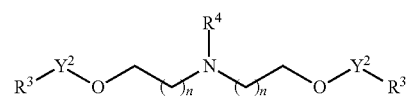

(b1-1-6)

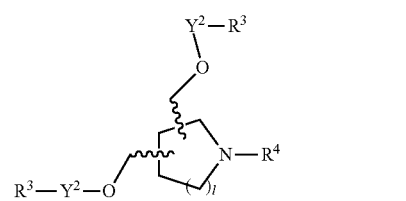

(b1-1-7)

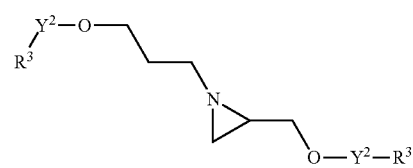

(b1-1-8)

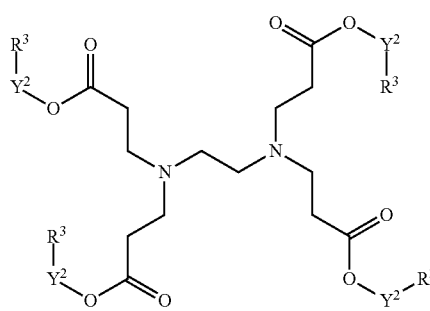
(b1-1-9)

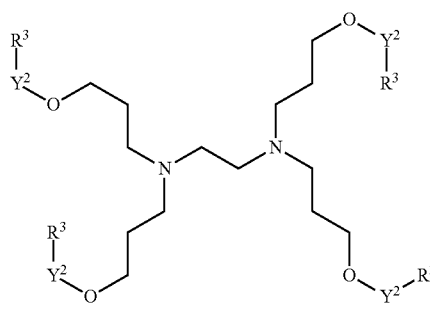
(b1-1-10)

(b1-1-11)

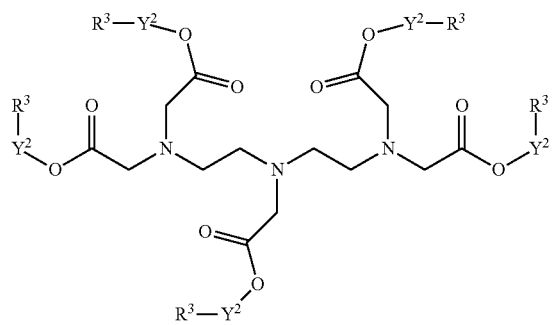
(b1-1-12)

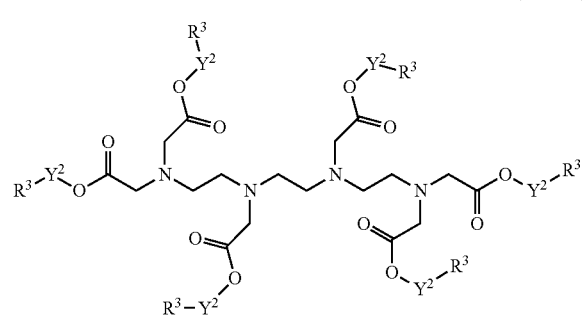
(b1-1-13)

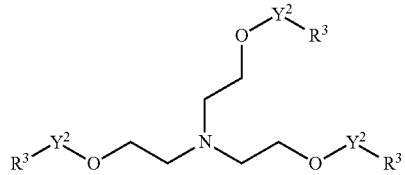

In the foregoing formulae, $Y^2$ and $R^3$ are the same as those as that described above; j represents an integer of from 2 to 4; n represents an integer of from 1 to 6; l represents an integer of from 1 to 2; and $R^4$ represents a hydrogen atom or a hydrocarbon group having from 1 to 10 carbon atoms.

$Y^2$ is preferably a single bond, a group as exemplified as the divalent hydrocarbon group for $Ya^{21}$, or a group in which the divalent hydrocarbon group is combined with an ester bond. The divalent hydrocarbon group is more preferably an alkylene group having from 1 to 5 carbon atoms, and still more preferably a methylene group or an ethylene group.

In addition, $R^3$ is preferably the group represented by the formula ((r-an-1).

Each counter cation of $R^3$ is independently preferably a monovalent organic cation represented by $M^+$.

{Cation Moiety of the Formulae (b1-1) and (b1-2)}

In the formulae (b1-1) and (b1-2), $M^{m+}$ represents an m-valent organic cation. Though the organic cation is not particularly limited, for example, organic cations which are known as a cation moiety of an onium-based acid generator of the conventional resist composition, or the like can be used. As such an organic cation, the same organic cation as the organic cation which constitutes the component (B2) that is an acid generator as an optional component as described later can be used. Above all, $M^{m+}$ is preferably a sulfonyl cation or an iodonium cation, and more preferably a cation represented by any one of the general formulae (ca-1) to (ca-4) as described later.

In the component (B1) of the component (B), the acid generator composed of the above-described compound may be used solely or in combination of two or more kinds thereof.

The content of the component (B1) in the resist composition is preferably from 0.5 to 60 parts by mass, more preferably from 1 to 50 parts by mass, still more preferably from 1 to 40 parts by mass, and especially preferably from 1 to 30 parts by mass, based on 100 parts by mass of the component (A). When the content of the component (B1) falls within the foregoing range, more excellent lithography properties are obtained. In addition, such is preferable because at the time of dissolving the components of the resist composition in an organic solvent, a uniform solution is obtained, and the storage stability becomes satisfactory.

<Optional Component>

[Component (B2)]

It is preferable that the resist composition according to the present invention further contains, in addition to the component (B1), the following component (B2) as the component (B). This component (B2) is not particularly limited, and those which have been proposed so far as the acid generator for a chemically amplified resist can be used.

As such an acid generator, a variety of materials are known, and examples thereof include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As the onium salt-based acid generator, for example, a compound represented by the following general formula (b-1) or (b-2) can be used.

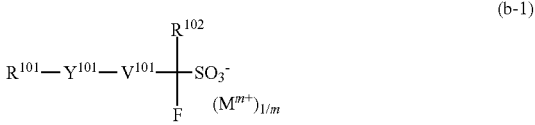
(b-1)

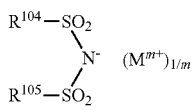  (b-2)

In the foregoing formulae, $R^{101}$ represents a cyclic group which may have a substituent, a chain alkyl group which may have a substituent, or a chain alkenyl group which may have a substituent;

$Y^{101}$ represents a single bond or a divalent linking group containing an oxygen atom;

$V^{101}$ represents a single bond, an alkylene group, or a fluorinated alkylene group;

$R^{102}$ represents a fluorine atom or a fluorinated alkyl group having from 1 to 5 carbon atoms;

each of $R^{104}$ and $R^{105}$ independently represents an alkyl group having from 1 to 10 carbon atoms or a fluorinated alkyl group having from 1 to 10 carbon atoms, and $R^{104}$ and $R^{105}$ may be bonded to each other to form a ring; and $M^{m+}$ represents an m-valent organic cation.

{Anion Moiety}

In the formula (b-1), $R^{101}$ represents a cyclic group which may have a substituent, a chain alkyl group which may have a substituent, or a chain alkenyl group which may have a substituent. The cyclic group is preferably a cyclic hydrocarbon group, and the cyclic hydrocarbon group may be either an aromatic hydrocarbon group or an aliphatic hydrocarbon group.

Examples of the aromatic hydrocarbon group represented by $R^{101}$ include an aromatic hydrocarbon group exemplified above as the divalent aromatic hydrocarbon group for $Va^1$ in the formula (a1-1), and an aryl group in which one hydrogen atom is removed from an aromatic compound containing two or more aromatic rings. Of these, a phenyl group or a naphthyl group is preferable.

Examples of the cyclic aliphatic hydrocarbon group represented by $R^{101}$ include a group in which one hydrogen atom is removed from the above-described monocycloalkane or polycycloalkane exemplified above as the divalent aliphatic hydrocarbon group for $Va^1$ in the formula (a1-1). Of these, an adamantyl group or a norbornyl group is preferable.

In addition, the cyclic hydrocarbon group represented by $R^{101}$ may contain a hetero atom as in heterocyclic rings. Specifically, examples thereof include the lactone-containing cyclic groups represented by the general formulae (a2-r-1) to (a2-r-7) and the —SO$_2$— containing cyclic groups represented by the general formulae (a5-r-1) to (a5-r-4), and besides, heterocyclic rings as described below.

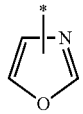  (r-hr-1)

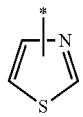  (r-hr-2)

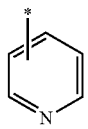  (r-hr-3)

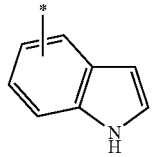  (r-hr-4)

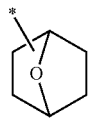  (r-hr-5)

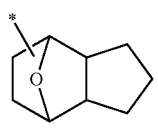  (r-hr-6)

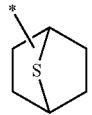  (r-hr-7)

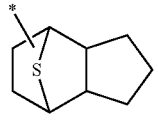  (r-hr-8)

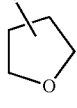  (r-hr-9)

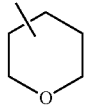  (r-hr-10)

  (r-hr-11)

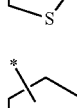  (r-hr-12)

  (r-hr-13)

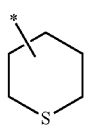  (r-hr-14)

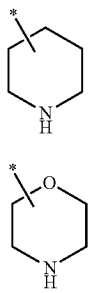

(h-hr-15)

(r-hr-16)

Examples of the substituent in the cyclic hydrocarbon group represented by $R^{101}$ include an alkyl group, an alkoxy group, a halogen atom, a halogenated alkyl group, a hydroxyl group, a carbonyl group, and a nitro group.

The alkyl group as the substituent is preferably an alkyl group having from 1 to 5 carbon atoms, and most preferably a methyl group, an ethyl group, a propyl group, an n-butyl group, or a tert-butyl group.

The alkoxy group as the substituent is preferably an alkoxy group having from 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent of the aromatic hydrocarbon group include a group in which a part or all of the hydrogen atoms of an alkyl group having from 1 to 5 carbon atoms, for example, a methyl group, an ethyl group, a propyl group, an n-butyl group, or a tert-butyl group, is substituted with the above-described halogen atom.

The chain alkyl group represented by $R^{101}$ may be either a linear alkyl group or a branched alkyl group. The linear alkyl group is preferably a linear alkyl group having from 1 to 20 carbon atoms, more preferably a linear alkyl group having from 1 to 15 carbon atoms, and most preferably a linear alkyl group having from 1 to 10 carbon atoms. Specifically, examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, and a docosyl group.

The branched alkyl group is preferably a branched alkyl group having from 3 to 20 carbon atoms, more preferably a branched alkyl group having from 3 to 15 carbon atoms, and most preferably a branched alkyl group having from 3 to 10 carbon atoms. Specifically, examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The chain alkenyl group represented by $R^{101}$ is preferably a chain alkenyl group having from 2 to 10 carbon atoms, more preferably a chain alkenyl group having from 2 to 5 carbon atoms, still more preferably a chain alkenyl group having from 2 to 4 carbon atoms, and most preferably a chain alkenyl group having 3 carbon atoms. Examples thereof include a vinyl group, a propenyl group (allyl group), and a butynyl group. Examples of a branched monovalent unsaturated hydrocarbon group include a 1-methylpropenyl group and a 2-methylpropenyl group.

Of the foregoing, the unsaturated hydrocarbon group is especially preferably a propenyl group.

Examples of the substituent in the alkyl group or alkenyl group represented by $R^{101}$ include an alkoxy group, a halogen atom, a halogenated alkyl group, a hydroxyl group, a carbonyl group, a nitro group, an amino group, and the above-described cyclic group in $R^{101}$.

In the present invention, $R^{101}$ is preferably a cyclic hydrocarbon group which may have a substituent. Preferred examples thereof include a phenyl group, a naphthyl group, a group in which one or more hydrogen atoms are removed from a polycycloalkane, the lactone-containing cyclic groups represented by the general formulae (a2-r-1) to (a2-r-7), and the —$SO_2$— containing cyclic groups represented by the general formulae (a5-r-1) to (a5-r-4).

In the case where $Y^{101}$ is a divalent linking group containing an oxygen atom, $Y^{101}$ may contain an atom other than an oxygen atom. Examples of the atom other than an oxygen atom include a carbon atom, a hydrogen atom, a sulfur atom, and a nitrogen atom.

Examples of the divalent linking group containing an oxygen atom include a non-hydrocarbon-based oxygen atom-containing linking group such as an oxygen atom (ether bond: —O—), an ester bond (—C(=O)—O—), an amide bond (—C(=O)—NH—), a carbonyl group (—C(=O)—), and a carbonate bond (—O—C(=O)—O—); and a combination of the non-hydrocarbon-based oxygen atom-containing linking group with an alkylene group. A sulfonyl group (—$SO_2$—) may be further linked to the subject combination. Examples of the combination include linking groups represented by the following formulae (y-a1-1) to (y-a1-7).

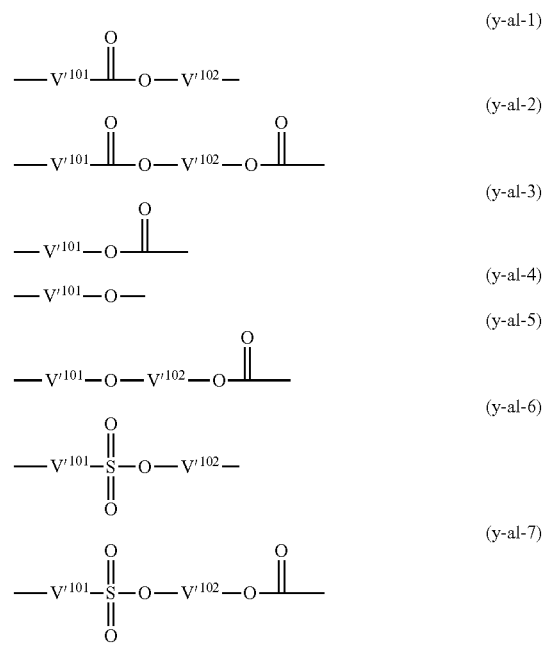

In the foregoing formulae, $V'^{101}$ represents a single bond or an alkylene group having from 1 to 5 carbon atoms; and $V'^{102}$ represents a divalent saturated hydrocarbon group having from 1 to 30 carbon atoms.

The divalent saturated hydrocarbon group represented by $V'^{102}$ is preferably an alkylene group having from 1 to 30 carbon atoms.

Specifically, examples of the alkylene group represented by $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, and —$CH(CH_2CH_3)CH_2$—; a trimethylene group (n-propylene group) [—$CH_2CH_2CH_2$—]; an alkyltrimethylene group such as —$CH(CH_3)CH_2CH_2$— and —$CH_2CH(CH_3)CH_2$—; a tetramethylene group [—$CH_2CH_2CH_2CH_2$—]; an alkyltetramethylene group such as —$CH(CH_3)CH_2CH_2CH_2$— and —$CH_2CH(CH_3)CH_2CH_2$—; and a pentamethylene group [—$CH_2CH_2CH_2CH_2CH_2$—]. Of these, a linear alkylene group is preferable.

In addition, a part of the methylene groups in the alkylene group represented by $V'^{101}$ and $V'^{102}$ may be substituted with a divalent aliphatic cyclic group having from 5 to 10 carbon atoms. The aliphatic cyclic group is preferably a divalent group in which one hydrogen atom is further removed from the above-described cyclic alkyl group represented by $Ra'^3$, and more preferably a cyclohexylene group, a 1,5-adamantylene group, or a 2,6-adamantylene group.

$Y^{101}$ is preferably a divalent linking group containing an ester bond or an ether bond, and those represented by the formulae (y-a1-1) to (y-a1-5) are preferable.

In the formula (b-1), $V^{101}$ is preferably a single bond or a fluorinated alkylene group having from 1 to 4 carbon atoms.

In the formula (b-1), $R^{102}$ is preferably a fluorine atom or a perfluoroalkyl group having from 1 to 5 carbon atoms, and more preferably a fluorine atom.

Specific examples of the anion moiety of the formula (b-1) are as follows.

That is, in the case where $Y^{101}$ is a single bond, examples thereof include a fluorinated alkyl sulfonate anion such as a trifluoromethane sulfonate anion and a perfluorobutane sulfonate anion; and in the case where $Y^{101}$ is a divalent linking group containing an oxygen atom, examples thereof include anions represented by the following formulae (an-1) to (an-3).

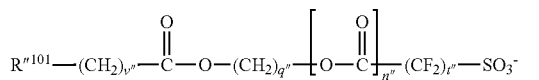

(an-1)

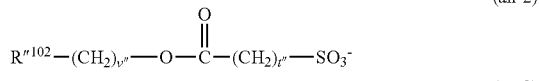

(an-2)

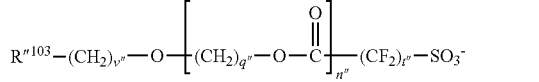

(an-3)

In the foregoing formulae, $R''^{101}$ represents an aliphatic cyclic group which may have a substituent, a group represented by any one of the formulae (r-hr-1) to (r-hr-6), or a chain alkyl group which may have a substituent;

$R''^{102}$ represents an aliphatic cyclic group which may have a substituent, a lactone-containing cyclic group represented by any one of the formulae (a2-r-1) to (a2-r-7), or an —$SO_2$— containing cyclic group represented by any one of the general formulae (a5-r-1) to (a5-r-4);

$R''^{103}$ represents an aromatic cyclic group which may have a substituent, an aliphatic cyclic group which may have a substituent, or a chain alkenyl group which may have a substituent;

each v" independently represents an integer of from 0 to 3;

each q" independently represents an integer of from 1 to 20;

t" represents an integer of from 1 to 3; and n" is 0 or 1.

The aliphatic cyclic group which may have a substituent, as represented by $R''^{101}$, $R''^{102}$, and $R''^{103}$, is preferably the group exemplified above as the cyclic aliphatic hydrocarbon group for $R^{101}$.

Examples of the substituent include the same substituents as those with which the cyclic aliphatic hydrocarbon group represented by $R^{101}$ may be substituted.

The aromatic cyclic group which may have a substituent, as represented by $R''^{103}$, is preferably the group exemplified above as the cyclic aromatic hydrocarbon group represented by $R^{101}$. Examples of the substituent include the same substituents as those with which the cyclic aromatic hydrocarbon group represented by $R^{101}$ may be substituted.

The chain alkyl group which may have a substituent, as represented by $R''^{101}$, is preferably the group exemplified above as the chain alkyl group represented by $R^{101}$. The chain alkenyl group which may have a substituent, as represented by $R''^{103}$, is preferably the group exemplified above as the chain alkenyl group represented by $R^{101}$.

In the formula (b-2), each of $R^{104}$ and $R^{105}$ independently represents an alkyl group or a fluorinated alkyl group each having from 1 to 10 carbon atoms, and $R^{104}$ and $R^{105}$ may be bonded to each other to form a ring.

Each of $R^{104}$ and $R^{105}$ is preferably a linear or branched (fluorinated) alkyl group. The carbon number of the (fluorinated) alkyl group is from 1 to 10, preferably from 1 to 7, and more preferably from 1 to 3. It is preferable that the carbon number of the (fluorinated) alkyl group of each of $R^{104}$ and $R^{105}$ is small as far as possible within the foregoing range of the carbon number for a reason that the solubility in the resist solvent is satisfactory, or the like.

In addition, in the (fluorinated) alkyl group of each of $R^{104}$ and $R^{105}$, it is preferable that the number of hydrogen atoms which are substituted with a fluorine atom is large as far as possible because the intensity of the acid becomes strong, and the transparency to high energy radiation of not more than 200 nm or electron beams is enhanced.

A proportion of the fluorine atom in the (fluorinated) alkyl group, namely a fluorination ratio, is preferably from 70 to 100%, and more preferably from 90 to 100%. A perfluoroalkylene group or a perfluoroalkyl group in which all of the hydrogen atoms are substituted with a fluorine atom is the most preferable.

{Cation Moiety}

In the formulae (b-1) and (b-2), $M^{m+}$ represents an m-valent organic cation. The organic cation is not particularly limited, and organic cations which are known as a cation moiety of an onium-based acid generator of the conventional resist composition, or the like can be used. Of these, $M^{m+}$ is preferably a sulfonium cation or an iodonium cation, and especially preferably a cation represented by any one of the following general formulae (ca-1) to (ca-4).

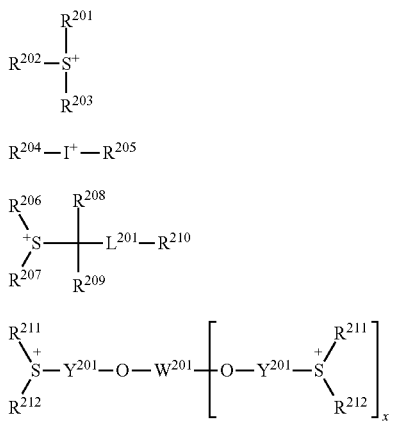

(ca-1)

(ca-2)

(ca-3)

(ca-4)

In the foregoing formulae, each of $R^{201}$ to $R^{207}$ and $R^{211}$ to $R^{212}$ independently represents an aryl group, an alkyl group, or an alkenyl group, each of which may have a substituent, and $R^{201}$ to $R^{203}$, $R^{206}$ to $R^{207}$, or $R^{211}$ to $R^{212}$ may be bonded to each other to form a ring together with the sulfur atom in the formula. Each of $R^{208}$ to $R^{209}$ independently represents a hydrogen atom or an alkyl group having from 1 to 5 carbon atoms; and $R^{210}$ represents an aryl group, an alkyl group, an alkenyl group, or an —$SO_2$— containing cyclic group, each of which may have a substituent.

$L^{201}$ represents —C(=O)— or —C(=O)—O—;

each $Y^{201}$ independently represents an arylene group, an alkylene group, or an alkenylene group;

x is 1 or 2; and $W^{201}$ represents an (x+1)-valent linking group.

Examples of the aryl group represented by $R^{201}$ to $R^{207}$ and $R^{210}$ to $R^{212}$ include an unsubstituted aryl group having from 6 to 20 carbon atoms. Of these, a phenyl group or a naphthyl group is preferable.

The alkyl group represented by $R^{201}$ to $R^{207}$ and $R^{210}$ to $R^{212}$ is a chain or cyclic alkyl group, and a chain or cyclic alkyl group having from 1 to 30 carbon atoms is preferable.

The alkenyl group represented by $R^{201}$ to $R^{207}$ and $R^{210}$ to $R^{212}$ is preferably an alkenyl group having from 2 to 10 carbon atoms.

$R^{208}$ to $R^{209}$ are preferably a hydrogen atom or an alkyl group having from 1 to 3 carbon atoms, and in the case of an alkyl group, $R^{208}$ to $R^{209}$ may be bonded to each other to form a ring.

Examples of the —$SO_2$— containing cyclic group which may have a substituent, as represented by $R^{210}$, include the same groups as those of the "—$SO_2$— containing cyclic group" represented by $Ra^{21}$, and the group represented by the general formula (a5-r-1) is preferable.

Examples of the substituent which each of $R^{201}$ to $R^{207}$ and $R^{210}$ to $R^{212}$ may have include an alkyl group, a halogen atom, a halogenated alkyl group, a carbonyl group, a cyano group, an amino group, an aryl group, and a substituent represented by any one of the formulae (ca-r-1) to (ca-r-7).

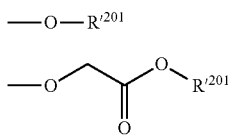

[ca-r-1]

[ca-r-2]

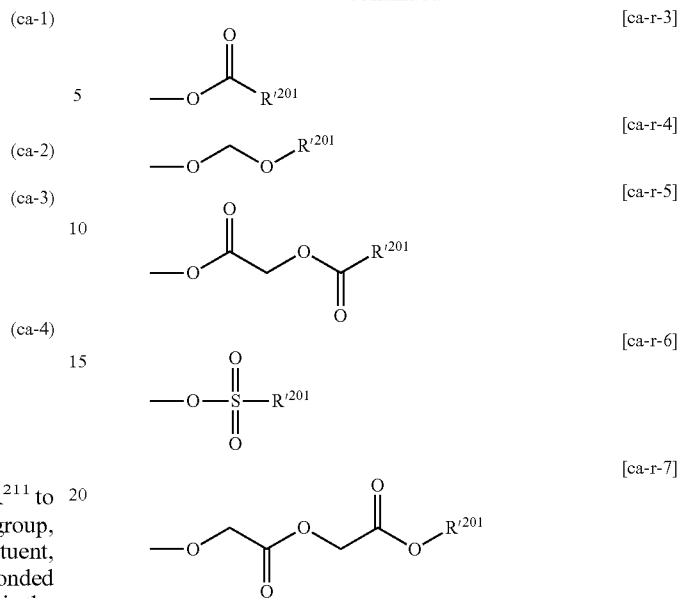

[ca-r-3]

[ca-r-4]

[ca-r-5]

[ca-r-6]

[ca-r-7]

In the foregoing formulae, each $R'^{201}$ independently represents a hydrogen atom, or a cyclic group, a chain alkyl group, or a chain alkenyl group, each of which may have a substituent.

Examples of the cyclic group, the chain alkyl group, or the chain alkenyl group, each of which may have a substituent, as represented by $R'^{201}$, include the same groups as those in $R^{101}$. Besides, examples of the cyclic group which may have a substituent, or the chain alkyl group which may have a substituent, include the same groups as those in the formula (a1-r-2).

In the case where $R^{201}$ to $R^{203}$, $R^{206}$ to $R^{207}$, or $R^{211}$ to $R^{212}$ are bonded to each other to form a ring together with the sulfur atom in the formula, they may be bonded via a hetero atom such as a sulfur atom, an oxygen atom, and a nitrogen atom, or a functional group such as a carbonyl group, —SO—, —$SO_2$—, —$SO_3$—, —COO—, —CONH—, and —N($R_N$)— ($R_N$ represents an alkyl group having from 1 to 5 carbon atoms). As the ring to be formed, one ring containing the sulfur atom in the formula in a ring skeleton thereof is preferably a 3-membered to 10-membered ring, and especially preferably a 5-membered to 7-membered ring, including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathine ring, a tetrahydrothiophenium ring, and a tetrahydrothiopyranium ring.

In the formula (ca-4), x is 1 or 2.

$W^{201}$ represents an (x+1)-valent (namely divalent trivalent) linking group.

The divalent linking group represented by $W^{201}$ is preferably a divalent hydrocarbon group which may have a substituent, and examples thereof include the same hydrocarbon groups as those for $Ya^{21}$ in the general formula (a2). The divalent linking group represented by $W^{201}$ may be any of a linear group, a branched group, or a cyclic group, and it is preferably a cyclic group. Above all, a group in which a carbonyl group is combined with each of the both terminals of an arylene group is preferable. Examples of the arylene group include a phenylene group and a naphthylene group, with a phenylene group being especially preferable.

Examples of the trivalent linking group represented by $W^{201}$ include a group in which one hydrogen atom is removed from the above-described divalent linking group; and a group in which the above-described divalent linking group is further bonded to the above-described divalent linking group. The trivalent linking group represented by $W^{201}$ is preferably a group in which three carbonyl groups are combined with an arylene group.

Specifically, suitable examples of the cation represented by the formula (ca-1) include cations represented by the following formulae (ca-1-1) to (ca-1-63).

(ca-1-1)
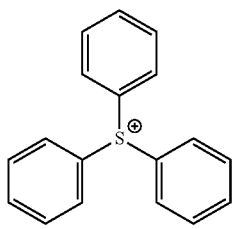

(ca-1-2)
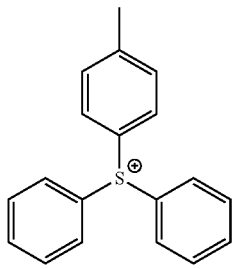

(ca-1-3)
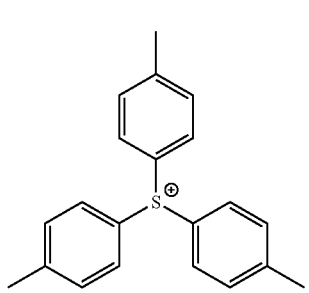

(ca-1-4)
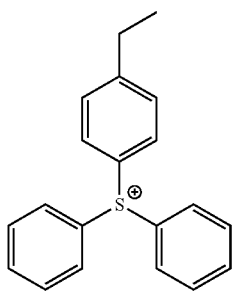

(ca-1-5)
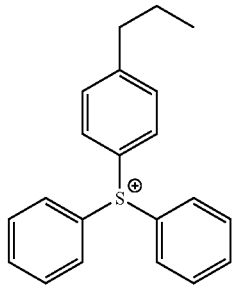

(ca-1-6)
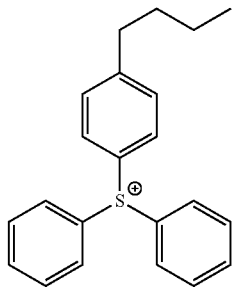

(ca-1-7)
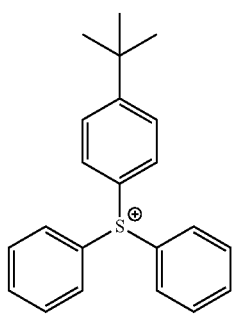

(ca-1-8)
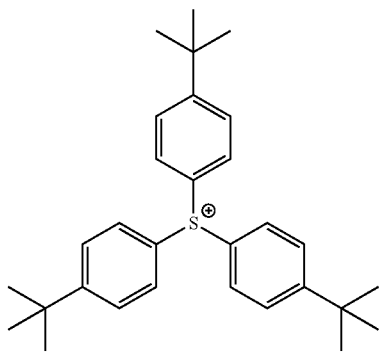

(ca-1-9)
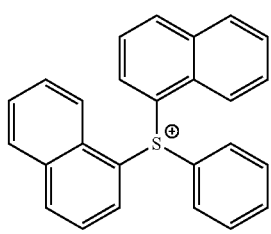

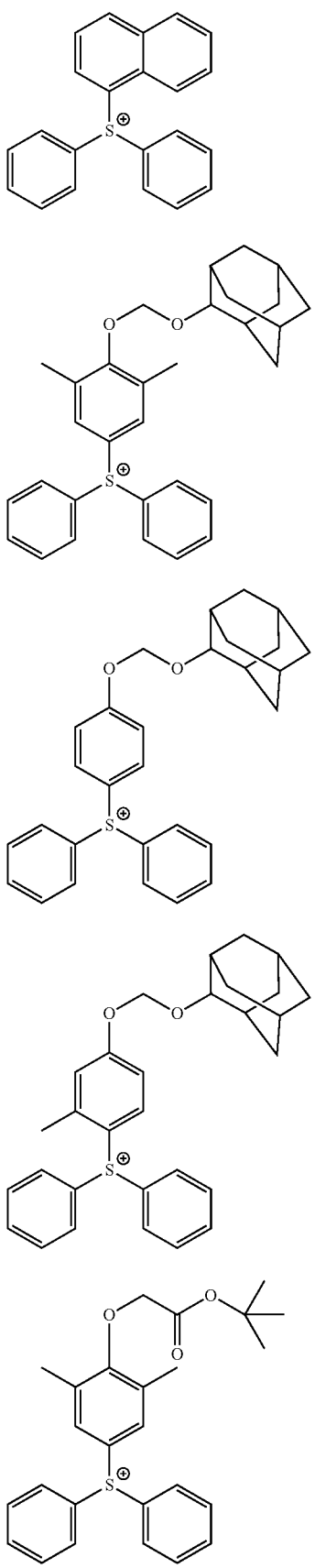
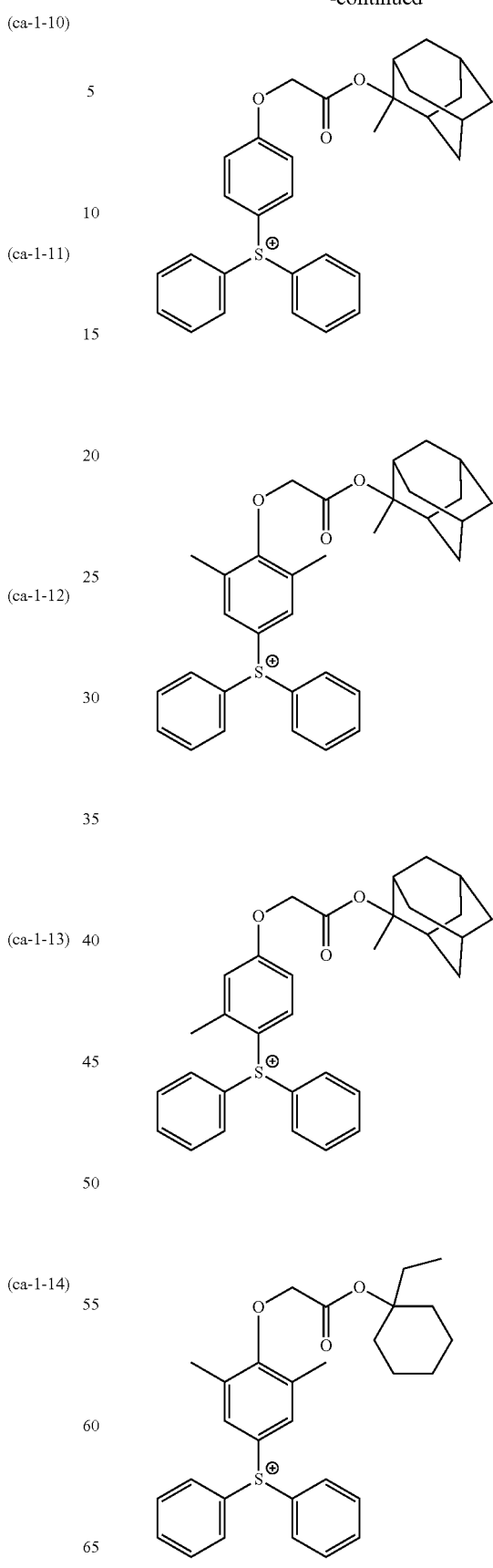

(ca-1-19)
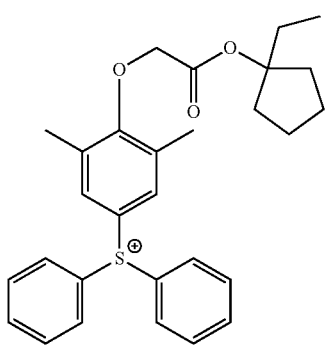
(ca-1-20)
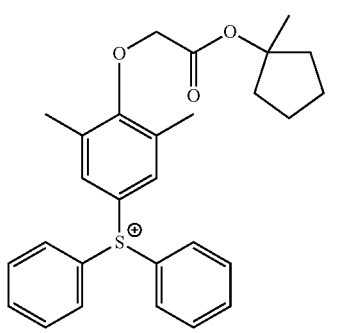
(ca-1-21)
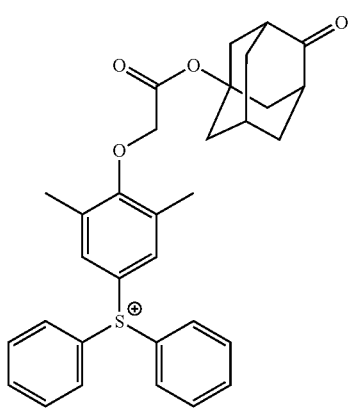
(ca-1-22)
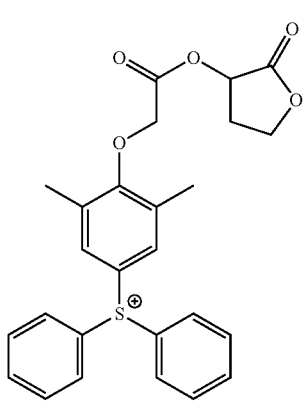
(ca-1-23)
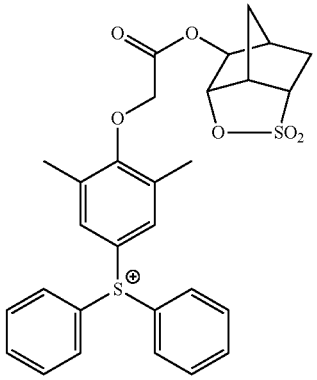
(ca-1-24)
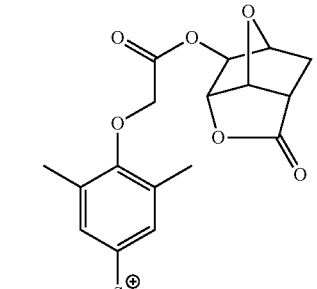
(ca-1-25)
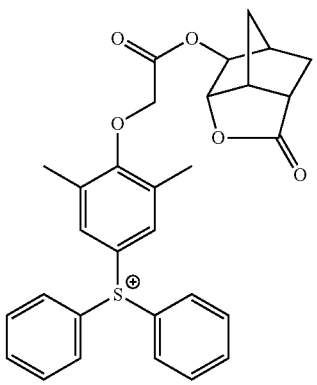
(ca-1-26)
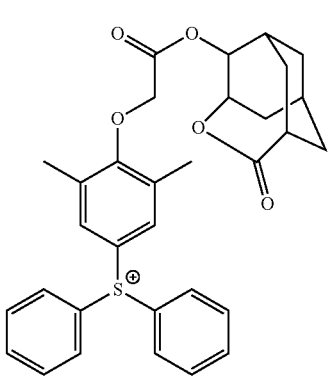

(ca-1-27) 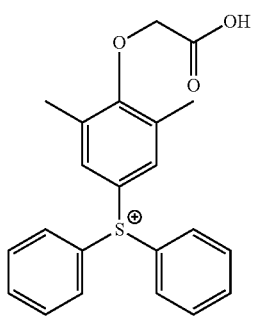
(ca-1-28) 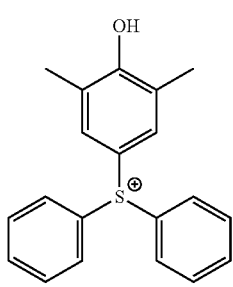
(ca-1-29) 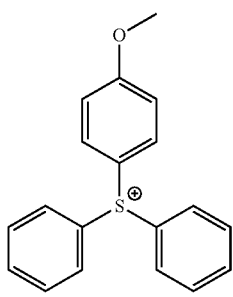
(ca-1-30) 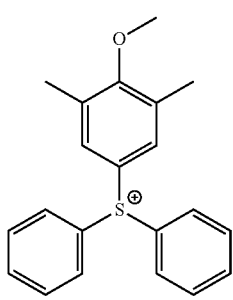
(ca-1-31) 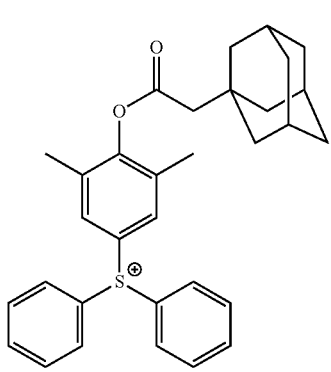
(ca-1-32) 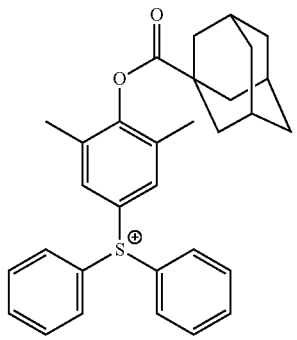
(ca-1-33) 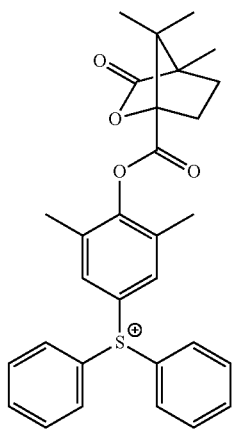
(ca-1-34) 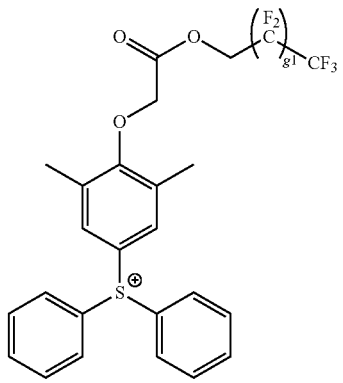
(ca-1-35) 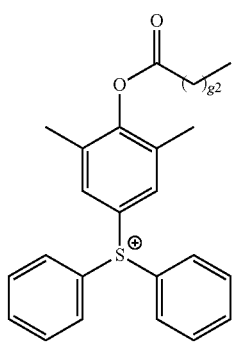

-continued
(ca-1-36)
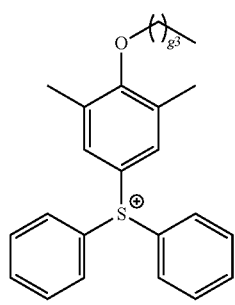
(ca-1-37)
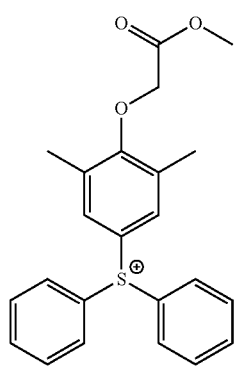
(ca-1-38)
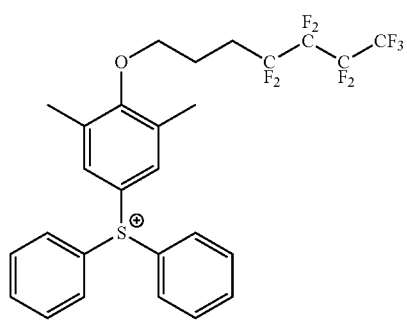
(ca-1-39)
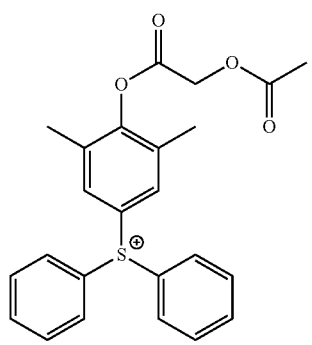
-continued
(ca-1-40)
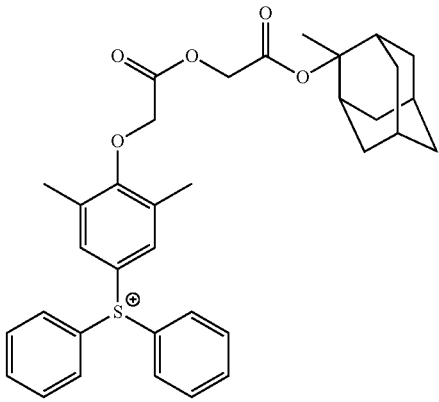
(ca-1-41)
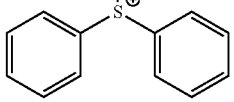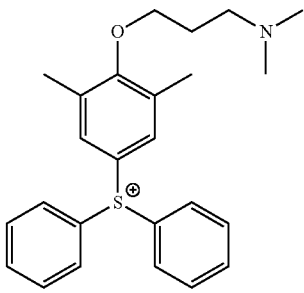
(ca-1-42)
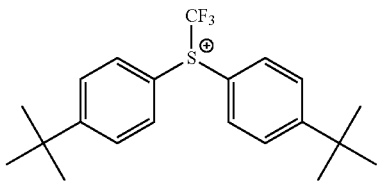
(ca-1-43)
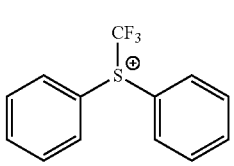
(ca-1-44)
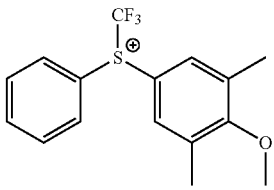
(ca-1-45)
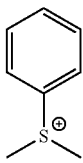
(ca-1-46)

(ca-1-47)
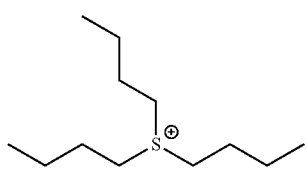
(ca-1-48)
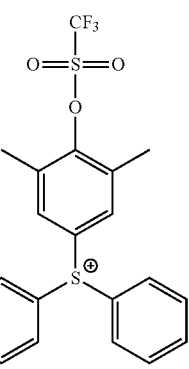
In the foregoing formulae, each of g1, g2, and g3 represents a repeating number; g1 represents an integer of from 1 to 5; g2 represents an integer of from 0 to 20; and g3 represents an integer of from 0 to 20.
(ca-1-49)
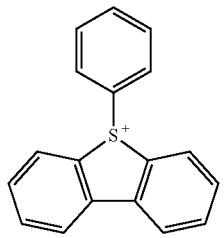
(ca-1-50)
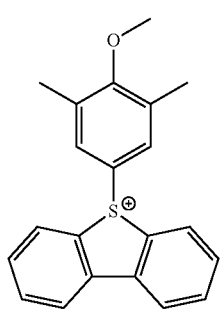
(ca-1-51)
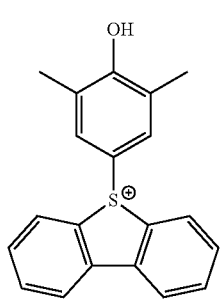
(ca-1-52)
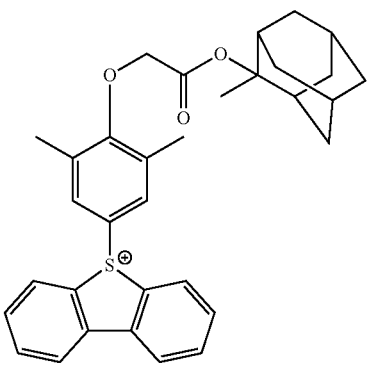
(ca-1-53)
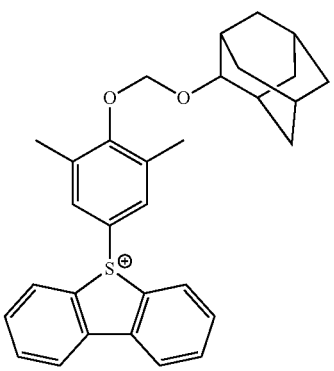
(ca-1-54)
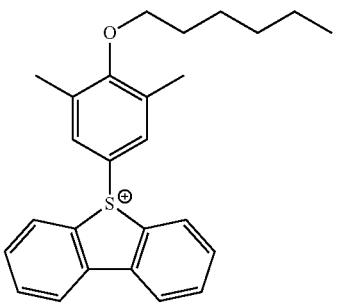
(ca-1-55)
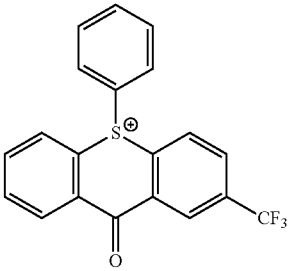
(ca-1-56)
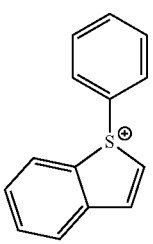

(ca-1-57) 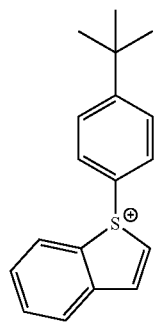

(ca-1-58) 

(ca-1-59) 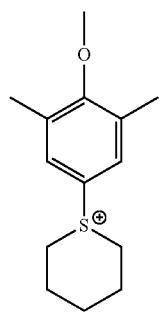

(ca-1-60) 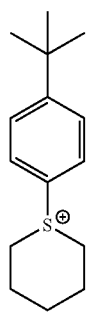

(ca-1-61) 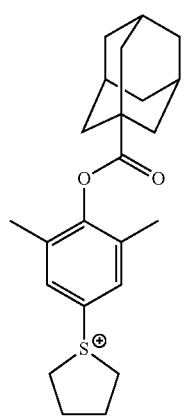

(ca-1-62) 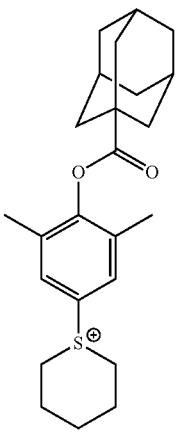

(ca-1-63) 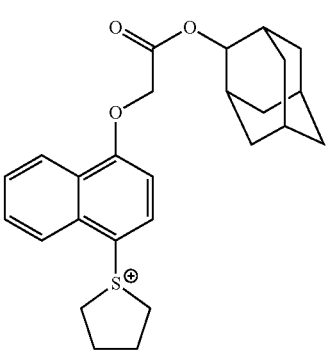

In the foregoing formulae, R''$^{201}$ represents a hydrogen atom or a substituent, and examples of the substituent include the same groups as those exemplified above for the substituent which each of R$^{201}$ to R$^{207}$ and R$^{210}$ to R$^{212}$ may have.

Specifically, suitable examples of the cation represented by the formula (ca-3) include cations represented by the following formulae (ca-3-1) to (ca-3-6).

(ca-3-1) 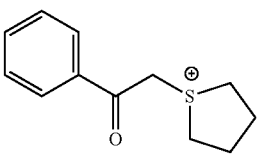

(ca-3-2) 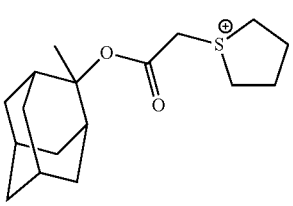

(ca-3-3) 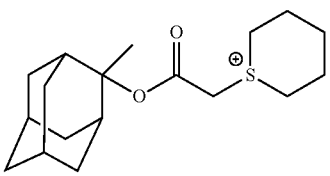

-continued

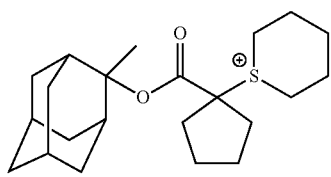
(ca-3-4)

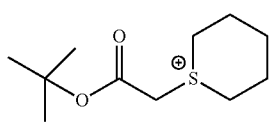
(ca-3-5)

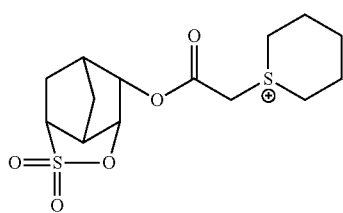
(ca-3-6)

Specifically, suitable examples of the cation represented by the formula (ca-4) include cations represented by the following formulae (ca-4-1) to (ca-4-2).

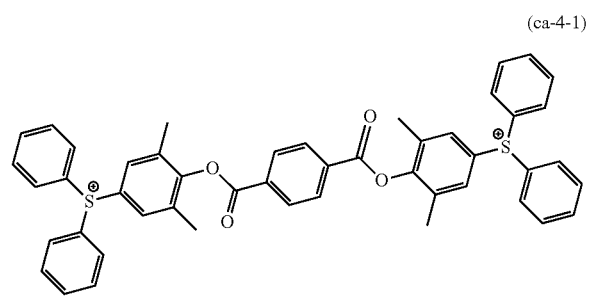
(ca-4-1)

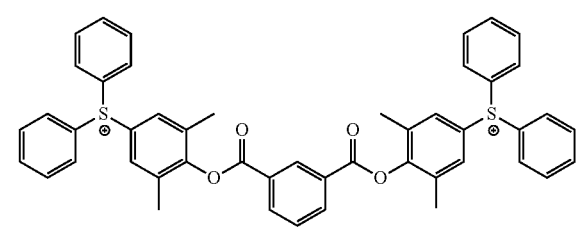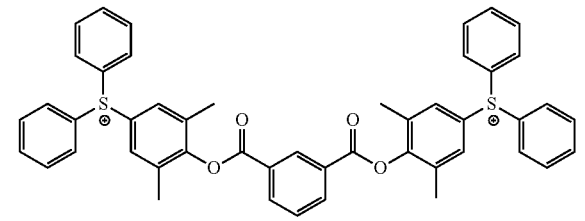
(ca-4-2)

In the component (B2) of the component (B), the acid generator composed of the above-described compound may be used solely or in combination of two or more kinds thereof.

The content of the component (B2) in the resist composition is preferably from 0 to 60 parts by mass, more preferably from 0.5 to 50 parts by mass, still more preferably from 1 to 40 parts by mass, and especially preferably from 1 to 20 parts by mass, based on 100 parts by mass of the component (A). When the content of the component (B2) falls within the foregoing range, the component (B2) may contribute to the formation of a satisfactory pattern together with the component (B1). In addition, such is preferable because at the time of dissolving the components of the resist composition in an organic solvent, a uniform solution is obtained, and the storage stability becomes satisfactory.

In the case of using, as the component (B), a mixture of the component (B1) and the component (B2), a mass ratio of the component (B1) to the component (B2) is preferably from 99/1 to 5/95, more preferably from 95/5 to 10/90, and still more preferably from 90/10 to 20/80.

<Optional Component>
[Basic Compound Component; Component (D)]

The resist composition according to the present invention may contain, in addition to the component (A), a basic compound component (hereinafter sometimes referred to "component (D)").

The component (D) acts as a quencher (acid diffusion control agent) which traps the acid generated from the component (B) and the like upon exposure. Incidentally, in the present invention, the term "basic compound" refers to a compound which becomes relatively basic to the component (B).

The component (D) in the present invention may be a basic compound (D1) (hereinafter referred to as "component (D1)") which is composed of a cation moiety and an anion moiety, or may be a basic compound (D2) (hereinafter referred to as "component (D2)") which does not fall under the definition of the component (D1).

(Component (D1))

In the case where the resist composition contains, in addition to the component (A), the component (B), when the resist composition further contains the component (D1), at the time of forming a resist pattern, a contrast between the exposed areas and the unexposed areas can be enhanced.

Though the component (D1) is not particularly limited so long as it becomes relatively basic to the component (B), the component (D1) is preferably at least one compound selected from the group consisting of a compound represented by the following general formula (d1-1) (hereinafter referred to as "component (d1-1)"), a compound represented by the following general formula (d1-2) (hereinafter referred to as "component (d1-2)"), and a compound represented by the following general formula (d1-3) (hereinafter referred to as "component (d1-3)").

Each of the components (d1-1) to (d1-3) does not act as a quencher in exposed areas but acts as a quencher in unexposed areas.

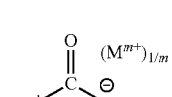
(d1-1)

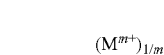
(d1-2)

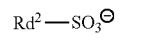
(d1-3)

In the foregoing formulae, each of $Rd^1$ to $Rd^4$ represents a hydrocarbon group which may have a substituent. However, a fluorine atom is not bonded to the carbon atom adjacent to the S atom in $Rd^2$ in the formula (d1-2). $Yd^1$ represents a single bond, an alkylene group, or an arylene group. Each $M^{m+}$ independently represents an m-valent organic cation.

{Component (d1-1)}
Anion Moiety:
In the formula (d1-1), $Rd^1$ represents a hydrocarbon group which may have a substituent.

Examples of the hydrocarbon group which may have a substituent, as represented by $Rd^1$, include a monovalent group in which a hydrogen atom is bonded to one bond of the divalent hydrocarbon group which may have a substituent, as represented by $Ya^{21}$ in the formula (a2-1). Above all, $Rd^1$ is preferably an aromatic hydrocarbon group which may have a substituent, or an aliphatic cyclic group which may have a substituent; and more preferably a phenyl group or a naphthyl group, each of which may have a substituent, or a group in which one or more hydrogen atoms are removed from a polycycloalkane such as adamantane, norbornane, isobornane, tricyclodecane, and tetracyclododecane. The substituent is preferably a hydroxyl group.

In addition, the hydrocarbon group which may have a substituted, as represented by $Rd^1$, is also preferably a linear, branched, or alicyclic alkyl group or a fluorinated alkyl group.

The carbon number of the linear, branched, or alicyclic alkyl group as represented by $Rd^1$ is preferably from 1 to 10. Specifically, examples thereof include a linear alkyl group such as a methyl group, an ethyl group, a propyl group, a butyl group, a pentyl group, a hexyl group, a heptyl group, an octyl group, a nonyl group, and a decyl group; a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group; and an alicyclic alkyl group such as a norbornyl group and an adamantyl group.

The fluorinated alkyl group represented by $Rd^1$ may be either a chain group or a cyclic group, and it is preferably a linear or branched group.

The carbon number of the fluorinated alkyl group is preferably from 1 to 11, more preferably from 1 to 8, and still more preferably from 1 to 4. Specifically, examples thereof include a group in which a part or all of hydrogen atoms constituting a linear alkyl group such as a methyl group, an ethyl group, a propyl group, a butyl group, a pentyl group, a hexyl group, a heptyl group, an octyl group, a nonyl group, and a decyl group are substituted with a fluorine atom; and a group in which a part or all of hydrogen atoms constituting a branched alkyl group such as a 1-methylethyl group, a 1-methylpropyl group, a 2-methylpropyl group, a 1-methylbutyl group, a 2-methylbutyl group, and a 3-methylbutyl group are substituted with a fluorine atom.

In addition, the fluorinated alkyl group represented by $Rd^1$ may contain an atom other than a fluorine atom. Examples of the atom other than a fluorine atom include an oxygen atom, a carbon atom, a hydrogen atom, a sulfur atom, and a nitrogen atom.

Above all, the fluorinated alkyl group represented by $Rd^1$ is preferably a group in which a part or all of hydrogen atoms constituting a linear alkyl group are substituted with a fluorine atom, and more preferably a group (perfluoroalkyl group) in which all of hydrogen atoms constituting a linear alkyl group are substituted with a fluorine atom.

Preferred specific examples of the anion moiety of the component (d1-1) are given below.

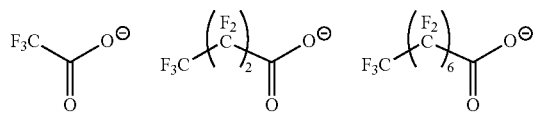

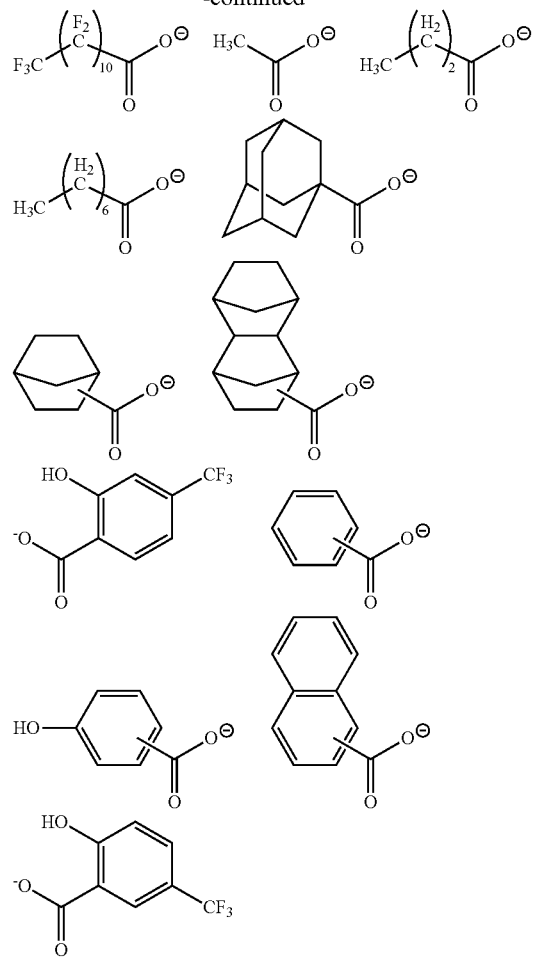

Cation Moiety:

In the formula (d1-1), $M^{m+}$ represents an m-valent organic cation.

Though the organic cation represented by $M^{m+}$ is not particularly limited, examples thereof include the same cations as those represented in the general formulae (ca-1) to (ca-4). Of these, cations represented by the formulae (ca-1-1) to (ca-1-63) are preferable.

The component (d1-1) may be used solely or in combination of two or more kinds thereof.

{Component (d1-2)}

Anion Moiety:

In the component (d1-2), $Rd^2$ represents a hydrocarbon group which may have a substituent.

Examples of the hydrocarbon group which may have a substituent, as represented by $Rd^2$, include the same groups as those exemplified above for the hydrocarbon group which may have a substituent, as represented by $Rd^1$ in the formula (d1-1). However, a fluorine atom is not bonded to (not substituted on) the carbon atom adjacent to the S atom in $Rd^2$ in the formula (d1-2). According to this, the anion of the component (d1-2) becomes an appropriate weak acid anion, whereby the quenching ability of the component (D) is enhanced.

$Rd^2$ is preferably an aliphatic cyclic group which may have a substituent, and more preferably a group in which one or more hydrogen atoms are removed from adamantane, norbornane, isobornane, tricyclodecane, tetracyclododecane, or the like (the group may have a substituent), or a group in which one or more hydrogen atoms are removed from camphor or the like.

The hydrocarbon group represented by $Rd^2$ may have a substituent. Examples of the substituent include the same groups as those exemplified above for the substituent which the hydrocarbon group (aromatic hydrocarbon group or aliphatic hydrocarbon group) as represented by $Rd^1$ in the formula (d1-1) may have.

Preferred specific examples of the anion moiety of the component (d1-2) are given below.

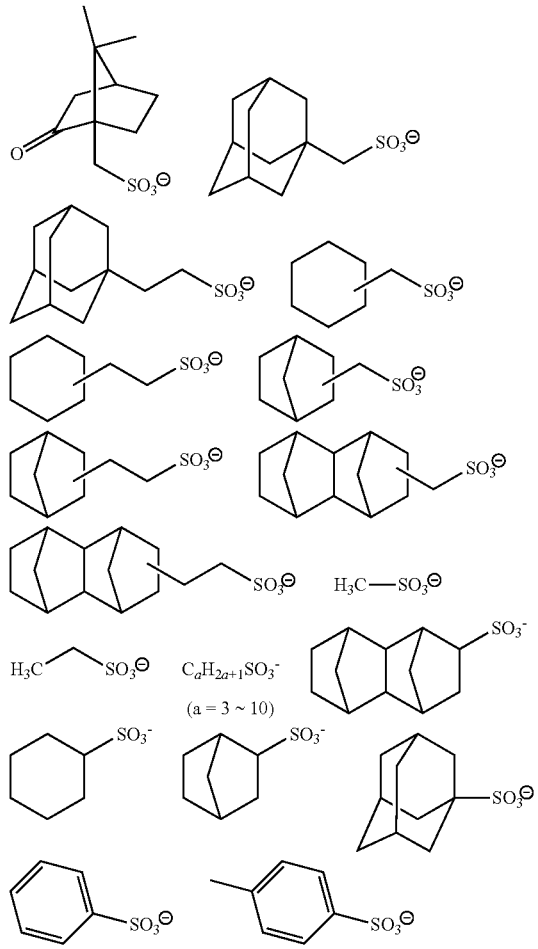

Cation Moiety:

In the formula (d1-2), $M^{m+}$ represents an m-valent organic cation and is the same as $M^{m+}$ in the formula (d1-1).

The component (d1-2) may be used solely or in combination of two or more kinds thereof.
{Component (d1-3)}
Anion Moiety:

In the component (d1-3), $Rd^3$ represents a hydrocarbon group which may have a substituent. Examples of the hydrocarbon group which may have a substituent, as represented by $Rd^3$, include the same groups as those exemplified above for the hydrocarbon group which may have a substituent, as represented by $Rd^1$ in the formula (d1-1). $Rd^3$ is preferably a hydrocarbon group containing a fluorine atom.

The hydrocarbon group containing a fluorine atom, as represented by $Rd^3$, is preferably a fluorinated alkyl group, and more preferably the same fluoroalkyl group as that represented by $Rd^1$.

In the component (d1-3), $Rd^4$ represents a hydrocarbon group which may have a substituent. Examples of the hydrocarbon group which may have a substituent, as represented by $Rd^4$, include the same groups as those exemplified above for the hydrocarbon group which may have a substituent, as represented by $Rd^1$ in the formula (d1-1). $Rd^4$ is preferably an alkyl group, an alkoxy group, —O—C(=O)—C($Rd^{42}$)=$CH_2$ ($Rd^{42}$ represents a hydrogen atom, an alkyl group having from 1 to 5 carbon atoms, or a halogenated alkyl group having from 1 to 5 carbon atoms), —C(=O)—$Rd^{43}$, or —O—C(=O)—$Rd^{43}$ ($Rd^{43}$ represents a hydrocarbon group).

The alkyl group represented by $Rd^4$ is preferably a linear or branched alkyl group having from 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. A part of the hydrogen atoms of the alkyl group represented by $Rd^4$ may be substituted with a cyano group or the like.

The alkoxy group represented by $Rd^4$ is preferably an alkoxy group having from 1 to 5 carbon atoms. Specifically, examples of the alkoxy group having from 1 to 5 carbon atoms include a methoxy group, an ethoxy group, an n-propoxy group, an isopropoxy group, an n-butoxy group, and a tert-butoxy group. Above all, a methoxy group or an ethoxy group is preferable.

In the case where $Rd^4$ is —O—C(=O)—C($Rd^{42}$)=$CH_2$, $Rd^{42}$ represents a hydrogen atom, an alkyl group having from 1 to 5 carbon atoms, or a halogenated alkyl group having from 1 to 5 carbon atoms.

The alkyl group having from 1 to 5 carbon atoms, as represented by $Rd^{42}$, is preferably a linear or branched alkyl group having from 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group represented by $Rd^{42}$ is a group in which a part or all of the hydrogen atoms of the above-described alkyl group having from 1 to 5 carbon atoms are substituted with a halogen atom. Examples of the halogen atom include a fluorine atom, a chlorine atom, a bromine atom, and an iodine atom, with a fluorine atom being especially preferable.

$Rd^{42}$ is preferably a hydrogen atom, an alkyl group having from 1 to 3 carbon atoms, or a fluorinated alkyl group having from 1 to 3 carbon atoms. From the standpoint of easiness of industrial availability, $Rd^{42}$ is most preferably a hydrogen atom or a methyl group.

In the case where $Rd^4$ is —C(=O)—$Rd^{43}$ or —O—C(=O)—$Rd^{43}$, $Rd^{43}$ represents a hydrocarbon group.

The hydrocarbon group represented by $Rd^{43}$ may be either an aromatic hydrocarbon group or an aliphatic hydrocarbon group. Specifically, examples of the hydrocarbon group represented by $Rd^{43}$ include the same groups as those exemplified above for the hydrocarbon group which may have a substituent, as represented by $Rd^1$ in the formula (d1-1).

The hydrocarbon group represented by $Rd^{43}$ is preferably an alicyclic group in which one or more hydrogen atoms are removed from a cycloalkane such as cyclopentane, cyclohexane, adamantane, norbornane, isobornane, tricyclodecane, and tetracyclododecane, or an aromatic group such as a phenyl group and a naphthyl group. In the case where $Rd^{43}$ is an alicyclic group, in view of the fact that the resist composition is satisfactorily dissolved in an organic solvent, the lithography properties become satisfactory. In addition, in the case where $Rd^{43}$ is an aromatic group, in the lithography using EUV or the like as an exposure light source, the resist composition exhibits excellent light absorption efficiency, and the sensitivity and lithography properties become satisfactory.

Above all, $Rd^{42}$ is preferably —O—C(=O)—C($Rd^{42'}$)=$CH_2$ ($Rd^{42'}$ represents a hydrogen atom or a methyl group) or —O—C(=O)—$Rd^{43'}$ ($Rd^{43'}$ represents an aliphatic cyclic group).

In the formula (d1-3), $Yd^1$ represents a single bond, an alkylene group, or an arylene group.

Examples of the alkylene group or arylene group represented by $Yd^1$ include the same groups as those exemplified above for the divalent hydrocarbon group (aliphatic hydrocarbon group or aromatic hydrocarbon group) which may have a substituent, as represented by $Ya^{21}$ in the formula (a2-1).

$Yd^1$ is preferably an alkylene group, more preferably a linear or branched alkylene group, and still more preferably a methylene group or an ethylene group.

Preferred specific examples of the anion moiety of the component (d1-3) are given below.

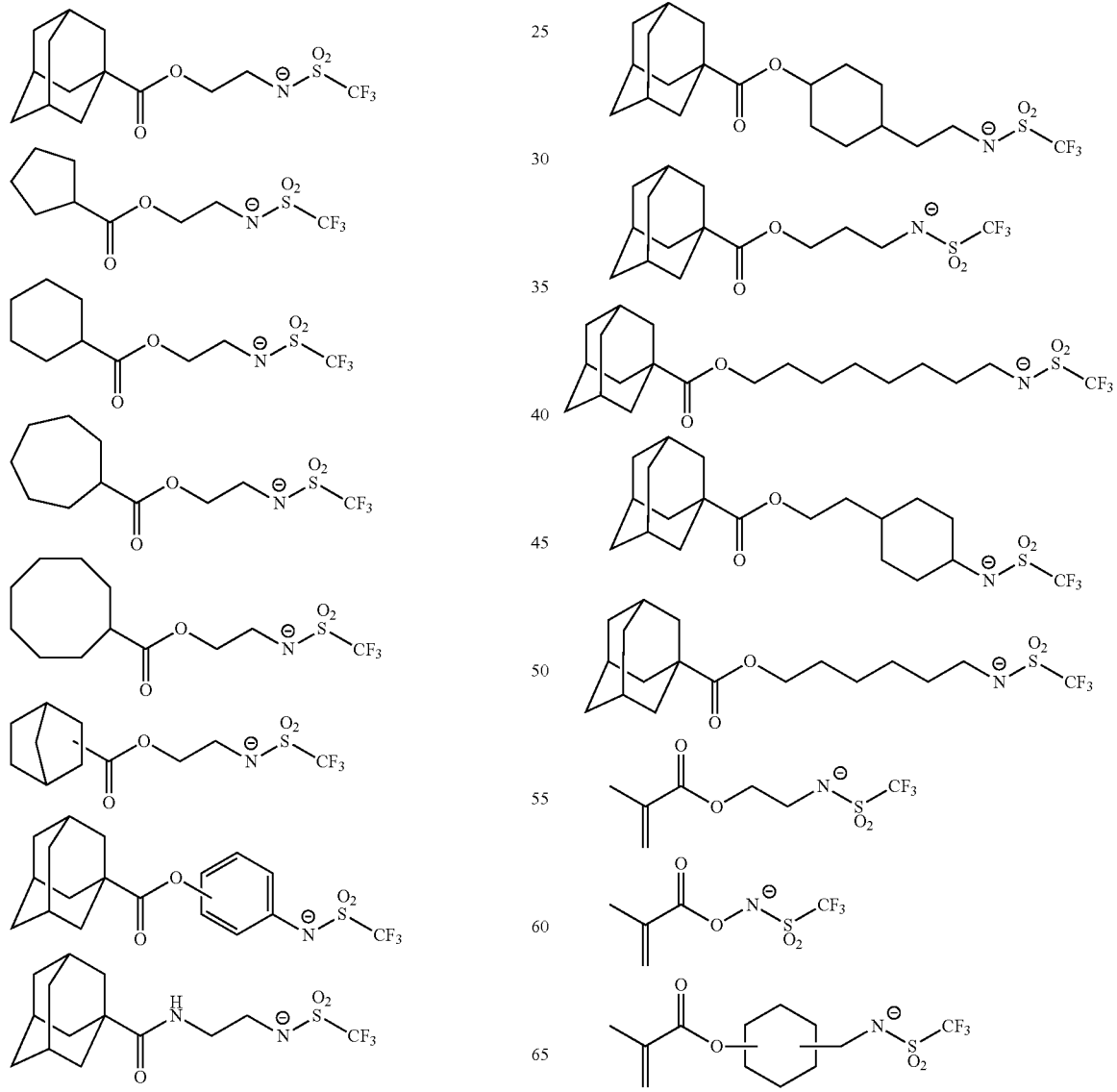

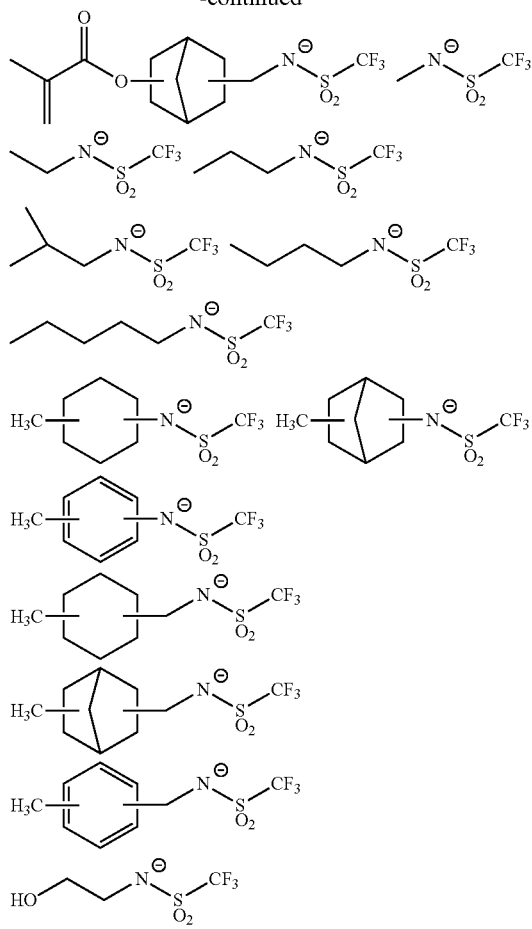

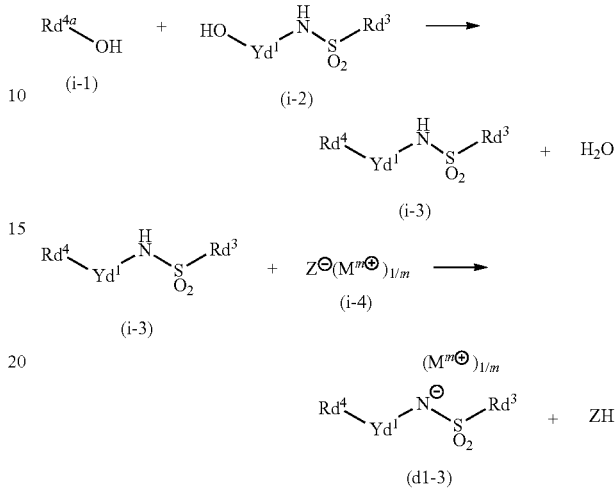

Cation Moiety:

In the formula (d1-3), $M^{m+}$ represents an m-valent organic cation and is the same as $M^{m+}$ in the formula (d1-1).

The component (d1-3) may be used solely or in combination of two or more kinds thereof.

As the component (D1), any one kind of the components (d1-1) to (d1-3) may be used, or a combination of two or more kinds thereof may also be used.

The content of the component (D1) is preferably from 0.5 to 10 parts by mass, more preferably from 0.5 to 8 parts by mass, and still more preferably from 1 to 8 parts by mass, based on 100 parts by mass of the component (A).

When the content of the component (D1) is the preferred lower limit value or more, especially satisfactory lithography properties and resin pattern shape are obtained. On the other hand, when it is not more than the upper limit value, the sensitivity can be maintained at a satisfactory level, and the throughput becomes excellent.

{Production Method of Component (D1)}

The production method of the components (d1-1) and (d1-2) is not particularly limited, and the components (d1-1) and (d1-2) can be produced by conventional methods.

In addition, the production method of the component (d1-3) is not particularly limited. For example, in the case where $Rd^4$ in the formula (d1-3) is a group having an oxygen atom on the terminal thereof which is bonded to $Yd^1$, the compound (d1-3) represented by the general formula (d1-3) is produced by allowing a compound (i-1) represented by the following general formula (i-1) and a compound (i-2) represented by the following general formula (i-2) to react with each other to obtain a compound (i-3) represented by the following general formula (i-3) and then allowing the compound (i-3) to react with $Z^-(M^{m+})_{1/m}$ (i-4) having a desired cation $M^{m+}$.

In the foregoing formulae, $Rd^4$, $Yd^1$, $Rd^3$, and $M^{m+}$ are the same as $Rd^4$, $Yd^1$, $Rd^3$, and $M^{m+}$ in the general formula (d1-3), respectively. $Rd^{4a}$ represents a group in which the terminal oxygen atom is removed from $Rd^4$; and $Z^-$ represents a counter anion.

First of all, the compound (i-1) and the compound (i-2) are allowed to react with each other to obtain the compound (i-3).

In the formula (i-1), $Rd^{4a}$ represents a group in which the terminal oxygen atom is removed from $Rd^4$. In the formula (i-2), $Yd^1$ and $Rd^3$ are the same as that described above.

As each of the compound (i-1) and the compound (i-2), a commercially available compound may be used, or the compound may be synthesized.

Though the method for allowing the compound (i-1) and the compound (i-2) to react with each other to obtain the compound (i-3) is not particularly limited, it can be conducted, for example, by allowing the compound (i-1) and the compound (i-2) to react with each other in an organic solvent in the presence of an appropriate acid catalyst, followed by washing and recovering a reaction mixture.

The acid catalyst in the above-described reaction is not particularly limited, and examples thereof include toluenesulfonic acid. The amount of the acid catalyst used is preferably from about 0.05 to 5 moles per mole of the compound (i-2).

As the organic solvent which is used in the above-described reaction, any organic solvent capable of dissolving the compound (i-1) and the compound (i-2) that are the raw materials can be used, and specifically, examples thereof include toluene. The amount of the organic solvent used is preferably from 0.5 to 100 parts by mass, and more preferably from 0.5 to 20 parts by mass, relative to the amount of the compound (i-1). The solvent may be used solely or in combination of two or more thereof.

In general, the amount of the compound (i-2) used in the above-described reaction is preferably from 0.5 to 5 moles, and more preferably from about 0.8 to 4 moles, per mole of the compound (i-1).

The reaction time in the above-described reaction varies depending upon the reactivity between the compound (i-1) and the compound (i-2), the reaction temperature, or the like.

However, in general, the reaction time is preferably from 1 to 80 hours, and more preferably from 3 to 60 hours.

The reaction temperature in the above-described reaction is preferably from about 20° C. to 200° C., and more preferably from about 20° C. to 150° C.

Subsequently, the obtained compound (i-3) is allowed to react with the compound (i-4), thereby obtaining the compound (d1-3).

In the formula (i-4), $M^{m+}$ is the same as that described above, and $Z^-$ represents a counter anion. $Z^-$ is not particularly limited, and known anions can be used.

Though the method for allowing the compound (i-3) and the compound (i-4) to react with each other to obtain the compound (d1-3) is not particularly limited, it can be conducted, for example, by dissolving the compound (i-3) in an appropriate organic solvent and water in the presence of an appropriate alkali metal hydroxide, followed by addition of the compound (i-4) and stirring.

The alkali metal hydroxide which is used in the above-described reaction is not particularly limited, and examples thereof include sodium hydroxide and potassium hydroxide. The amount of the alkali metal hydroxide used is preferably from about 0.3 to 3 moles per mole of the compound (i-3).

Examples of the organic solvent which is used in the above-described reaction include dichloromethane, chloroform, and ethyl acetate. The amount of the organic solvent used is preferably from 0.5 to 100 parts by mass, and more preferably from 0.5 to 20 parts by mass, relative to the compound (i-3). The solvent may be used solely or in combination of two or more kinds thereof.

In general, the amount of the compound (i-4) which is used in the above-described reaction is preferably from about 0.5 to 5 moles, and more preferably from about 0.8 to 4 moles, per mole of the compound (i-3).

The reaction time in the above-described reaction varies depending upon the reactivity between the compound (i-3) and the compound (i-4), the reaction temperature, or the like. However, in general, the reaction time is preferably from 1 to 80 hours, and more preferably from 3 to 60 hours.

The reaction temperature in the above-described reaction is preferably from about 20° C. to 200° C., and more preferably from about 20° C. to 150° C.

After completion of the reaction, the compound (d1-3) in the reaction solution may be isolated and purified. The isolation and purification can be conducted by a conventional method. For example, any of concentration, solvent extraction, distillation, crystallization, recrystallization, or chromatography can be used solely or in combination of two or more kinds thereof.

The structure of the thus obtained compound (d1-3) can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis, and X-ray crystal diffraction.

The content of the component (D1) is preferably from 0.5 to 10.0 parts by mass, more preferably from 0.5 to 8.0 parts by mass, and still more preferably from 1.0 to 8.0 parts by mass, based on 100 parts by mass of the component (A). When the content of the component (D1) is the lower limit value of the foregoing range or more, especially satisfactory lithography properties and resin pattern shape are obtained. On the other hand, when it is not more than the upper limit value of the foregoing range, the sensitivity can be maintained at a satisfactory level, and the throughput becomes excellent.

(Component (D2))

The component (D) may contain other basic compound component (hereinafter referred to as "component (D2)") which does not fall under the definition of the component (D1).

The component (D2) is not particularly limited so long as it is a compound which becomes relatively basic to the component (B), acts as an acid diffusion inhibitor, and does not fall under the definition of the component (D1). As the component (D2), any of the conventionally known compounds may be selected for use. Above all, an aliphatic amine, particularly a secondary aliphatic amine or a tertiary aliphatic amine is preferable.

The term "aliphatic amine" refers to an amine having one or more aliphatic groups, and the aliphatic group preferably has from 1 to 12 carbon atoms.

Examples of the aliphatic amine include an amine in which at least one hydrogen atom of ammonia ($NH_3$) is substituted with an alkyl group or a hydroxyalkyl group each having not more than 12 carbon atoms (i.e., an alkylamine or an alkylalcoholamine), and a cyclic amine.

Specific examples of the alkylamine and the alkylalcoholamine include a monoalkylamine such as n-hexylamine, n-heptylamine, n-octylamine, n-nonylamine, and n-decylamine; a dialkylamine such as diethylamine, di-n-propylamine, di-n-heptylamine, di-n-octylamine, and dicyclohexylamine; a trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and an alkylalcoholamine such as diethanolamine, triethanolamine, diisopropanolamine, triisopropanolamine, di-n-octanolamine, and tri-n-octanolamine. Of these, a trialkylamine having from 5 to 10 carbon atoms is preferable, and tri-n-pentylamine or tri-n-octylamine is especially preferable.

Examples of the cyclic amine include a heterocyclic compound containing a nitrogen atom as a hetero atom. The heterocyclic compound may be either a monocyclic compound (aliphatic monocyclic amine) or a polycyclic compound (aliphatic polycyclic amine).

Specifically, examples of the aliphatic monocyclic amine include piperidine and piperazine.

The aliphatic polycyclic amine preferably has from 6 to 10 carbon atoms. Specifically, examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amine include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate, with triethanolamine triacetate being preferable.

In addition, an aromatic amine may also be used as the component (D2).

Examples of the aromatic amine include aniline, pyridine, 4-dimethylaminopyridine, pyrrole, indole, pyrazole, imidazole, and derivatives thereof; and also diphenylamine, triphenylamine, tribenzylamine, 2,6-diisopropylaniline, and N-tert-butoxycarbonylpyrrolidine.

The component (D2) may be used solely or in combination of two or more kinds thereof.

In general, the component (D2) is used in an amount in the range of from 0.01 to 5.0 parts by mass based on 100 parts by mass of the component (A). When the amount of the component (D) falls within the foregoing range, the resist pattern shape and the post exposure stability of the latent image formed by the pattern-wise exposure of the resist layer are enhanced.

The component (D) may be used solely or in combination of two or more kinds thereof. In the case where the resist composition according to the present invention contains the component (D), the amount of the component (D) is preferably from 0.1 to 15 parts by mass, more preferably from 0.3 to 12 parts by mass, and still more preferably from 0.5 to 10 parts by mass, based on 100 parts by mass of the component (A). When the amount of the component (D) is the lower limit value of the foregoing range or more, at the time of forming a resist composition, the lithography properties such as roughness are more enhanced. In addition, a more satisfactory resist pattern shape is obtained. On the other hand, when the amount of the component (D) is not more than the upper limit of the foregoing range, the sensitivity can be maintained at a satisfactory level, and throughput becomes excellent.

<Optional Component>
[Component (E)]

For the purposes of preventing any deterioration in sensitivity and enhancing the resist pattern shape and the post exposure stability of the latent image formed by the pattern-wise exposure of the resist layer, the resist composition according to the present invention can contain, as an optional component, at least one compound (E) (hereafter referred to as "component (E)") selected from the group consisting of an organic carboxylic acid and a phosphorus oxo acid or a derivative thereof.

Suitable examples of the organic carboxylic acid include acetic acid, malonic acid, citric acid, malic acid, succinic acid, benzoic acid, and salicylic acid.

Examples of the phosphorus oxo acid include phosphoric acid, phosphonic acid, and phosphinic acid, with phosphonic acid being especially preferable.

Examples of the phosphorus oxo acid derivative include an ester in which a hydrogen atom of the above-described oxo acid is substituted with a hydrocarbon group. Examples of the hydrocarbon group include an alkyl group having from 1 to 5 carbon atoms and an aryl group having from 6 to 15 carbon atoms.

Examples of the phosphoric acid derivative include an phosphoric acid ester such as di-n-butyl phosphate and diphenyl phosphate.

Examples of the phosphonic acid derivative include a phosphonic acid ester such as dimethylphosphonate, di-n-butyl phosphonate, phenyl phosphonate, diphenyl phosphonate, and dibenzyl phosphonate.

Examples of the phosphinic acid derivative include a phosphinic acid ester and phenylphosphinic acid.

The component (E) may be used solely or in combination of two or more kinds thereof.

In general, the component (E) is used in an amount in the range of from 0.01 to 5.0 parts by mass based on 100 parts by mass of the component (A).

<Optional Component>
[Component (F)]

For the purpose of imparting water repellency to the resist film, the resist composition according to the present invention may contain a fluorine additive (hereinafter referred to as "component (F)").

As the component (F), fluorine-containing polymer compounds disclosed in, for example, JP-A-2010-002870, JP-A-2010-032994, JP-A-2010-277043, JP-A-2011-13569, and JP-A-2011-128226 can be used.

More specifically, examples of the compound (F) include a polymer having a constituent unit (f1) represented by the following formula (f1-1). The polymer is preferably a polymer (homopolymer) composed of only the constituent unit (f1) represented by the following formula (f1-1); a copolymer of the constituent unit (f1) represented by the following formula (f1-1) and the constituent unit (a1); or a copolymer of the constituent unit (f1) represented by the following formula (f1-1), a constituent unit derived from acrylic acid or methacrylic acid, and the constituent unit (a1). Here, the constituent unit (a1) which is copolymerized with the constituent unit (f1) represented by the following formula (f1-1) is preferably 1-ethyl-1-cyclooctyl (meth)acrylate or the constituent unit represented by the formula (a1-2-01).

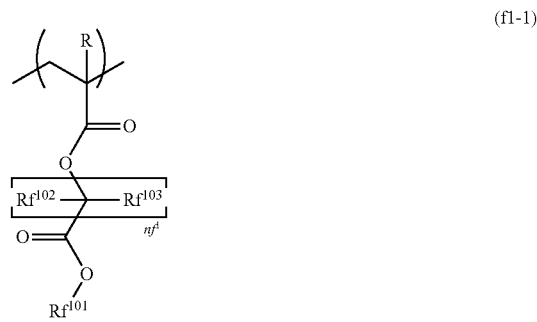

(f1-1)

In the foregoing formula, R is the same as that described above; each of $Rf^{102}$ and $Rf^{103}$ independently represents a hydrogen atom, a halogen atom, an alkyl group having from 1 to 5 carbon atoms, or a halogenated alkyl group having from 1 to 5 carbon atoms, and $Rf^{102}$ and $Rf^{103}$ may be the same as or different from each other; $nf^1$ represents an integer of from 1 to 5; and $Rf^{101}$ represents an organic group containing a fluorine atom.

In the formula (f1-1), R bonded to the carbon atom at the α-position is the same as that described above. R is preferably a hydrogen atom or a methyl group.

In the formula (f1-1), examples of the halogen atom represented by $Rf^{102}$ and $Rf^{103}$ include a fluorine atom, a chlorine atom, a bromine atom, and an iodine atom, with a fluorine atom being preferable. Examples of the alkyl group having from 1 to 5 carbon atoms, as represented by $Rf^{102}$ and $Rf^{103}$, include the same groups as those exemplified above for the alkyl group having from 1 to 5 carbon atoms, as represented by R. Of these, a methyl group or an ethyl group is preferable. Specifically, examples of the halogenated alkyl group having from 1 to 5 carbon atoms, as represented by $Rf^{102}$ and $Rf^{103}$, include a group in which a part of all of the hydrogen atoms of the above-described alkyl group having from 1 to 5 carbon atoms are substituted with a halogen atom. Examples of the halogen atom include a fluorine atom, a chlorine atom, a bromine atom, and an iodine atom, with a fluorine atom being preferable. Above all, as $Rf^{102}$ and $Rf^{103}$, a hydrogen atom, a fluorine atom, or an alkyl group having from 1 to 5 carbon atoms is preferable, and a hydrogen atom, a fluorine atom, a methyl group, or an ethyl group is more preferable.

In the formula (f1-1), $nf^1$ represents an integer of from 1 to 5 and is preferably an integer of from 1 to 3, and more preferably 1 or 2.

In the formula (f1-1), $Rf^{101}$ represents an organic group containing a fluorine atom and is preferably a hydrocarbon group containing a fluorine atom.

The hydrocarbon group containing a fluorine atom may be any of a linear hydrocarbon group, a branched hydrocarbon group, or a cyclic hydrocarbon group, and the carbon number thereof is preferably from 1 to 20, more preferably from 1 to 15, and especially preferably from 1 to 10.

In addition, in the hydrocarbon group containing a fluorine atom, it is preferable that 25% or more of the hydrogen atoms in the hydrocarbon group are fluorinated; it is more preferable that 50% or more of the hydrogen atoms in the hydrocarbon group are fluorinated; and in view of the fact that the hydrophobicity of the resist film at the time of immersion exposure is increased, it is especially preferable that 60% or more of the hydrogen atoms in the hydrocarbon group are fluorinated.

Above all, $Rf^{101}$ is especially preferably a fluorinated hydrocarbon group having from 1 to 5 carbon atoms, and most preferably a trifluoromethyl group, $-CH_2-CF_3$, $-CH_2-CF_2-CF_3$, $-CH(CF_3)_2$, $-CH_2-CH_2-CF_3$, or $-CH_2-CH_2-CF_2-CF_2-CF_2-CF_3$.

A mass average molecular weight (Mw) (as reduced into polystyrene by means of gel permeation chromatography) of the component (F) is preferably from 1,000 to 50,000, more preferably from 5,000 to 40,000, and most preferably from 10,000 to 30,000. When the mass average molecular weight of the component (F) is not more than the upper limit value of this range, a satisfactory solubility in a resist solvent for the use as a resist is exhibited, whereas when it is the lower limit value of this range or more, the dry etching resistance and the cross-sectional resist pattern shape are satisfactory.

A degree of dispersion (Mw/Mn) of the component (F) is preferably from 1.0 to 5.0, more preferably from 1.0 to 3.0, and most preferably from 1.2 to 2.5.

The component (F) may be used solely or in combination of two or more kinds thereof.

The component (F) is used in a proportion of from 0.5 to 10 parts by mass based on 100 parts by mass of the component (A).

[Other Additives]

In the resist composition according to the present invention, if desired, miscible additives, for example, an additional resin for improving the performance of the resist film, a dissolution inhibitor, a plasticizer, a stabilizer, a coloring agent, a halation inhibitor, a dye, etc. can be properly added and contained.

[Component (S)]

The resist composition according to the present invention can be produced by dissolving the materials in an organic solvent (hereafter referred to as "component (S)").

The component (S) may be any organic solvent so long as it is able to dissolve the components to be used to give a uniform solution, and any one or two or more kinds of organic solvents can be appropriately selected from those which have been conventionally known as solvents for a chemically amplified resist.

Examples of the component (S) include a lactone such as γ-butyrolactone (GBL); a ketone such as acetone, methyl ethyl ketone (MEK), cyclohexanone, methyl-n-pentyl ketone, methyl isopentyl ketone, and 2-heptanone; a polyhydric alcohol such as ethylene glycol, diethylene glycol, propylene glycol, and dipropylene glycol; a compound having an ester bond, such as ethylene glycol monoacetate, diethylene glycol monoacetate, propylene glycol monoacetate, and dipropylene glycol monoacetate; a polyhydric alcohol derivative including a compound having an ether bond, such as a monoalkyl ether (e.g., monomethyl ether, monoethyl ether, monopropyl ether, or monobutyl ether) or monophenyl ether of the above-described polyhydric alcohol or compound having an ester bond [of these, propylene glycol monomethyl ether acetate (PGMEA) or propylene glycol monomethyl ether (PGME) is preferable]; a cyclic ether such as dioxane; an ester such as methyl lactate, ethyl lactate (EL), methyl acetate, ethyl acetate, butyl acetate, methyl pyruvate, ethyl pyruvate, methyl methoxypropionate, and ethyl ethoxypropionate; an aromatic organic solvent such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; and dimethyl sulfoxide (DMSO).

Such an organic solvent may be used solely, or may be used as a mixed solvent of two or more kinds thereof.

Above all, PGMEA, PGME, γ-butyrolactone, or EL is preferable.

In addition, a mixed solvent obtained by mixing PGMEA with a polar solvent is also preferable. Though a blending ratio (mass ratio) of the mixed solvent may be appropriately determined while taking into consideration the compatibility of PGMEA with the polar solvent, it is preferably in the range of from 1/9 to 9/1, and more preferably from 2/8 to 8/2.

More specifically, in the case where EL or cyclohexanone is blended as the polar solvent, a mass ratio of PGMEA to EL or cyclohexanone is preferably from 1/9 to 9/1, and more preferably from 2/8 to 8/2. In addition, in the case where PGME is blended as the polar solvent, a mass ratio of PGMEA to PGME is preferably from 1/9 to 9/1, more preferably from 2/8 to 8/2, and still more preferably from 3/7 to 7/3.

In addition, as the component (S), besides, a mixed solvent of at least one selected from PGMEA and EL with γ-butyrolactone is also preferable. In that case, a mixing proportion is preferably from 70/30 to 95/5 in terms of a mass ratio of the former to the latter.

The amount of the component (S) used is not particularly limited, and it is properly set in a concentration at which coating on a substrate or the like can be conducted, according to the thickness of the coating film. In general, the component (S) is used such that the solid content of the resist composition falls within the range of from 1 to 20% by mass, and preferably from 2 to 15% by mass.

<<Method for Forming Resist Pattern>>

The method for forming a resist pattern according to the present invention includes a step of forming a resist film using the resist composition according to the present invention on a support, a step of exposing the resist film, and a step of developing the resist film to form a resist pattern.

The method for forming a resist pattern according to the present invention can be, for example, conducted in the following manner.

First of all, the resist composition according to the present invention is applied on a substrate using a spinner or the like, and a bake (post applied bake (PAB)) treatment is conducted under temperature conditions of, for example, from 80 to 150° C. for from 40 to 120 seconds, and preferably from 60 to 90 seconds, thereby forming a resist film.

Subsequently, using an exposure apparatus, for example, an ArF exposure apparatus, an electron beam drawing apparatus, or an EUV exposure apparatus, the resist film is exposed through a mask having a prescribed pattern formed thereon (mask pattern) or selectively exposed without using a mask pattern by drawing by means of direction irradiation with electron beams, or the like, and thereafter, a bake (post exposure bake (PEB)) treatment is conducted under temperature conditions of, for example, from 80 to 150° C. for from 40 to 120 seconds, and preferably from 60 to 90 seconds.

Subsequently, the resist film is subjected to a development treatment.

The development treatment is conducted using an alkali developing solution in the case of an alkali developing process, or conducted using a developing solution containing an organic solvent (organic developing solution) in the case of a solvent developing process.

After the development treatment, it is preferable to conduct a rinse treatment. In the case of an alkali developing process, it is preferable to conduct a water rinse using pure water. In the case of an alkali developing process, it is preferable to conduct a rinse treatment using a rinse liquid containing an organic solvent.

In the case of a solvent developing process, after the development treatment or rise treatment, a treatment of removing the developing solution or rinse liquid deposited on the pattern with a supercritical fluid may be conducted.

After the development treatment or rinse treatment, drying is conducted. In addition, after the development treatment, a bake treatment (post bake) may be conducted as the case may be. In this way, a resist pattern can be obtained.

The support is not specifically limited, and a conventionally known support can be used. For example, substrates for electronic components, and such substrates having wiring patterns formed thereon can be exemplified. More specifically, examples thereof include a metal-made substrate such as silicon wafer, copper, chromium, iron, and aluminum; and a glass substrate. As a material for the wiring pattern, for example, copper, aluminum, nickel, or gold can be used.

In addition, as the support, any one of the above-described supports having an inorganic and/or organic film provided thereon may be used. Examples of the inorganic film include an inorganic antireflection film (inorganic BARC). Examples of the organic film include an organic film such as an organic antireflection film (organic BARC) and a lower layer organic film in the multilayer resist method.

Here, the multilayer resist method is a method in which at least one organic film (lower layer organic film) and at least one resist film (upper layer resist film) are provided on a substrate, and the lower layer organic film is subjected to patterning while using, as a mask, a resist pattern formed on the upper layer resist film. According to this multilayer resist method, a pattern with a high aspect ratio can be formed. That is, according to the multilayer resist method, since a prescribed thickness can be ensured by the lower layer organic film, the resist film can be made thin, so that it becomes possible to form a fine pattern with a high aspect ratio.

Basically, the multilayer resist method is classified into a method of forming a two-layer structure of an upper resist film and a lower organic film (two-layer resist method); and a method of forming a multilayer structure of three or more layers, in which one or more interlayers (e.g., a metal thin film) is provided between an upper resist film and a lower organic film (three-layer resist method).

The wavelength to be used for exposure is not particularly limited, and the exposure can be conducted using radiations such as ArF excimer laser, KrF excimer laser, $F_2$ excimer laser, EUV (extreme ultraviolet rays), VUV (vacuum ultraviolet rays), EB (electron beams), X-rays, and soft X-rays. The resist composition is high in usefulness for KrF excimer laser, ArF excimer laser, EB, or EUV.

The exposure method of the resist film can be conducted by either general exposure (dry exposure) which is conducted in air or an inert gas such as nitrogen or liquid immersion lithography.

The liquid immersion lithography is an exposure method in which a region between a resist film and a lens located at the lowermost position of an exposure apparatus is previously filled with a solvent (liquid immersion medium) having a larger refractive index than a refractive index of air, and the exposure (immersion exposure) is conducted in that state.

The immersion medium is preferably a solvent having a refractive index larger than a refractive index of air and smaller than a refractive index of a resist film to be exposed. The refractive index of such a solvent is not particularly limited so long as it falls within the foregoing range.

Examples of the solvent having a refractive index larger than a refractive index of air and smaller than a refractive index of the resist film include water, a fluorine-based inert liquid, a silicon-based solvent, and a hydrocarbon-based solvent.

Specific examples of the fluorine-based inert liquid include a liquid composed mainly of a fluorine-based compound such as $C_3HCl_2F_5$, $C_{1-4}F_9OCH_3$, $C_4F_9OC_2H_5$, and $C_5H_3F_7$. Of these, fluorine-based inert liquids having a boiling point of from 70 to 180° C. are preferable, and those having a boiling point of from 80 to 160° C. are more preferable. A fluorine-based inert liquid having a boiling point falling within the foregoing range is preferable because after completion of the exposure, the removal of the medium used for the liquid immersion can be conducted by a simple method.

As the fluorine-based inert liquid, a perfluoroalkyl compound in which all of hydrogen atoms of an alkyl group are substituted with a fluorine atom is preferable. Specifically, examples of the perfluoroalkyl compound include a perfluoroalkylether compound and a perfluoroalkylamine compound.

Furthermore, specifically, examples of the perfluoroalkylether compound include perfluoro(2-butyl-tetrahydrofuran)

(boiling point: 102° C.); and examples of the perfluoroalkylamine compound include perfluorotributylamine (boiling point: 174° C.)

As the liquid immersion medium, water is preferably used in terms of cost, safety, environmental issue, and versatility.

Examples of an alkali developing solution which is used in an alkali developing process include a 0.1 to 10% by mass aqueous solution of tetramethylammonium hydroxide (TMAH).

As the organic solvent which the organic developing solution used for the development treatment in a solvent developing process contains, any organic solvent can be used so long as it is able to dissolve the component (A) (component (A) before the exposure), and the organic solvent may be properly selected among known organic solvents. Specifically, polar solvents such as ketone-based solvents, ester-based solvents, alcohol-based solvents, amide-based solvents, and ether-based solvents; and hydrocarbon-based solvents can be used.

The organic developing solution can be blended with a known additive, if desired. Examples of the additive include a surfactant. Though the surfactant is not particularly limited, examples thereof include an ionic or nonionic fluorine-based and/or silicon-based surfactant.

In the case of blending the surfactant, its blending amount is usually from 0.001 to 5% by mass, preferably from 0.005 to 2% by mass, and more preferably from 0.01 to 0.5% by mass, relative to the whole amount of the organic developing solution.

It is possible to carry out the development treatment by a known development method. Examples of the development treatment include a method of dipping a support in a developing solution for a certain period of time (dip method); a method of raising a developing solution on the surface of a support due to a surface tension and making it stationary for a certain period of time (puddle method); a method of spraying a developing solution onto the surface of a support (spray method); and a method of continuously dispensing a developing solution onto a support rotating at a constant rate while scanning a developing solution dispense nozzle at a constant rate (dynamic dispense method).

As the organic solvent which the rinse liquid used for the rinse treatment after the development treatment in a solvent developing process contains, among the organic solvents exemplified above for the organic solvent contained in the organic developing solution, an organic solvent which hardly dissolves the resist pattern can be properly selected and used. In general, at least one solvent selected from a hydrocarbon-based solvent, a ketone-based solvent, an ester-based solvent, an alcohol-based solvent, an amide-based solvent, and an ether-based solvent is used. Of these, at least one solvent selected from a hydrocarbon-based solvent, a ketone-based solvent, an ester-based solvent, an alcohol-based solvent, and an amide-based solvent is preferable; at least one solvent selected from an alcohol-based solvent and an ester-based solvent is more preferable; and an alcohol-based solvent is especially preferable.

The rinse treatment (wash treatment) using a rinse liquid can be carried out by a known rinse method. Examples of the method include a method of continuously dispensing a rinse liquid onto a support rotating at a constant rate (rotatory applying method); a method of dipping a support in a rinse liquid for a certain period of time (dip method); and a method of spraying a rinse liquid onto the surface of a support (spray method).

Since the resist composition according to the present invention contains the acid generator (B1), in the pattern formation of a resist film using the resist composition, excellent lithography properties such as LWR, EL margin, and MEF are exhibited. As the reasons for this, it may be considered that the contrast in acid generation concentration between exposed areas and unexposed areas of the resist film is sufficiently increased due to the following mechanisms [1] and [2], and the like.

[1] The acid generator (B1) acts as a quencher of an acid (proton) in unexposed areas of the resist film and acts as an acid generator in exposed areas of the resist film.

[2] An acid necessary for the pattern formation is generated from the acid generator (B1) in a sufficiently exposed portion of the resist film. On the other hand, in a portion of the film corresponding to an edge of an opening of an exposure mask, non-intended exposure is conducted by light which has come out from the opening, and even when a small amount of an acid is generated from the acid generator (B1), since sites capable of generating an acid and nitrogen atoms having proton acceptor properties exist in the same molecule in the acid generator (B1), the acid of a small amount is trapped by the nitrogen atom, and the diffusion into the resist film is suppressed.

<<Compound>>

The compound according to the present invention is a compound having nitrogen atoms having proton acceptor properties and sites capable of generating an acid upon exposure in the same molecule thereof, with the number of the sites being larger than the number of the nitrogen atoms. Such a compound is preferably a compound represented by the following general formula (b1-1'). The subject compound is hereinafter referred to as "compound (b1-1')".

(b1-1')

In the formula (b1-1'), $R^1$ represents a group having an anion site capable of generating an acid upon exposure;

$R^2$ represents a hydrogen atom or a substituent not having the anion site;

$W^1$ represents a z-valent functional group containing n nitrogen atoms having proton acceptor properties;

$z=(x+y)$, $(n+1) \leq x \leq z$, and $0 \leq y \leq (z-x)$; and $M^{m+}$ represents an m-valent counter cation.

In the formula (b1-1'), $R^1$, $R^2$, $W^1$, x, y, z, and n other than the counter cation represented by $M'^{m+}$ are the same as those in the formula (b1-1). Thus, explanations thereof are omitted.

Suitable examples of the anion moiety in the formula (b1-1') include the same anion moieties as those exemplified above for the formulae (b1-1) and (b1-2).

$M'^{m+}$ represents an m-valent counter cation and includes the organic cation represented by $M^{m+}$ as described above.

Such $M'^{m+}$ is not particularly limited, and examples thereof include, in addition to the above-described organic cation, an inorganic cation.

Examples of the inorganic cation include metal cations such as an alkali metal ion, for example, a sodium ion, a lithium ion, and a potassium ion, and an alkaline earth metal ion, for example, a magnesium ion and a calcium ion, with a sodium ion or a lithium ion being preferable.

Examples of the organic cation include the same organic cations as those exemplified above for $M^{m+}$.

EXAMPLES

The present invention is more specifically described below with reference to the following Examples, but it should not be construed that the present invention is limited to these Examples.

Synthesis Example 1 of Compound 3,5-Pyridinedicarboxylic acid (5.0 g), A-1 (12.2 g), and pyridine (150 g) were added and stirred in a nitrogen atmosphere. Diisopropylcarbodiimide (16.8 g) was added dropwise thereto. Thereafter, the mixture was stirred at room temperature for 24 hours, and pure water (150 g) was then added, thereby stopping the reaction. Thereafter, the resulting mixture was washed three times with t-butyl methyl ether (500 g) to obtain 147 g of an 8.3 wt % aqueous solution of QA-1.

The obtained compound was subjected to NMR measurement, and its structure was identified from the following results.

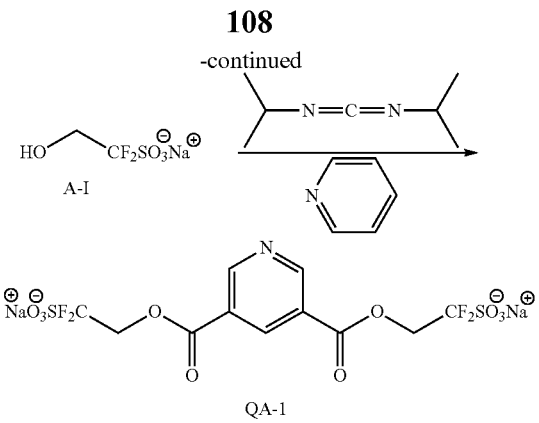

Subsequently, triphenyl sulfonium bromide (5.8 g) and dichloromethane (35 g) were added to the 8.3 wt % aqueous solution of QA-1 (42.0 g), and the mixture was stirred at room temperature for one hour. Thereafter, the reaction mixture was subjected to liquid separation to recover an organic phase, which was then washed five times with pure water. Thereafter, the solvent was distilled off under reduced pressure to obtain 6.8 g of a compound represented by the following formula Q-1.

The obtained compound was subjected to NMR measurement, and its structure was identified from the following results.

$^1$H-NMR (400 MHz, DMSO-d6): δ (ppm)=9.36 (2H, ArH), 8.74 (1H, ArH), 7.74-7.90 (m, 30H, ArH), 4.92 (4H, CH$_2$)

$^{19}$F-NMR (376 MHz, DMSO-d6): δ (ppm)=−110.9

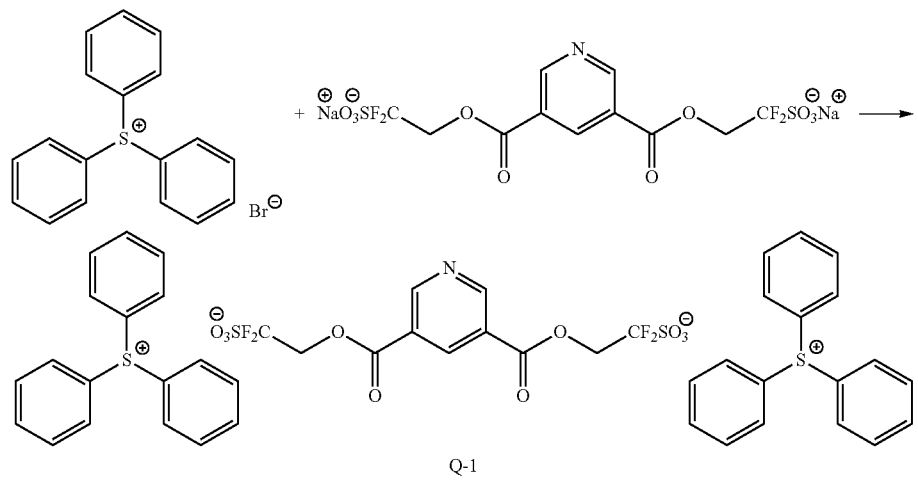

$^1$H-NMR (400 MHz, DMSO-d6): δ (ppm)=9.36 (2H, ArH), 8.74 (1H, ArH), 4.92 (4H, CH$_2$)

$^{19}$F-NMR (376 MHz, DMSO-d6): δ (ppm)=−110.9

Synthesis Example 2 of Compound

The synthesis was conducted in the same manner as that in Q-1, thereby obtain a compound represented by the following formula Q-2.

The obtained compound was subjected to NMR measurement, and its structure was identified from the following results.

$^1$H-NMR (400 MHz, DMSO-d6): δ (ppm)=9.36 (2H, ArH), 8.74 (1H, ArH), 4.92 (4H, CH$_2$), 2.59 (4H, CH$_2$), 1.49 (4H, CH$_2$), 1.30 (4H, CH$_2$), 0.871 (6H, CH$_3$)

$^{19}$F-NMR (376 MHz, DMSO-d6): δ (ppm)=−110.9

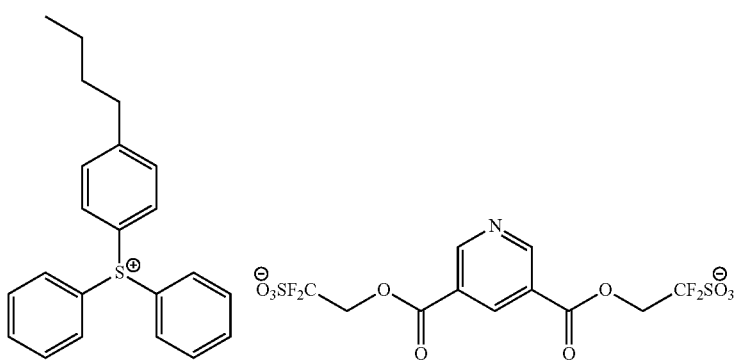
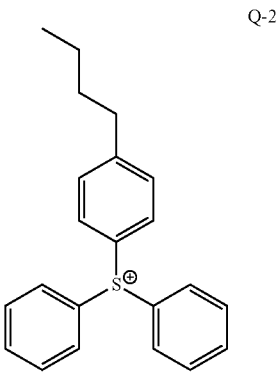

Q-2

Synthesis Example 3 of Compound 3,3′,3″-Nitrilotripropionic acid (7.0 g), A-1 (18.2 g), and pyridine (150 g) were added and stirred in a nitrogen atmosphere. Diisopropylcarbodiimide (22.7 g) was added dropwise thereto. Thereafter, the mixture was stirred at room temperature for 24 hours, and pure water (150 g) was then added, thereby stopping the reaction. Thereafter, the resulting mixture was washed three times with t-butyl methyl ether (500 g) to obtain 156.6 g of a 4.2 wt % aqueous solution of QA-2.

The obtained compound was subjected to NMR measurement, and its structure was identified from the following results.

$^1$H-NMR (400 MHz, DMSO-d6): δ (ppm)=2.482 (6H, CH$_2$), 2.856 (6H, CH$_2$), 4.90 (6H, CH$_2$CF$_2$)

$^{19}$F-NMR (376 MHz, DMSO-d6): δ (ppm)=−110.9

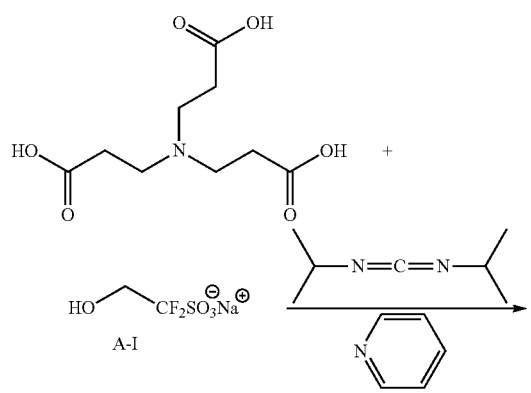

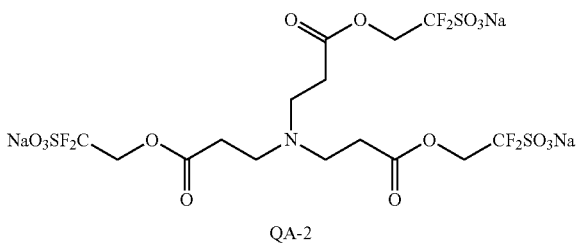

QA-2

Subsequently, triphenyl sulfonium bromide (12.36 g) and dichloromethane (145 g) were added to the 4.2 wt % aqueous solution of QA-2 (174.2 g), and the mixture was stirred at room temperature for one hour. Thereafter, the reaction mixture was subjected to liquid separation to recover an organic phase, which was then washed five times with pure water. Thereafter, the solvent was distilled off under reduced pressure to obtain 12.35 g of a compound represented by the following formula Q-3.

The obtained compound was subjected to NMR measurement, and its structure was identified from the following results.

$^1$H-NMR (400 MHz, DMSO-d6): δ (ppm)=7.74-7.90 (m, 45H, ArH), 4.90 (6H, CH$_2$CF$_2$), 2.48 (6H, CH$_2$), 2.86 (6H, CH$_2$)

$^{19}$F-NMR (376 MHz, DMSO-d6): δ (ppm)=−110.9

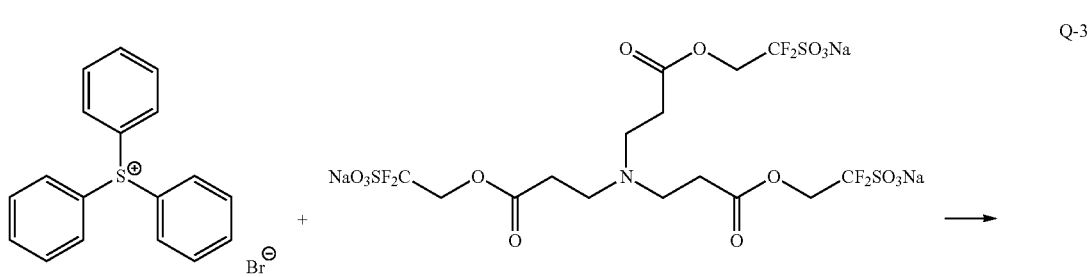

Q-3

-continued

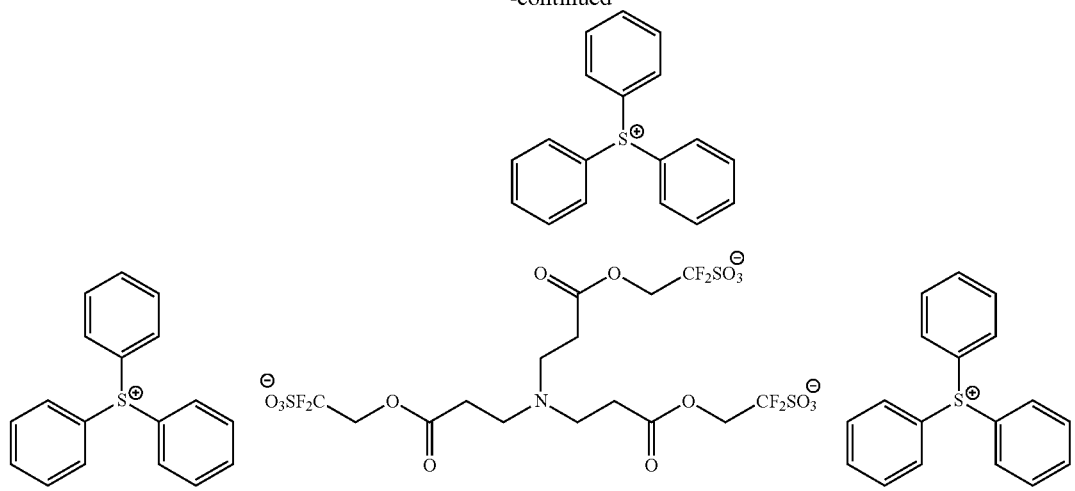

Synthesis Example of Polymers

Each of Polymer Compounds (A)-1 to (A)-6 and (F)-1 to (F)-2 as described below was synthesized in the usual way by using the respective monomers for deriving constituent units constituting each of the polymer compounds. With respect to the obtained polymer compounds, results regarding a copolymerization composition ratio (proportion (molar ratio) of each constituent unit in the structural formula) determined from a $^{13}$C-nuclear magnetic resonance spectrum (600 MHz-13C-NMR, internal standard: tetramethylsilane) and a mass average molecular weight (Mw) as reduced into standard polystyrene obtained by GPC measurement and a degree of dispersion of molecular weight (Mw/Mn) are also described below.

(Polymer Compound (A)-1)

Polymer Compound (A)-1 was obtained by conducting the polymerization in the usual way such that a copolymerization composition ratio of the respective monomers: (1)/(2)/(3)/(4) was 46/5/38/11 (molar ratio).

Mw=7,200, Mw/Mn=1.68

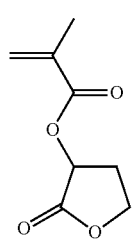

(1)

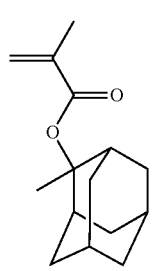

(2)

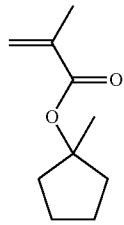

(3)

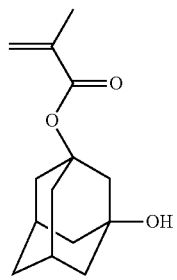

(4)

(Polymer Compound (A)-2)

Polymer Compound (A)-2 was obtained by conducting the polymerization in the usual way such that a copolymerization composition ratio of the respective monomers: (1)/(5)/(6)/(3)/(4) was 35/24/16/13/12 (molar ratio).

Mw=6,900, Mw/Mn=1.61

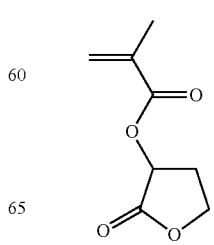

(1)

(5)

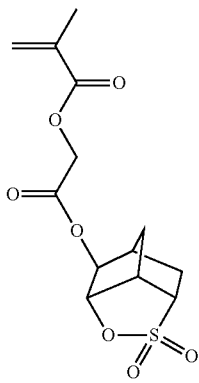

(14)

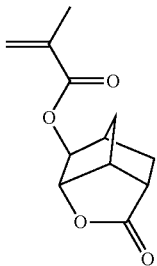

(6)

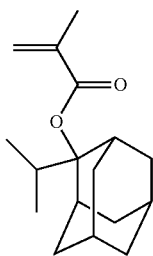

(7)

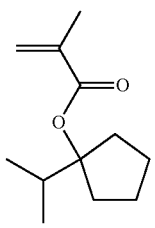

(Polymer Compound (A)-4)

Polymer Compound (A)-4 was obtained by conducting the polymerization in the usual way such that a copolymerization composition ratio of the respective monomers: (1)/(7) was 48/52 (molar ratio).

Mw=7,200, Mw/Mn=1.59

(3)

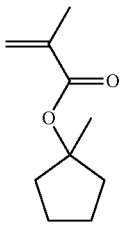

(1)

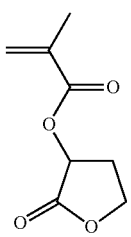

(4)

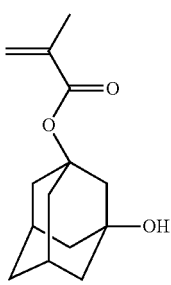

(7)

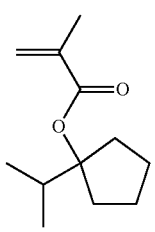

(Polymer Compound (A)-3)

Polymer Compound (A)-3 was obtained by conducting the polymerization in the usual way such that a copolymerization composition ratio of the respective monomers: (14)/(7) was 47/53 (molar ratio).

Mw=7,300, Mw/Mn=1.73

(Polymer Compound (A)-5)

Polymer Compound (A)-5 was obtained by conducting the polymerization in the usual way such that a copolymerization composition ratio of the respective monomers: (1)/(8)/(9)/(7)/(4) was 21/19/31/18/11 (molar ratio).

Mw=7,100, Mw/Mn=1.74

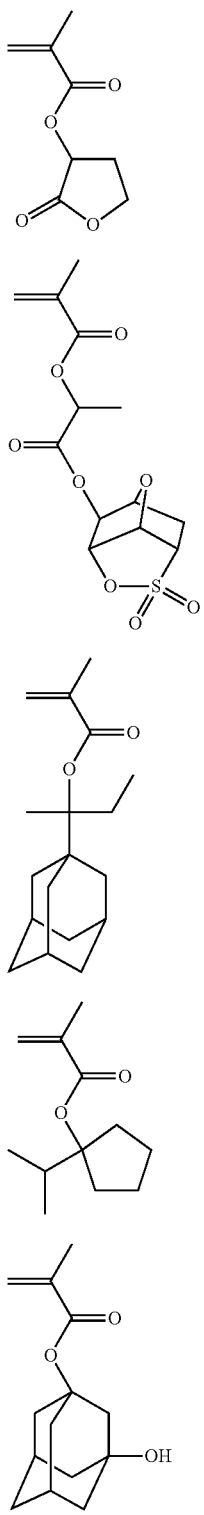
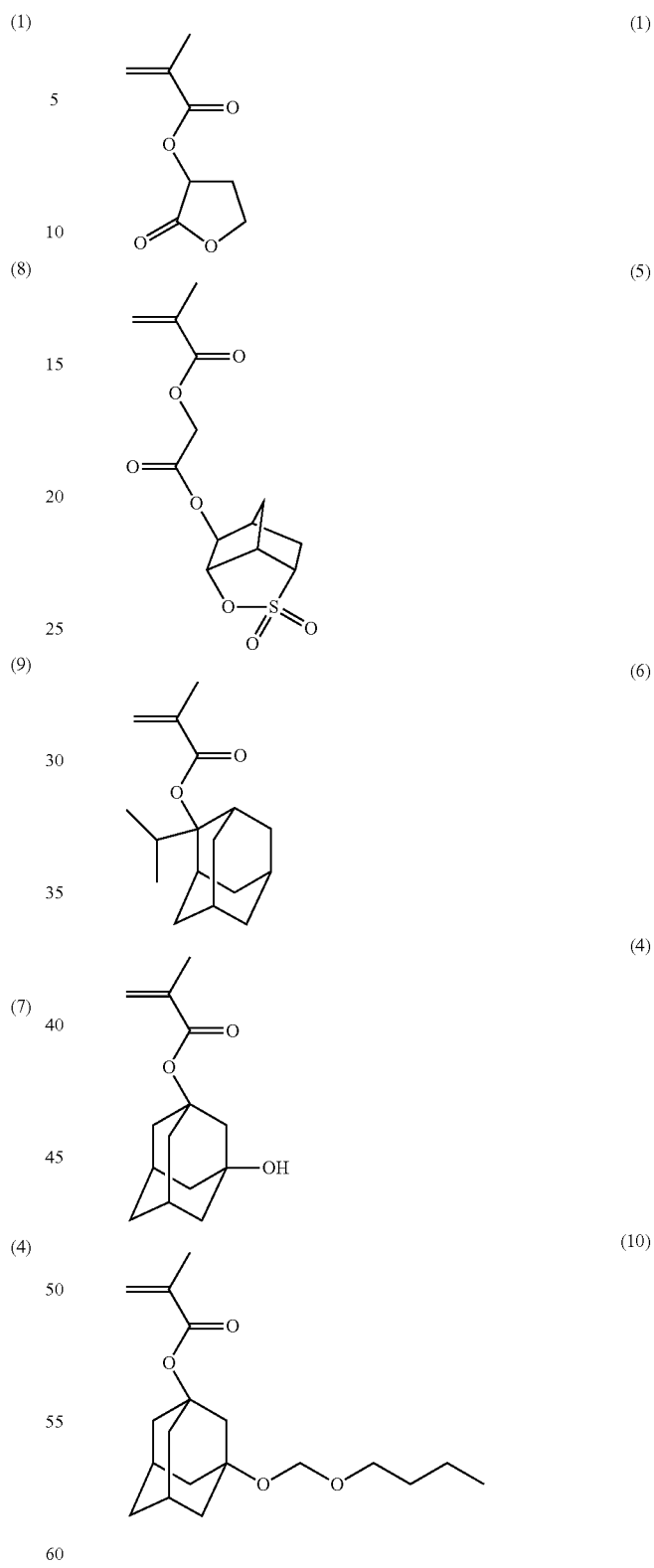

(Polymer Compound (A)-6)

Polymer Compound (A)-6 was obtained by conducting the polymerization in the usual way such that a copolymerization composition ratio of the respective monomers: (1)/(5)/(6)/(4)/(10) was 27/11/43/10/9 (molar ratio).

Mw=7,500, Mw/Mn=1.67

(Polymer Compound (F)-1)

Polymer Compound (F)-1 was obtained by conducting the polymerization in the usual way such that a copolymerization composition ratio of the respective monomers: (11)/(12) was 77/23 (molar ratio).

Mw=23,100, Mw/Mn=1.78

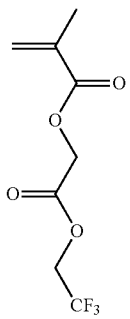

(11)

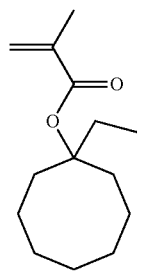

(12)

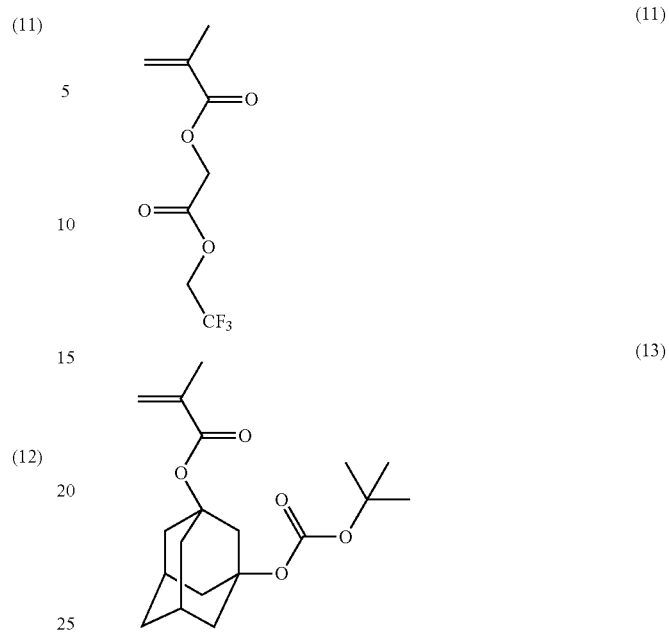

Positive-type resist compositions (Examples 1 to 7 and Comparative Examples 1 to 6) in which the respective components were blended in a blending ratio shown in the following Table 1 were prepared by using the obtained polymer compounds as described above.

TABLE 1

|  | Component (A) | Component (B) or Component (D) | Component (B2) | Component (F) | Additive | Component (S) |
|---|---|---|---|---|---|---|
| Comparative Example 1 | (A)-1 [100] | D-1 [4.2] | B2-1 [10.0] | (F)-1 [3.3] | GBL [10] | (S)-1 [2250] |
| Comparative Example 2 | (A)-1 [100] | B2-4 [4.5] | B2-1 [10.0] | (F)-1 [3.3] | GBL [10] | (S)-1 [2250] |
| Comparative Example 3 | (A)-1 [100] | D-2 [3.4] | B2-1 [10.0] | (F)-1 [3.3] | GBL [10] | (S)-1 [2250] |
| Example 1 | (A)-1 [100] | Q-1 [8.3] | B2-1 [5.0] | (F)-1 [3.3] | GBL [10] | (S)-1 [2250] |
| Example 2 | (A)-1 [100] | Q-2 [9.3] | B2-1 [5.0] | (F)-1 [3.3] | GBL [10] | (S)-1 [2250] |
| Example 3 | (A)-1 [100] | Q-3 [12.3] | B2-1 [5.0] | (F)-1 [3.3] | GBL [10] | (S)-1 [2250] |
| Example 4 | (A)-1 [100] | Q-1 [16.7] | — | (F)-1 [3.3] | GBL [10] | (S)-1 [2250] |
| Example 5 | (A)-1 [100] | Q-1 [8.3] | B2-1 [10.0] | (F)-1 [3.3] | GBL [10] | (S)-1 [2250] |
| Comparative Example 4 | (A)-2 [100] | D-1 [4.2] | B2-1 [10.0] | (F)-1 [3.3] | GBL [10] | (S)-1 [2250] |
| Comparative Example 5 | (A)-2 [100] | B2-4 [4.5] | B2-1 [10.0] | (F)-1 [3.3] | GBL [10] | (S)-1 [2250] |
| Example 6 | (A)-2 [100] | Q-1 [8.3] | B2-1 [5.0] | (F)-1 [3.3] | GBL [10] | (S)-1 [2250] |
| Comparative Example 6 | (A)-3 [100] | D-1 [4.2] | B2-1 [10.0] | (F)-1 [3.3] | GBL [10] | (S)-1 [2250] |
| Example 7 | (A)-3 [100] | Q-1 [8.3] | B2-1 [5.0] | (F)-1 [3.3] | GBL [10] | (S)-1 [2250] |

(Polymer Compound (F)-2)

Polymer Compound (F)-2 was obtained by conducting the polymerization in the usual way such that a copolymerization composition ratio of the respective monomers: (11)/(13) was 52/48 (molar ratio).

Mw=17,500, Mw/Mn=1.61

Negative-type resist compositions (Examples 8 to 11 and Comparative Examples 7 to 9) in which the respective components were blended in a blending ratio shown in the following Table 2 were prepared by using the obtained polymer compounds as described above.

TABLE 2

|  | Component (A) | Component (B) or Component (D) | Component (B2) | Component (F) | Additive | Component (S) |
|---|---|---|---|---|---|---|
| Comparative Example 7 | (A)-4 [100] | D-3 [3.5] | B2-2 [6.0] B2-3 [1.0] | (F)-2 [4.0] | GBL [100] | (S)-2 [2250] |
| Example 8 | (A)-4 [100] | Q-1 [7.2] | B2-2 [6.0] B2-3 [1.0] | (F)-2 [4.0] | GBL [100] | (S)-2 [2250] |
| Comparative Example 8 | (A)-6 [100] | D-3 [3.5] | B2-1 [10.0] | (F)-2 [4.0] | GBL [100] | (S)-2 [2250] |
| Example 9 | (A)-6 [100] | Q-1 [7.2] | B2-1 [10.0] | (F)-2 [4.0] | GBL [100] | (S)-2 [2250] |
| Example 10 | (A)-6 [100] | Q-1 [15.6] | B2-1 [5.0] | (F)-2 [4.0] | GBL [100] | (S)-2 [2250] |
| Comparative Example 9 | (A)-5 [100] | D-3 [3.5] | B2-1 [10.0] | (F)-1 [1.5] | GBL [100] | (S)-1 [2250] |
| Example 11 | (A)-5 [100] | Q-1 [7.2] | B2-1 [10.0] | (F)-1 [1.5] | GBL [100] | (S)-1 [2250] |

In Tables 1 to 2, the respective symbols show the following meanings, and the numeral values in the square brackets are a blending amount (part by mass).

(A)-1 to (A)-6: Synthesized Polymer Compounds (A)-1 to (A)-6 as described above, respectively Q-1 to Q-3: Compounds Q-1 to Q-3 as synthesized above, respectively B2-1 to B2-4: Compounds (B2-1) to (B2-4) as described below, respectively (F)-1 to (F)-2: Polymer Compounds (F)-1 to (F)-2 as described above, respectively (S)-1: Mixed solvent of PGMEA/PGME/cyclohexanone (mass ratio=45/30/25)

(S)-2: Mixed solvent of PGMEA/cyclohexanone (mass ratio=90/10)

GBL: γ-Butyrolactone

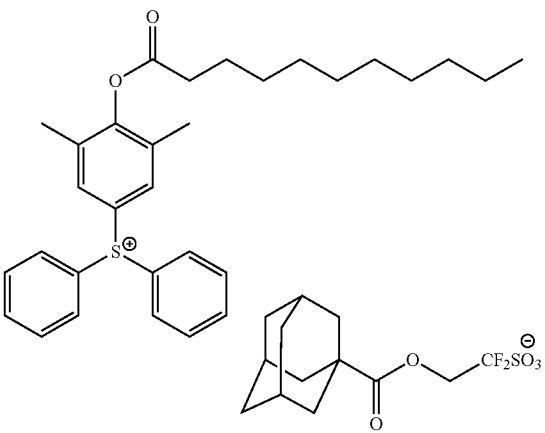

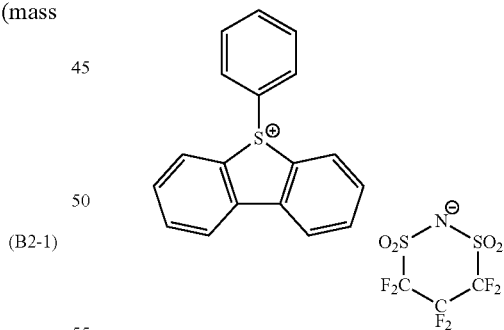

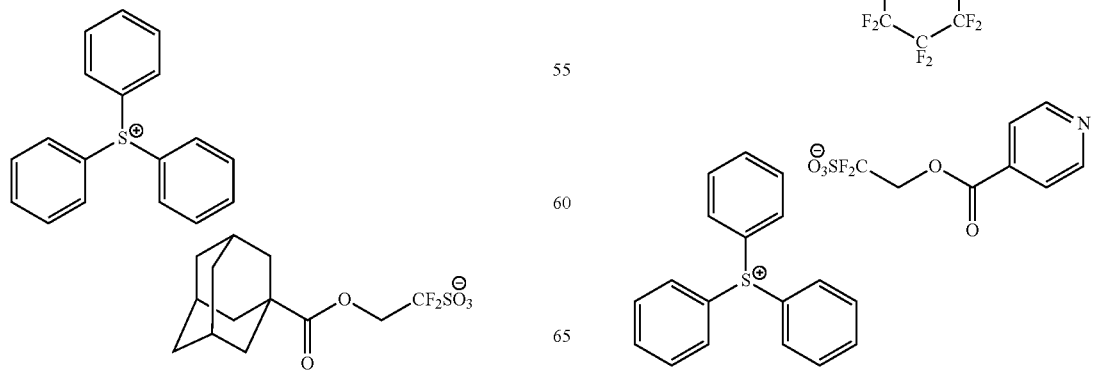

-continued

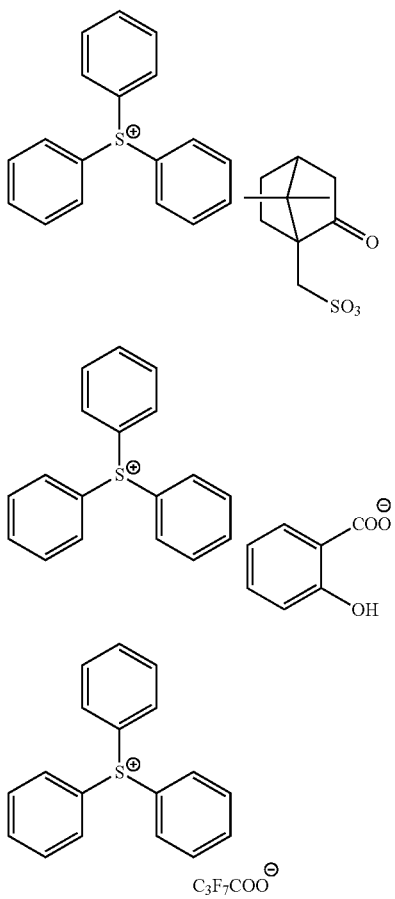

(D-1)

(D-2)

(D-3)

<Formation of Positive-Type Resist Pattern; Examples 1 to 7 and Comparative Examples 1 to 6>

On a 12-inch silicon wafer, an organic antireflection film composition "ARC 95" (trade name, available from Brewer Science, Inc.) was applied using a spinner and baked for drying on a hot plate at 205° C. for 60 seconds, thereby forming an organic antireflection film having a thickness of 90 nm.

Each of the positive-type resist compositions shown in Table 1 (Examples 1 to 7 and Comparative Examples 1 to 6) was applied on the above-described antireflection film using a spinner and subjected to a prebake (PAB) treatment for drying on a hotplate at 120° C. or 100° C. for 60 seconds, thereby forming a resist film having a thickness of 80 nm.

Subsequently, the resist film was selectively irradiated with an ArF excimer laser (193 nm) through a photomask (6% halftone) by using an ArF exposure apparatus for liquid immersion, NSR-S609B [available from Nikon Corporation; NA (numerical aperture)=1.07, Dipole (in/out=0.78/0.97) with Polano, liquid immersion medium: water].

Thereafter, the thus irradiated resist film was subjected to a PEB treatment at 100° C. or 90° C. for 60 seconds.

Subsequently, the resulting resist film was subjected to alkali development with a 2.38% by mass aqueous solution of TMAH (trade name: NMD-3, available from Tokyo Ohka Kogyo Co., Ltd.) at 23° C. for 10 seconds and then subjected to water rinse with pure water for 30 seconds, followed by drying by shaking.

As a result, in each of the Examples, a 1:1 line and space pattern (LS pattern) having a line width of 50 nm and a pitch of 100 nm was formed.

<Evaluation of Positive-Type Resist Pattern>
[Evaluation of Mask Error Factor (MEF)]

LS patterns having a pitch of 100 nm were formed, respectively using mask patterns targeting a size of from 45 to 54 nm (at intervals of 1 nm, ten patterns in total) at the same exposure amount according to the same procedures as those in the formation of the LS pattern as described above. At that time, a slope of a straight line at the time of plotting the target size (nm) on the abscissa and the size (nm) of the line pattern formed on the resist film using each mask pattern on the ordinate, respectively was calculated as MEF. What the MEF value (slope of the straight line) is closer to 1 means that the mask reproducibility is more satisfactory. The results are shown in Table 3.

[Evaluation of Line Width Roughness (LWR)]

With respect to the above-described LS patterns, a space width was measured at 400 points in the lengthwise direction of the space using a measuring SEM (scanning electron microscope) (trade name: S-9380, available from Hitachi High-Technologies Corporation; accelerating voltage: 300 V). From the results, the value of 3 times the standard deviation (s) (i.e., 3s) was determined, and an average value of the 3s values at 400 points was calculated as a yardstick of LWR. The results are shown in Table 3.

The smaller this 3s value, the lower the level of roughness of the line width is, indicating that an LS pattern with a uniform width was obtained.

[Evaluation of Exposure Latitude (EL Margin)]

With respect to the above-described exposure amount, an exposure amount was determined at the time of forming an LS pattern whose line fell within a range of ±5% of the target dimension, and an EL margin (unit: %) was determined according to the following formula. The results are shown in Table 3.

$$\text{EL margin}(\%) = (|E1 - E2|/Eop) \times 100$$

E1: Exposure amount (mJ/cm$^2$) at the time of forming an LS pattern having a line width of 47.5 nm E2: Exposure amount (mJ/cm$^2$) at the time of forming an LS pattern having a line width of 52.5 nm Incidentally, the larger the value of the EL margin, the smaller the change in the pattern size by the variation of the exposure amount is.

Incidentally, in the above-described calculation formula of the EL margin, "Eop" means an optimum exposure amount (mJ/cm$^2$). The Eop was determined in the usual way.

TABLE 3

| | PAB/PEB (° C.) each 60 sec | EL Margin (%) | LWR (nm) | MEF |
|---|---|---|---|---|
| Comparative Example 1 | 120/100 | 6.9 | 6.00 | 3.25 |
| Comparative Example 2 | 120/100 | 7.9 | 6.13 | 3.09 |
| Comparative Example 3 | 120/100 | 7.1 | 6.05 | 3.11 |
| Example 1 | 120/100 | 9.2 | 5.77 | 2.70 |
| Example 2 | 120/100 | 9.4 | 5.90 | 2.81 |
| Example 3 | 120/100 | 9.7 | 5.81 | 2.65 |
| Example 4 | 120/100 | 9.8 | 5.59 | 2.61 |
| Example 5 | 120/100 | 8.9 | 5.43 | 2.87 |
| Comparative Example 4 | 120/90 | 6.1 | 6.23 | 3.07 |
| Comparative Example 5 | 120/90 | 7.5 | 6.16 | 3.12 |
| Example 6 | 120/90 | 8.5 | 5.74 | 2.52 |
| Comparative Example 6 | 100/90 | 5.8 | 6.12 | 3.10 |
| Example 7 | 100/90 | 8.2 | 5.94 | 2.89 |

From the foregoing results, it could be confirmed that as compared with the resist composition of Comparative Examples 1 to 6, the resist composition of Examples 1 to 7 are satisfactory in the lithography properties such as MEF, LWR, and EL margin.

<Formation of Negative-Type Resist Pattern; Examples 8 to 11 and Comparative Examples 7 to 9>

On a 12-inch silicon wafer, an organic antireflection film composition "ARC 29A" (trade name, available from Brewer Science, Inc.) was applied using a spinner and baked for drying on a hot plate at 205° C. for 60 seconds, thereby forming an organic antireflection film having a thickness of 89 nm.

Each of the negative-type resin compositions shown in Table 2 was applied on the above-described antireflection film using a spinner and subjected to a prebake (PAB) treatment for drying on a hot plate at 100° C., 105° C., or 120° C. for 60 seconds, thereby forming a resist film having a thickness of 100 nm.

Subsequently, the resist film was selectively irradiated with an ArF excimer laser (193 nm) through a photomask (6% halftone) by using an ArF exposure apparatus for liquid immersion, NSR-S609B [available from Nikon Corporation; NA (numerical aperture)=1.07, Dipole (in/out=0.78/0.97) with Polano, liquid immersion medium: water].

Thereafter, the thus irradiated resist film was subjected to a PEB treatment at 85° C. or 80° C. for 60 seconds.

Subsequently, the resulting resist film was subjected to solvent development with 2-heptanone at 23° C. for 13 seconds, followed by drying by shaking.

As a result, in each of the Examples, a contact hole pattern (hereinafter referred to as "CH pattern") in which holes having a hole diameter of 55 nm were disposed at equal intervals (pitch: 110 nm) was formed.

<Evaluation of Negative-Type Resist Pattern>

[Evaluation of Exposure Latitude (EL Margin)]

An exposure amount was determined at the time of forming a CH pattern whose hole diameter fell within a range of ±5% of 55 nm, and an EL margin (unit: %) was determined according to the following formula. The results are shown in Table 4.

$$EL\ margin(\%)=(|E1-E2|/Eop)\times 100$$

E1: Exposure amount (mJ/cm$^2$) at the time of forming a CH pattern having a hole diameter of 53 nm E2: Exposure amount (mJ/cm$^2$) at the time of forming a CH pattern having a hole diameter of 58 nm Incidentally, the larger the value of the EL margin, the smaller the change in the pattern size by the variation of the exposure amount is.

Incidentally, in the above-described calculation formula of the EL margin, "Eop" means an optimum exposure amount (mJ/cm$^2$). The Eop was determined in the usual way.

[Evaluation of Circularity]

25 holes in the above-described CH pattern were observed from above using a measuring SEM (scanning electron microscope) (trade name: S-9380, available from Hitachi High-Technologies Corporation; accelerating voltage: 300 V), and a distance from the center to the outer periphery of each hole was measured in 24 directions. From the measurement results, the value of 3 times the standard deviation (σ) (i.e., 3σ) was determined. The results are shown in Table 4.

It is meant that the smaller the thus determined 3σ value, the higher the circularity of the hole is.

[CDU (Critical Dimension Uniformity of Pattern Dimension)]

100 holes in the above-described CH pattern were observed from above using a measuring SEM (scanning electron microscope) (trade name: S-9380, available from Hitachi High-Technologies Corporation; accelerating voltage: 300V), and a hole diameter (nm) of each hole was measured. From the measurement results, the value of 3 times the standard deviation (σ) (i.e., 3σ) was determined. The results are shown as "CDU" in Table 4.

It is meant that the smaller the thus determined 3σ value, the higher the critical dimension (CD) uniformity of the plural holes formed on the resist film is.

TABLE 4

|  | PAB/PEB (° C.) each 60 sec | EL Margin (%) | Circularity | CDU |
|---|---|---|---|---|
| Comparative Example 7 | 100/85 | 3.5 | 3.20 | 10.50 |
| Example 8 | 100/85 | 5.2 | 2.72 | 8.73 |
| Comparative Example 8 | 120/85 | 4.7 | 3.01 | 10.07 |
| Example 9 | 120/85 | 6.8 | 2.66 | 7.98 |
| Example 10 | 120/85 | 6.2 | 2.61 | 8.27 |
| Comparative Example 9 | 105/80 | 5.1 | 3.00 | 9.89 |
| Example 11 | 105/80 | 7.3 | 2.57 | 7.31 |

From the foregoing results, it could be confirmed that as compared with the resist composition of Comparative Examples 7 to 9, the resist composition of Examples 8 to 11 are satisfactory in the lithography properties such as EL margin, circularity, and CDU.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition including a base material component (A) whose solubility in a developing solution changes by the action of an acid and an acid generator component (B) which generates an acid upon exposure, wherein the acid generator component (B) includes an acid generator (B1) represented by the following general formula (b1-1):

wherein

R$^1$ represents a group having an anion site capable of generating an acid upon exposure;

R$^2$ represents a hydrogen atom or a substituent not having the anion site;

W$^1$ represents a z-valent functional group containing n nitrogen atoms having proton acceptor properties having at least one of the structures represented by any one of the following formulae (y1-2), (y1-3), (y1-4), (y1-5), (y1-6), (y2), (y3), (y4) and (y5):

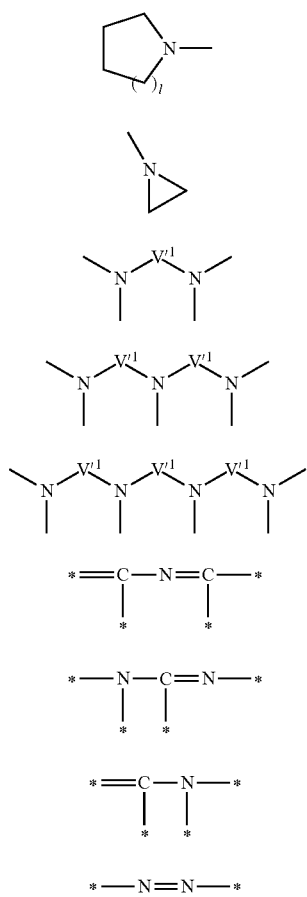

(y1-2)

(y1-3)

(y1-4)

(y1-5)

(y1-6)

(y2)

(y3)

(y4)

(y5)

wherein l represents an integer of 1 or 2; each $V^{r1}$ independently represents an alkylene group;

each * independently represents a hydrogen atom, a carbon atom, a nitrogen atom, or an oxygen atom;

$z=(x+y)$, $(n+1) \leq x \leq z$, and $0 \leq y$; and $M^{m+}$ represents an m-valent organic cation.

2. A method for forming a resist pattern, comprising:

forming a resist film using the resist composition according to claim 1 on a substrate;

exposing the resist film; and developing the resist film to form a resist pattern.

3. The resist composition according to claim 1, wherein $W^1$ represents a z-valent functional group containing n nitrogen atoms having proton acceptor properties having at least one of the structures represented by any one of the formulae (y2), (y3), (y4) and (y5).

4. The resist composition according to claim 3, wherein $W^1$ represents a z-valent functional group containing n nitrogen atoms having proton acceptor properties having a structure represented by the formula (y2).

5. The resist composition according to claim 4, wherein $W^1$ represents a z-valent functional group containing n nitrogen atoms having proton acceptor properties having a structure represented by the following formula (y2-1):

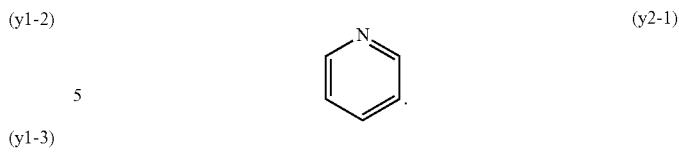

(y2-1)

6. A compound having nitrogen atoms having proton acceptor properties and sites capable of generating an acid upon exposure in the same molecule thereof, with the number of the sites being larger than the number of the nitrogen atoms, wherein the compound is represented by the following formula (b1-1'):

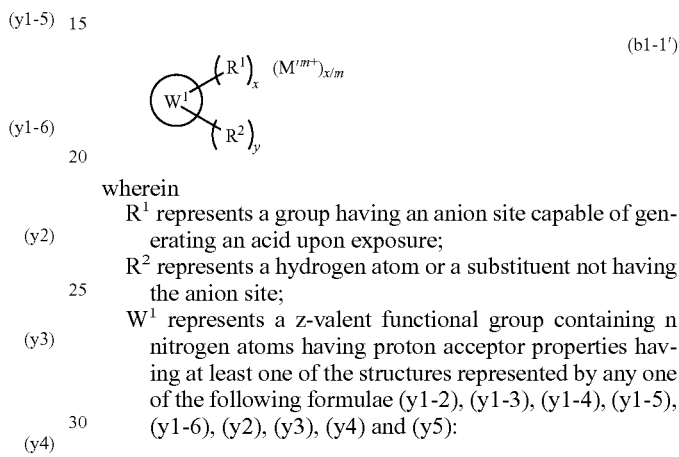

(b1-1')

wherein $R^1$ represents a group having an anion site capable of generating an acid upon exposure;

$R^2$ represents a hydrogen atom or a substituent not having the anion site;

$W^1$ represents a z-valent functional group containing n nitrogen atoms having proton acceptor properties having at least one of the structures represented by any one of the following formulae (y1-2), (y1-3), (y1-4), (y1-5), (y1-6), (y2), (y3), (y4) and (y5):

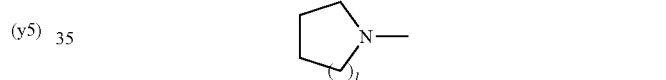

(y1-2)

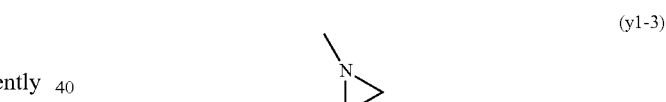

(y1-3)

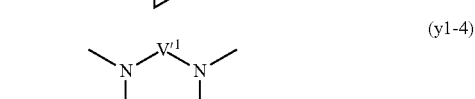

(y1-4)

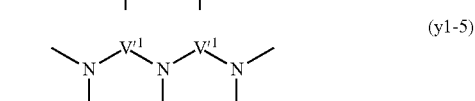

(y1-5)

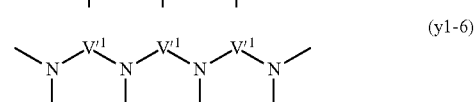

(y1-6)

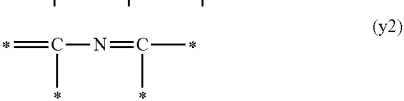

(y2)

(y3)

(y4)

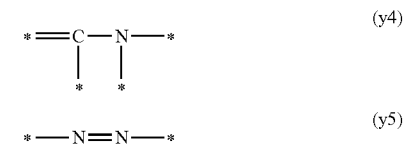

(y5)

wherein
l represents an integer of 1 or 2; each $V^{r1}$ independently represents an alkylene group;
each * independently represents a hydrogen atom, a carbon atom, a nitrogen atom, or an oxygen atom;
$z=(x+y)$, $(n+1) \leq x \leq z$, and $0 \leq y$; and
$M^{m+}$ represents an m-valent counter cation.

7. The compound according to claim 6, wherein $W^1$ represents a z-valent functional group containing n nitrogen atoms having proton acceptor properties having at least one of the structures represented by any one of the formulae (y2), (y3), (y4) and (y5).

8. The compound according to claim 7, wherein $W^1$ represents a z-valent functional group containing n nitrogen atoms having proton acceptor properties having a structure represented by the formula (y2).

9. The compound according to claim 8, wherein $W^1$ represents a z-valent functional group containing n nitrogen atoms having proton acceptor properties having a structure represented by the following formula (y2-1):

(y2-1)

10. A resist composition including a base material component (A) whose solubility in a developing solution changes by the action of an acid and an acid generator component (B) which generates an acid upon exposure, wherein
the acid generator component (B) includes an acid generator (B1) and the acid generator (B1) is a compound represented by the following general formula (b1-2):

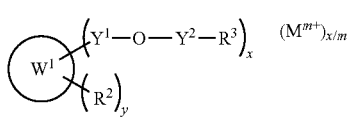

(b1-2)

wherein
each of $Y^1$ and $Y^2$ independently represents a single bond or a divalent linking group;
$R^3$ represents an anion group represented by any one of the formulae (r-an-1) to (r-an-3):

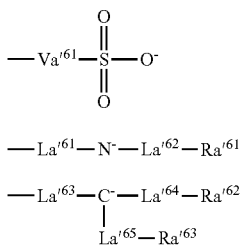

(r-an-1)

(r-an-2)

(r-an-3)

wherein
$Va'^{61}$ represents a divalent hydrocarbon group having a fluorine atom; each of $La'^{61}$ to $La'^{62}$ represents $—SO_2—$; each of $La'^{63}$ to $La'^{65}$ represents $—SO_2—$ or a single bond; and each of $Ra'^{61}$ to $Ra'^{63}$ independently represents a hydrocarbon group;

$R^2$ represents a hydrogen atom or a substituent not having an anion site capable of generating an acid upon exposure;
$W^1$ represents a z-valent functional group containing n nitrogen atoms having proton acceptor properties having a structure represented by the following formula (y1-1):

(y1-1)

$y=0$, $z=x$, $(n+1) \leq x \leq z$; and
$M^{m+}$ represents an m-valent organic cation.

11. A method for forming a resist pattern, comprising:
forming a resist film using the resist composition according to claim 10 on a substrate;
exposing the resist film; and
developing the resist film to form a resist pattern.

12. A compound having nitrogen atoms having proton acceptor properties and sites capable of generating an acid upon exposure in the same molecule thereof, with the number of the sites being larger than the number of the nitrogen atoms represented by the following formula (b1-2):

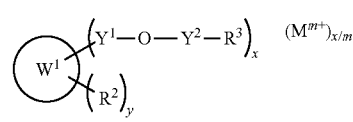

(b1-2)

wherein
each of $Y^1$ and $Y^2$ independently represents a single bond or a divalent linking group;
$R^3$ represents an anion group represented by any one of the formulae (r-an-1) to (r-an-3):

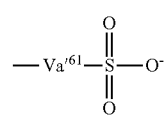

(r-an-1)

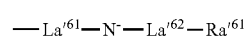

(r-an-2)

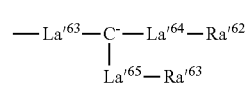

(r-an-3)

wherein
$Va'^{61}$ represents a divalent hydrocarbon group having a fluorine atom; each of $La'^{61}$ to $La'^{62}$ represents $—SO_2—$; each of $La'^{63}$ to $La'^{65}$ represents $—SO_2—$ or a single bond; and each of $Ra'^{61}$ to $Ra'^{63}$ independently represents a hydrocarbon group;
$R^2$ represents a hydrogen atom or a substituent not having an anion site capable of generating an acid upon exposure;
$W^1$ represents a z-valent functional group containing n nitrogen atoms having proton acceptor properties, and the z-valent functional group containing n nitrogen atoms includes a structure represented by the following formula (y1-1):

(y1-1)
y=0, z=x, (n+1)≤x≤z; and
$M^{m+}$ represents an m-valent organic cation.
* * * * *

UNITED STATES PATENT AND TRADEMARK OFFICE
CERTIFICATE OF CORRECTION

PATENT NO. : 9,164,379 B2
APPLICATION NO. : 13/874197
DATED : October 20, 2015
INVENTOR(S) : Yoshiyuki Utsumi et al.

It is certified that error appears in the above-identified patent and that said Letters Patent is hereby corrected as shown below:

In the specification
Col. 6, line 53, "term." should be --term--.
Col. 10, line 63, "(a1-r-1)." should be --(a1-r2-1).--.
Col. 10, lines 66-67, "(a1-r-2)." should be --(a1-r2-2).--.
Col. 11, line 20, "(a1-r-1)," should be --(a1-r2-1),--.
Col. 11, line 23, "(a1-r-1)," should be --(a1-r2-1),--.
Col. 11, line 27, "(a1-r-2)," should be --(a1-r2-2),--.
Col. 11, line 35, "(a1-r-2)," should be --(a1-r2-2),--.
Col. 11, line 41, "(a1-r-1)," should be --(a1-r2-1),--.
Col. 15, line 31, "(a1-r-2)," should be --(a1-r2-2),--.
Col. 18, line 36, "$Ra^{z}$" should be --$Ra^2$--.
Col. 18, line 46, "apart" should be --a part--.
Col. 20, line 60, "$Ra^{z}$" should be --$Ra^2$--.
Col. 30, line 15, "—COO—," should be -- —OCO—,--.
Col. 31, line 55, "—$Y^{21}$—O—$Y^{22}$," should be -- —$Y^{21}$—O—$Y^{22}$—,--.
Col. 33, lines 35-36, "bicycloalkalne, a tricycloalkalne," should be --bicycloalkane, a tricycloalkane,--.
Col. 33, line 51, "(a1-r-1)" should be --(a2-r-1)--.
Col. 34, line 50, "(a1-r-1)" should be --(a2-r-1)--.
Col. 35, line 8, "(a1-r-1)" should be --(a2-r-1)--.
Col. 40, line 1, "(a1-r-1)," should be --(a2-r-1),--.
Col. 40, line 17, "(a1-r-1)" should be --(ax3-r-1)--.
Col. 40, line 60, "(a1-r-1)" should be --(ax3-r-1)--.
Col. 40, line 61, "(a1-r-1)" should be --(a2-r-1)--.
Col. 40, line 62, "(a1-r-1)" should be --(ax3-r-1)--.
Col. 40, line 67, "(a1-r-1)" should be --(a2-r-1)--.
Col. 44, lines 40-41, "bicycloalkalne, a tricycloalkalne," should be --bicycloalkane, a tricycloalkane,--.
Col. 45, line 36, "(a21-r-1)" should be --(a2-r-1)--.

Signed and Sealed this
Fifth Day of July, 2016

Michelle K. Lee
*Director of the United States Patent and Trademark Office*

CERTIFICATE OF CORRECTION (continued)
U.S. Pat. No. 9,164,379 B2

In the specification
Col. 52, line 20, "1 represents" should be --l represents--.
Col. 52, line 20, "ands" should be --and s--.
Col. 56, line 20, after "(y3)" insert --.--.
Col. 57, line 1, "1 represents" should be --l represents--.
Col. 57, line 12, "(y1-r-1)," should be --(y1-4-1),--.
Col. 57, line 13, "(y1-r-2)," should be --(y1-4-2),--.
Col. 63, line 63, "1 represents" should be --l represents--.
Col. 64, line 7, "((r-an-1)." should be --(r-an-1).--.
Col. 69, line 61, "$R^{'101}$" should be --$R^{''101}$--.
Col. 69, line 66, "$R^{102}$" should be --$R^{''102}$--.
Col. 104, line 51, "$C_{1-4}F_9OCH_3$," should be --$C_4F_9OCH_3$,--.
Col. 121, line 50, "hotplate" should be --hot plate--.
In the claims
Col. 125, line 40 (Claim 1), "1 represents" should be --l represents--.
Col. 127, line 2 (Claim 6), "1 represents" should be --l represents--.